United States Patent
Kwon

(10) Patent No.: US 11,917,816 B2
(45) Date of Patent: Feb. 27, 2024

(54) SEMICONDUCTOR DEVICE AND METHOD FOR FABRICATING THE SAME

(71) Applicant: SK hynix Inc., Gyeonggi-do (KR)

(72) Inventor: Se Han Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 399 days.

(21) Appl. No.: 17/078,736

(22) Filed: Oct. 23, 2020

(65) Prior Publication Data

US 2022/0005813 A1    Jan. 6, 2022

(30) Foreign Application Priority Data

Jul. 3, 2020   (KR) .................. 10-2020-0081843

(51) Int. Cl.

| | | |
|---|---|---|
| H01L 27/092 | (2006.01) | |
| H10B 12/00 | (2023.01) | |
| G11C 11/4097 | (2006.01) | |
| G11C 11/408 | (2006.01) | |
| H01L 23/522 | (2006.01) | |

(52) U.S. Cl.
CPC .......... *H10B 12/50* (2023.02); *G11C 11/4085* (2013.01); *G11C 11/4097* (2013.01); *H01L 23/5226* (2013.01); *H10B 12/09* (2023.02); *H10B 12/30* (2023.02); *H10B 12/0335* (2023.02); *H10B 12/482* (2023.02)

(58) Field of Classification Search
CPC .... H01L 27/092–0928; H01L 23/5226; H10B 12/50; H10B 12/09; H10B 12/482; H10B 12/0335; H10B 12/315; H10B 12/02; H10B 12/30; H10B 12/48; G11C 11/4085; G11C 11/4097

See application file for complete search history.

(56) References Cited

U.S. PATENT DOCUMENTS

| | | | |
|---|---|---|---|
| 7,329,918 B2* | 2/2008 | Cho .................. | H10B 12/0335 257/311 |
| 7,476,584 B2* | 1/2009 | Park ................. | H01L 21/76897 257/E21.507 |
| 8,941,162 B2 | 1/2015 | Sukekawa | |
| 9,018,708 B2* | 4/2015 | Eun ...................... | H10B 12/485 257/368 |
| 9,064,731 B2* | 6/2015 | Park ..................... | H10B 12/485 |
| 10,186,513 B2* | 1/2019 | Chang ................ | H10B 12/315 |
| 2002/0006054 A1* | 1/2002 | Shukuri ................ | H10B 41/30 365/145 |

(Continued)

FOREIGN PATENT DOCUMENTS

CN          105990370 A   * 10/2016

*Primary Examiner* — Mary A Wilczewski
*Assistant Examiner* — Tsz K Chiu
(74) *Attorney, Agent, or Firm* — IP & T GROUP LLP

(57) ABSTRACT

A semiconductor device includes a substrate including a memory cell region and a peripheral circuit region, the peripheral circuit region including a first peripheral circuit region including a first transistor and a second peripheral circuit region including a second transistor; a storage node contact plug positioned in an upper portion of the substrate in the memory cell region; a landing pad over the storage node contact plug; a first metal wire coupled to the first transistor; and a second metal wire coupled to the second transistor, wherein a thickness of the landing pad and a thickness of the first metal wire are smaller than a thickness of the second metal wire.

13 Claims, 26 Drawing Sheets

(56) References Cited

U.S. PATENT DOCUMENTS

| | | | |
|---|---|---|---|
| 2002/0014648 A1* | 2/2002 | Mizutani | H01L 21/76807 |
| | | | 257/E21.507 |
| 2004/0183111 A1* | 9/2004 | Shinkawata | H10B 12/50 |
| | | | 438/243 |
| 2005/0059236 A1* | 3/2005 | Nishida | H10B 10/00 |
| | | | 257/E27.098 |
| 2006/0284229 A1* | 12/2006 | Park | H01L 21/823871 |
| | | | 257/E21.507 |
| 2015/0294923 A1* | 10/2015 | Shin | H10B 12/033 |
| | | | 257/532 |
| 2018/0040561 A1* | 2/2018 | Kim | H01L 23/5226 |
| 2018/0122811 A1* | 5/2018 | Kim | H10B 12/34 |
| 2019/0214293 A1* | 7/2019 | Kim | H01L 21/762 |
| 2022/0093610 A1* | 3/2022 | Kim | H01L 23/535 |

* cited by examiner

SEMICONDUCTOR DEVICE AND METHOD FOR FABRICATING THE SAME

CROSS-REFERENCE TO RELATED APPLICATIONS

The present application claims priority to Korean Patent Application No. 10-2020-0081843, filed on Jul. 3, 2020, which is incorporated herein by reference in its entirety.

BACKGROUND

1. Field

Various embodiments of the present invention relate to a semiconductor device and a method for fabricating the same, and more particularly, to a semiconductor device including a metal wire and a method for fabricating the semiconductor device.

2. Description of the Related Art

As the degree of integration of semiconductor devices increases, the area occupied by a capacitor may decrease, resulting in a problem of decreasing sensing margin. In order to improve the sensing margin, parasitic capacitance may have to be reduced. A method for reducing the parasitic capacitance involves lowering the dielectric constant of the dielectric material of the capacitor. However, since dielectric materials have generally a high dielectric constant, there is a limit in reducing the parasitic capacitance.

Another technique which has been proposed for reducing the parasitic capacitance involves forming metal wires of different heights in a peripheral circuit region.

SUMMARY

Embodiments of the present invention are directed to a semiconductor device having a low-resistance metal wire and a method of fabricating the semiconductor device.

In accordance with an embodiment of the present invention, a semiconductor device includes: a substrate including a memory cell region and a peripheral circuit region, the peripheral circuit region including a first peripheral circuit region including a first transistor and a second peripheral circuit region including a second transistor; a storage node contact plug positioned in an upper portion of the substrate in the memory cell region; a landing pad over the storage node contact plug; a first metal wire coupled to the first transistor; and a second metal wire coupled to the second transistor, wherein a thickness of the landing pad and a thickness of the first metal wire are smaller than a thickness of the second metal wire.

In accordance with another embodiment of the present invention, a semiconductor device includes: a first transistor including a first gate structure and first source/drain regions aligned on both sides of the first gate structure; a second transistor including a second gate structure and second source/drain regions aligned on both sides of the second gate structure; a first metal wire coupled to the first transistor; and a second metal wire coupled to the second transistor, wherein a thickness of the first metal wire is smaller than a thickness of the second metal wire.

In accordance with yet another embodiment of the present invention, a method for fabricating a semiconductor device includes: preparing a substrate including a first transistor and a second transistor; forming a preliminary first metal wire coupled to the first transistor over the substrate; forming a second metal wire coupled to the second transistor over the substrate; forming a capping layer that covers the preliminary first metal wire and the second metal wire; forming a mask that covers the second metal wire and the second transistor on the capping layer; and etching the capping layer and the preliminary first metal wire by using the mask as an etch mask to form a first metal wire having a thickness smaller than a thickness of the second metal wire.

DETAILED DESCRIPTION

Figure 1A:
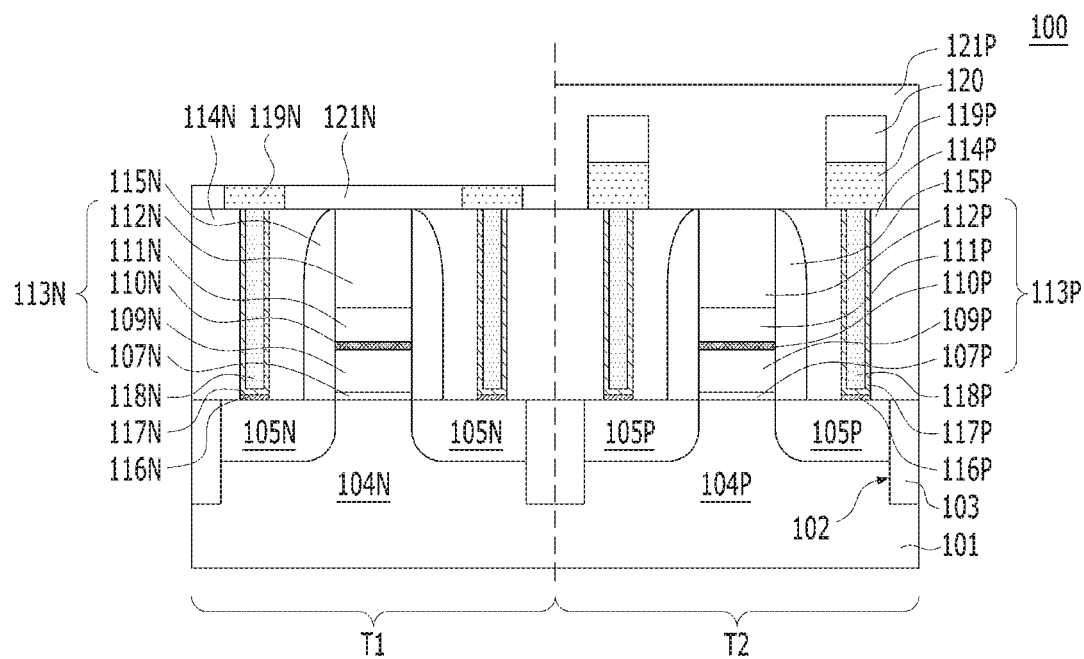
FIGS. 1A and 1B are cross-sectional views illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

Hereinafter, the various embodiments of the present invention will be described in detail with reference to the attached drawings.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, embodiments of the present invention will be described in detail with reference to the drawings. For simplicity, the description has been made based on a Dynamic Random Access Memory (DRAM), but the concept and spirit of the present invention are not limited to it but may be applied to other memories or semiconductor devices.

FIG. 1A is a cross-sectional view illustrating a semiconductor device 100 in accordance with an embodiment of the present invention.

Figure 1B:
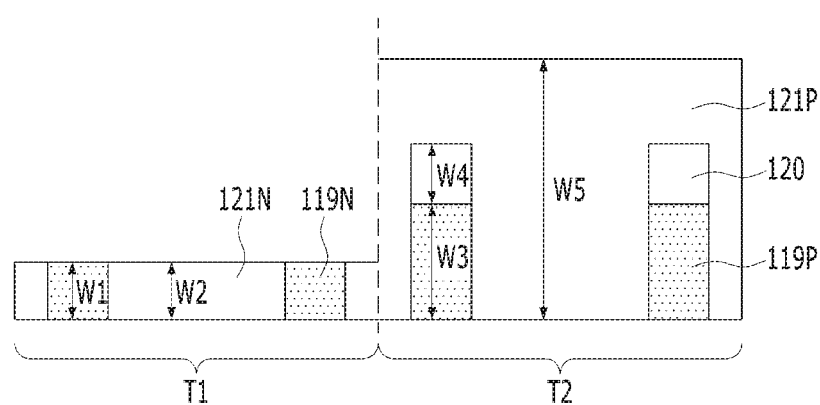

FIG. 1B is an enlarged view of a portion of metal wires 119N and 119P shown in FIG. 1A.

Referring to FIG. 1A, the semiconductor device 100 may include a substrate 101 and first and second regions T1 and T2 that are formed over the substrate 101. The first region T1 may be referred to as a first peripheral circuit region. The first region T1 may include a first transistor, and may include a first metal wire 119N coupled to the first transistor. The second region T2 may be referred to as a second peripheral circuit region. The second region T2 may include a second transistor, and may include a second metal wire 119P coupled to the second transistor.

An isolation layer 103 may be formed in the substrate 101. The isolation layer 103 may be formed in the trench 102. A first active region 104N and a second active region 104P may be defined in the substrate 101 by the isolation layer 103. The substrate 101 may be made of any material suitable for semiconductor processing. The substrate 101 may be or include, for example, a semiconductor substrate. The substrate 101 may be formed, for example, of a silicon-containing material. The substrate 101 may be formed of or include, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also be formed of or include, for example, other semiconductor materials such as germanium. The substrate 101 may be formed of or include, for example, a group-IIIV semiconductor substrate, such as a compound semiconductor substrate, such as GaAs. The substrate 101 may be formed of or include, for example, a Silicon-On-Insulator (SOI) substrate. The isolation layer 103 may be formed, for example, by a Shallow Trench Isolation (STI) process. The isolation layer 103 may isolate the first active region 104N and the second active region 104P from each other. The first active region 104N may be formed in the first region T1, and the second active region 104P may be formed in the second region T2.

A first transistor of the first region T1 may include a first active region 104N, a first gate structure 113N formed over and directly contacting the first active region 104N, a first gate spacer 115N which is formed on both sidewalls of the first gate structure 113N, and first source/drain regions 105N formed in the first active region 104N to be aligned on both sides of the first gate structure 113N. The first source/drain regions 105N may be doped with an N-type impurity or a P-type impurity. The first source/drain regions 105N may include an N-type impurity, such as arsenic (As) or phosphorus (P). The first source/drain regions 105N may include a low-concentration source/drain region and a high-concentration source/drain region.

The first gate structure 113N may include a first gate dielectric layer 107N on the first active region 104N, a first lower gate electrode 109N on the first gate dielectric layer 107N, a first barrier layer 110N on the first lower gate electrode 109N, a first upper gate electrode 111N on the first barrier layer 110N, and a first gate hard mask 112N on the first upper gate electrode 111N. The first gate structure 113N may include a stack of the first gate dielectric layer 107N, the first lower gate electrode 109N, the first barrier layer 110N, the first upper gate electrode 111N and the first gate hard mask 112N, in this order. In the illustrated embodiment of FIG. 1A, the first gate structure 113N is shown as a planar gate, however, it is noted that other gate structures may also be employed, including, for example, a recess gate, a buried gate, an omega gate, and a fin gate.

The first gate dielectric layer 107N may be positioned on the substrate 101. The first gate dielectric layer 107N may be formed of or include a high-k material, an oxide, a nitride, an oxynitride, or a combination thereof. For example, the high-k material may be or include hafnium oxide ($HfO_2$), hafnium silicate (HfSiO), hafnium silicate nitride (HfSiON), or a combination thereof. The first gate dielectric layer 107N may further include an interface layer (not shown). The interface layer may be formed of or include silicon oxide, silicon nitride, or a combination thereof. The first gate dielectric layer 107N may be formed by stacking an interface layer and a high-k material.

The first lower gate electrode 109N may be positioned on the first gate dielectric layer 107N. The first lower gate electrode 109N may be formed of or include a semiconductor material. The first lower gate electrode 109N may be doped with an N-type impurity or a P-type impurity. For example, it may be doped with an impurity by a doping process such as implantation. According to this embodiment of the present invention, the first lower gate electrode 109N may be formed or include polysilicon doped with an N-type impurity. According to another embodiment of the present invention, the first lower gate electrode 109N may be formed of a metal-containing material.

The first barrier layer 110N may be positioned on the first lower gate electrode 109N. The height of the first barrier layer 110N may be lower than the height of the first lower gate electrode 109N. By forming the first barrier layer 110N, adhesion between films may be improved. The first barrier layer 110N may be formed of or include titanium (Ti), titanium nitride (TiN), titanium silicon nitride (TiSiN), tantalum (Ta), tantalum nitride (TaN), tungsten nitride (WN), or a combination thereof. According to the embodiment of the present invention, the first barrier layer 110N may be formed of or include a material containing titanium nitride (TiN).

The first upper gate electrode 111N may be positioned on the first barrier layer 110N. The first upper gate electrode 111N may be formed of or include a metal-containing material. The first upper gate electrode 111N may be formed of or include a metal, a metal nitride, a metal silicide, or a combination thereof. According to this embodiment of the present invention, the first upper gate electrode 111N may be formed of or include tungsten (W) or a tungsten compound.

The first gate hard mask 112N may be positioned on the first upper gate electrode 111N. The first gate hard mask 112N may be formed of a dielectric material having an etch selectivity with respect to the first upper gate electrode 111N. The height of the first gate hard mask 112N may be greater than the height of the first upper gate electrode 111N. The first gate hard mask 112N may be formed of or include silicon oxide, silicon nitride, silicon oxynitride, or a combination thereof. According to this embodiment of the present invention, the first gate hard mask 112N may be formed of silicon nitride.

A first gate spacer 115N may be positioned on both sidewalls of the first gate structure 113N. The first gate spacer 115N may be formed of a dielectric material. The first gate spacer 115N may be formed of or include a low-k material. The first gate spacer 115N may be formed of or include an oxide or a nitride. The first gate spacer 115N may be formed of or include silicon oxide, silicon nitride, or a metal oxide. The first gate spacer 115N may be formed of or include $SiO_2$, $Si_3N_4$, or SiN. The first gate spacer 115N may be or include a multi-layer spacer. The first gate spacer 115N may be or include an air gap. For example, a pair of line-type air gaps may be formed on both sidewalls of the first gate spacer 115N. The pair of line-type air gaps may be symmetrical. According to some embodiments of the present invention, the multi-layer spacer may include a first spacer, a second spacer, and a third spacer, and the third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

The first source/drain regions 105N of the first region T1 may be coupled to the first metal wire 119N through a first metal contact plug 118N. A first ohmic contact layer 116N and a first conductive liner 117N may be formed between the first metal contact plug 118N and the first source/drain regions 105N. The first ohmic contact layer 116N may be formed of or include a metal silicide. The first conductive liner 117N may be formed of or include a metal or a metal nitride. The first conductive liner 117N may be formed of or include titanium (Ti), titanium nitride (TiN), titanium silicon nitride (TiSiN), tantalum (Ta), tantalum nitride (TaN), tungsten nitride (WN), or a combination thereof. The first metal contact plug 118N may be formed of or include a metal, a metal nitride, a metal silicide, or a combination thereof. For example, the first conductive liner 117N may be formed of or include titanium nitride, and the first metal contact plug 118N may be formed of or include tungsten (W) or a tungsten compound. According to another embodiment of the present invention, the first metal contact plug 118N may include a barrier-less metal structure in which the first conductive liner 117N is omitted.

The first metal contact plug 118N may fill a contact hole (not given with a reference numeral) in a first inter-layer dielectric layer 114N. The first metal contact plug 118N may penetrate the first inter-layer dielectric layer 114N and be coupled to the first source/drain regions 105N. The first inter-layer dielectric layer 114N may be formed of or include a dielectric material. The first inter-layer dielectric layer 114N may be formed of or include silicon oxide, silicon nitride, a low-k material, or a combination thereof. The first metal contact plug 118N may be formed of or include a metal-containing material.

The first metal wire 119N may be positioned over the first metal contact plug 118N. The first metal wire 119N may be coupled to the first source/drain regions 105N through the first metal contact plug 118N and the first ohmic contact layer 116N. The first metal wire 119N may be formed of or include a metal-containing material. The first metal wire 119N may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The first metal wire 119N may be formed of a single layer film or a multi-layer film of a conductive material. According to the embodiment of the present invention, the first metal wire 119N may be formed of or include a material containing tungsten (W). The first metal wire 119N may be formed of or include tungsten (W) or a tungsten compound.

The first capping layer 121N may fill a space between the first metal wires 119N. The first capping layer 121N may cover sidewalls of the first metal wires 119N. Referring to FIG. 1B, the thickness W2 of the first capping layer 121N may be the same as the thickness W1 of the first metal wire 119N. The bottom surface of the first capping layer 121N and the bottom surface of the first metal wire 119N may be positioned at the same level, and the upper surface of the first capping layer 121N and the upper surface of the first metal wire 119N may be positioned at the same level. The first capping layer 121N may serve to protect the first metal wire 119N from the subsequent process. The first capping layer 121N may be formed or of include a dielectric material. The first capping layer 121N may be formed of or include silicon nitride.

The second transistor of the second region T2 may include a second active region 104P, a second gate structure 113P formed over and directly contacting the second active region 104P, a second gate spacer 115P formed on both sidewalls of the second gate structure 113P, and the second source/drain regions 105P formed in the second active region 104P to be aligned on both sides of the second gate structure 113P. The second source/drain regions 105P may be referred to as source/drain regions. The second source/drain regions 105P may be doped with an N-type impurity or a P-type impurity. The second source/drain regions 105P may include an N-type impurity, such as arsenic (As) or phosphorus (P). The second source/drain regions 105P may include a low-concentration source/drain region and a high-concentration source/drain region.

The second gate structure 113P may include a second gate dielectric layer 107P formed over and directly contacting the second active region 104P, a second lower gate electrode 109P over the second gate dielectric layer 107P, a second barrier layer 110P over the second lower gate electrode 109P, a second upper gate electrode 111P over the second barrier layer 110P, and a second gate hard mask 112P over the second upper gate electrode 111P. The second gate structure 113P may include a stack of the second gate dielectric layer 107P, the second lower gate electrode 109P, the second barrier layer 110P, the second upper gate electrode 111P and the second gate hard mask 112P in this order. The second gate structure 113P may be at least one among a planar gate, a recess gate, a buried gate, an omega gate, and a fin gate. According to the embodiment of the present invention, the second gate structure 113P may be a planar gate.

The second gate dielectric layer 107P may be positioned over the substrate 101. The second gate dielectric layer 107P may be formed of or include a high-k material, an oxide, a nitride, an oxynitride, or a combination thereof. For example, the high-k material may be or include hafnium oxide ($HfO_2$), hafnium silicate (HfSiO), hafnium silicate nitride (HfSiON), or a combination thereof. The second gate dielectric layer 107P may further include an interface layer (not shown). The interface layer may be formed of or include silicon oxide, silicon nitride, or a combination thereof. The second gate dielectric layer 107P may be formed by stacking an interface layer and a high-k material.

The second lower gate electrode 109P may be positioned over the second gate dielectric layer 107P. The second lower gate electrode 109P may be formed of or include a semiconductor material. The second lower gate electrode 109P may be doped with an N-type impurity or a P-type impurity. For example, an impurity may be doped by a doping process, such as implantation. According to the embodiment of the present invention, the second lower gate electrode 109P may be formed of or include polysilicon doped with an N-type impurity. According to another embodiment of the present invention, the second lower gate electrode 109P may be formed of or include a metal-containing material.

The second barrier layer HOP may be positioned over the second lower gate electrode 109P. The height of the second barrier layer 110P may be smaller than the height of the second lower gate electrode 109P. The second barrier layer 110P may be formed of or include titanium (Ti), titanium nitride (TiN), titanium silicon nitride (TiSiN), tantalum (Ta), tantalum nitride (TaN), tungsten nitride (WN), or a combination thereof. According to the embodiment of the present invention, the second barrier layer 110P may be formed of or include a material containing titanium nitride (TiN).

The second upper gate electrode 111P may be positioned over the second barrier layer 110P. The second upper gate electrode 111P may be formed of or include a metal-containing material. The second upper gate electrode 111P may be formed of or include a metal, a metal nitride, a metal silicide, or a combination thereof. According to the embodiment of the present invention, the second upper gate electrode 111P may be formed of or include tungsten (W) or a tungsten compound.

The second gate hard mask 112P may be positioned over the second upper gate electrode 111P. The second gate hard mask 112P may be formed of a dielectric material having an etch selectivity with respect to the second upper gate electrode 111P. The height of the second gate hard mask 112P may be greater than the height of the second upper gate electrode 111P. The second gate hard mask 112P may be formed of or include silicon oxide, silicon nitride, silicon oxynitride, or a combination thereof. According to the embodiment of the present invention, the second gate hard mask 112P may be formed of silicon nitride.

The second gate spacer 115P may be positioned on both sidewalls of the second gate structure 113P. The second gate spacer 115P may be formed of a dielectric material. The second gate spacer 115P may be formed of or include a low-k material. The second gate spacer 115P may be formed of or include an oxide or a nitride. The second gate spacer 115P may be formed of or include silicon oxide, silicon nitride, or a metal oxide. The second gate spacer 115P may be formed of or include $SiO_2$, $Si_3N_4$, or SiN. The second gate spacer 115P may be or include a multi-layer spacer. The second gate spacer 115P may be or include an air gap. For example, a pair of line-type air gaps may be formed on both sidewalls of the second gate spacer 115P. The pair of line-type air gaps may be symmetrical. According to some embodiments of the present invention, the multi-layer spacer may include a first spacer, a second spacer, and a third spacer. The third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

The second source/drain regions 105P of the second region T2 may be coupled to the second metal wire 119P through the second metal contact plug 118P. A second ohmic contact layer 116P and a second conductive liner 117P may be formed between the second metal contact plug 118P and the second source/drain regions 105P. The second ohmic contact layer 116P may be formed of or include a metal silicide. The second conductive liner 117P may be formed of or include a metal or a metal nitride. The second conductive liner 117P may be formed of or include titanium (Ti), titanium nitride (TiN), titanium silicon nitride (TiSiN), tantalum (Ta), tantalum nitride (TaN), tungsten nitride (WN), or a combination thereof. The second metal contact plug 118P may be formed of or include a metal, a metal nitride, a metal silicide, or a combination thereof. For example, the second conductive liner 117P may be formed of or include titanium nitride, and the second metal contact plug 118P may be formed of or include tungsten (W) or a tungsten compound. According to another embodiment of the present invention, it may include a barrier-less metal structure in which the second conductive liner 117P is omitted.

The second metal contact plug 118P may fill a contact hole (not shown) in the second inter-layer dielectric layer 114P. The second metal contact plug 118P may penetrate the second inter-layer dielectric layer 114P to be coupled to the second source/drain regions 105P. The second inter-layer dielectric layer 114P may be formed of or include a dielectric material. The second inter-layer dielectric layer 114P may be formed of or include silicon oxide, silicon nitride, a low-k material, or a combination thereof. The second metal contact plug 118P may be formed of or include a metal-containing material.

The second metal wire 119P may be positioned over the second metal contact plug 118P. The second metal wire 119P may be coupled to the second source/drain regions 105P through the second metal contact plug 118P and the second ohmic contact layer 116P. The second metal wire 119P may be formed of or include a metal-containing material. The second metal wire 119P may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The second metal wire 119P may be formed of a single layer film or a multi-layer film of a conductive material. According to the embodiment of the present invention, the second metal wire 119P may be formed of or include a material containing tungsten (W). The second metal wire 119P may be formed of or include tungsten (W) or a tungsten compound.

The second capping layer 121P may fill the space between the second metal wires 119P. The second capping layer 121P may cover the sidewalls and upper portions of the second metal wires 119P. The second capping layer 121P may cap the second metal wire 119P and the metal wire hard mask 120 over the second metal wire 119P. Referring to FIG. 1B, the thickness W5 of the second capping layer 121P may be greater than the sum of the thickness W3 of the second metal wire 119P and the thickness W4 of the metal wire hard mask 120. The thickness W5 of the second capping layer 121P may be greater than the thickness W2 of the first capping layer 121N. The bottom surface of the second capping layer 121P and the bottom surface of the first capping layer 121N may be positioned at the same level, and the upper surface of the second capping layer 121P may be positioned higher than the upper surface of the first capping layer 121N. The second capping layer 121P may serve to protect the second metal wire 119P from the subsequent process. The second capping layer 121P may be formed of or include a dielectric material. The second capping layer 121P may be formed of or include silicon nitride. The second capping layer 121P may be formed of the same material as the first capping layer 121N.

Referring to FIG. 1B, the thickness W1 of the first metal wire 119N and the thickness W3 of the second metal wire 119P may be different. According to the embodiment of the present invention, the thickness W1 of the first metal wire 119N may be smaller than the thickness W3 of the second metal wire 119P. The bottom surface of the first metal wire 119N and the bottom surface of the second metal wire 119P may be positioned at the same level, and the upper surface of the first metal wire 119N may be positioned lower than the upper surface of the second metal wire 119P. The difference between the thickness W1 of the first metal wire 119N and the thickness W3 of the second metal wire 119P may range from approximately 130 Å to approximately 170 Å. According to another embodiment of the present invention, the difference between the thickness W1 of the first metal wire 119N and the thickness W3 of the second metal wire 119P may be approximately 150 Å. According to the embodiment of the present invention, the thickness W1 of the first metal wire 119N may be approximately 150 Å lower than the thickness W3 of the second metal wire 119P.

The semiconductor device 100 may include a CMOSFET, and the first transistor may include an NMOSFET, and the second transistor may include a PMOSFET. According to another embodiment of the present invention, the semiconductor device 100 may include different NMOSFETs, and the first transistor may include a first NMOSFET, and the second transistor may include a second NMOSFET. The first NMOSFET may be an NMOSFET having a thin first gate dielectric layer, and the second NMOSFET may be an NMOSFET having a second gate dielectric layer which is thicker than the first gate dielectric layer. According to another embodiment of the present invention, the semiconductor device 100 may include different PMOSFETs, and the first transistor may include a first PMOSFET, and the second transistor may include a second PMOSFET. The first PMOSFET may be a PMOSFET having a thin first gate dielectric layer, and the second PMOSFET may be a PMOSFET having a second gate dielectric layer which is thicker than the first gate dielectric layer.

The semiconductor device 100 may include a peripheral circuit of the memory cell, and the first transistor may be a transistor coupled to a bit line of a memory cell, and the second transistor may be a transistor coupled to a word line of the memory cell. The semiconductor device 100 may include a peripheral circuit of a DRAM, the first transistor may be a sense amplifier SA, and the second transistor may be, for example, a sub-word line driver SWD.

Since the first metal wire 119N is formed to have a thickness W1 which is smaller than a thickness W3 of the second metal wire 119P in the semiconductor device 100 in accordance with another embodiment of the present invention, the capacitance between the neighboring first metal wires 119N may be reduced. For example, $C_{sa}$ may be reduced, and the sensing margin may be improved as the $C_{sa}$ is reduced. Also, since the first metal wire 119N is formed to have the thickness W1 which is smaller than the thickness W3 of the second metal wire 119P in the semiconductor device 100, the resistance of the semiconductor device 100 in the second region T2 may be maintained low. As a result, the semiconductor device 100 may simultaneously obtain the effect of improving the sensing margin due to the reduction of the capacitance in the first region T1 and obtain the effect of reducing the resistance to the regions other than the first region T1.

FIGS. 2A to 2K are cross-sectional views illustrating an example of a method for fabricating a semiconductor device in accordance with an embodiment of the present invention.

Figure 2A:
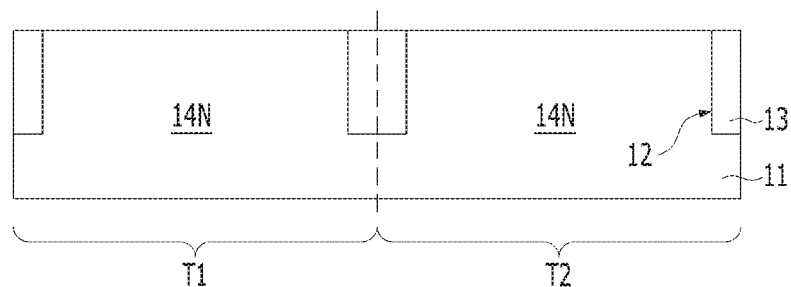
FIGS. 2A to 2K are cross-sectional views illustrating a method for fabricating a semiconductor device in accordance with an embodiment of the present invention.

Referring to FIG. 2A, a substrate 11 may be prepared. The substrate 11 may be formed of or include a semiconductor material. The substrate 11 may include a silicon substrate, a silicon germanium substrate, or a Silicon-On-Insulator (SOI) substrate. The substrate 11 may include a first region T1 and a second region T2. The first region T1 may be referred to as a first peripheral circuit region, and the second region T2 may be referred to as a second peripheral circuit region. The first region T1 may refer to a region in which a transistor having at least one thin gate dielectric layer is to be formed. The second region T2 may refer to a region in which a transistor having at least one thick gate dielectric layer is to be formed. The first region T1 may include a first transistor, and the second region T2 may include a second transistor. For example, the first region T1 may be a sense amplifier SA, and the second region T2 may be, for example, a sub-word line driver SWD.

An isolation layer 13 may be formed over and be in direct contact with the substrate 11. The isolation layer 13 may be formed by a Shallow Trench Isolation (STI) process. The isolation layer 13 may be formed in a trench 12. The first active region 14N and the second active region 14P may be defined by the isolation layer 13. The isolation layer 13 may be formed of or include silicon nitride, silicon oxide, or a combination thereof.

Figure 2B:
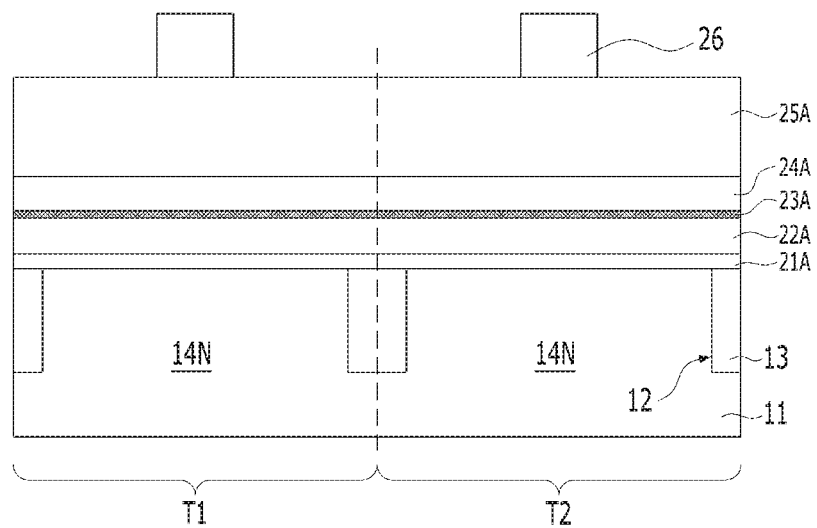

Referring to FIG. 2B, a gate dielectric layer 21A may be formed over and be in direct contact with the substrate 11. The gate dielectric layer 21A may be formed of or include a high-k material, an oxide, a nitride, an oxynitride, or a combination thereof. For example, the high-k material may be or include hafnium oxide ($HfO_2$), hafnium silicate (Hf-SiO), hafnium silicate nitride (HfSiON), or a combination thereof. The gate dielectric layer 21A may further include an interface layer (not shown). The interface layer may be formed of or include silicon oxide, silicon nitride, or a combination thereof. The gate dielectric layer 21A may be formed by stacking an interface layer and a high-k material.

A lower gate electrode layer 22A may be formed over and be in direct contact with the gate dielectric layer 21A. The lower gate electrode layer 22A may be formed of or include a semiconductor material. The lower gate electrode layer 22A may be doped with an impurity. For example, it may be doped with an impurity by a doping process, such as an implantation process. According to the embodiment of the present invention, the lower gate electrode layer 22A may be formed of or include polysilicon. According to another embodiment of the present invention, the lower gate electrode layer 22A may be formed of a metal-containing material.

A barrier metal layer 23A may be formed over and be in direct contact with the lower gate electrode layer 22A. The height of the barrier metal layer 23A may be lower than the height of the lower gate electrode layer 22A. The barrier metal layer 23A may be formed of or include titanium nitride (TiN), tantalum nitride (TaN), tungsten nitride (WN), or a combination thereof. According to the embodiment of the present invention, the barrier metal layer 23A may be formed of or include a material containing titanium nitride (TiN).

The upper gate electrode layer 24A may be formed of a material having a lower specific resistance than the lower gate electrode layer 22A. The upper gate electrode layer 24A may be formed of or include a metal material having a lower specific resistance than the lower gate electrode layer 22A. For example, the upper gate electrode layer 24A may be formed of or include a metal, a metal nitride, a metal silicide, or a combination thereof. According to the embodiment of the present invention, the upper gate electrode layer 24A may be formed of or include tungsten (W) or a tungsten compound.

A gate hard mask layer 25A may be formed over and be in direct contact with the upper gate electrode layer 24A. The gate hard mask layer 25A may be formed of a dielectric material having an etch selectivity with respect to the upper gate electrode layer 24A. The height of the gate hard mask layer 25A may be higher than the height of the upper gate electrode layer 24A. The gate hard mask layer 25A may be formed of or include silicon oxide, silicon nitride, silicon oxynitride, or a combination thereof. According to the embodiment of the present invention, the gate hard mask layer 25A may be formed of silicon nitride.

A gate mask 26 may be formed over and be in direct contact with the gate hard mask layer 25A. The gate mask 26 may include a photoresist pattern. The gate mask 26 may extend in one direction or may extend in another direction.

Figure 2C:
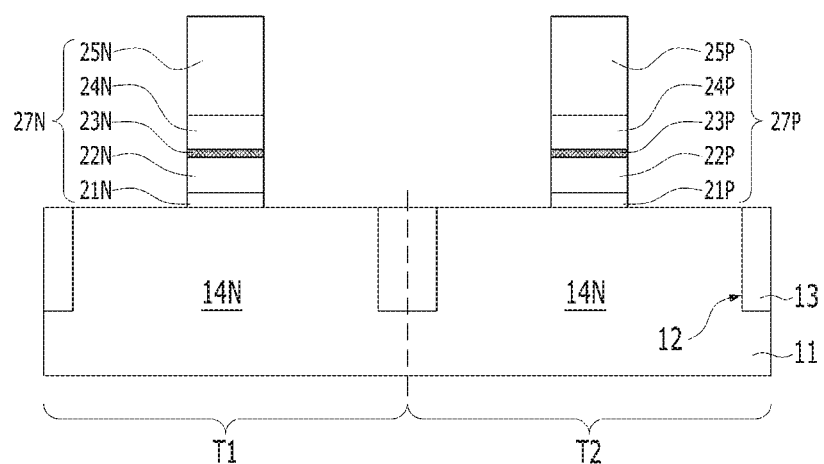

Referring to FIG. 2C, first and second gate structures 27N and 27P may be formed over and be in direct contact with the substrate 11. The first gate structure 27N may be formed over and be in direct contact with the first active region 14N, and the second gate structure 27P may be formed over and be in direct contact with the second active region 14P. The first gate structure 27N may include a first gate dielectric layer 21N, a first lower gate electrode 22N, a first barrier layer 23N, a first upper gate electrode 24N, and a first gate hard mask 25N. The second gate structure 27P may include a second gate dielectric layer 21P, a second lower gate electrode 22P, a second barrier layer 23P, a second upper gate electrode 24P, and a second gate hard mask 25P.

The first gate dielectric layer 21N and the second gate dielectric layer 21P may be formed by etching the gate dielectric layer 21A. The first lower gate electrode 22N and the second lower gate electrode 22P may be formed by etching the lower gate electrode layer 22A. The first barrier layer 23N and the second barrier layer 23P may be formed by etching the barrier metal layer 23A. The first upper gate electrode 24N and the second upper gate electrode 24P may be formed by etching the upper gate electrode layer 24A. The first gate hard mask 25N and the second gate hard mask 25P may be formed by etching the gate hard mask layer 25A.

The first gate structure 27N may be at least one among a planar gate, a recess gate, a buried gate, an omega gate, and a fin gate. According to the embodiment of the present invention, the first gate structure 27N may be a planar gate. The second gate structure 27P may be at least one among a planar gate, a recess gate, a buried gate, an omega gate, and a fin gate. According to the embodiment of the present invention, the second gate structure 27P may be a planar gate.

After the first and second gate structures 27N and 27P are formed, the gate mask 26 may be removed.

Figure 2D:
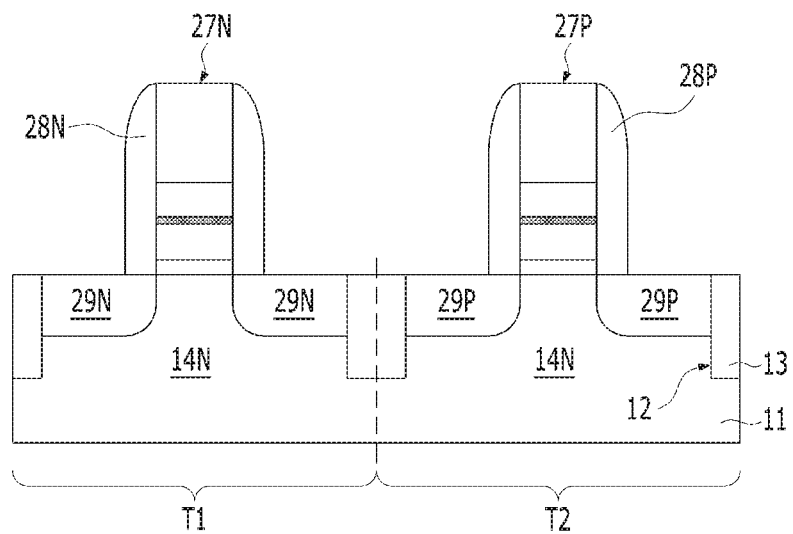

Referring to FIG. 2D, a first spacer 28N may be positioned on the sidewalls of the first gate structure 27N. The first spacer 28N may be formed of a dielectric material. The first spacer 28N may be formed of or include a low-k material. The first spacer 28N may be formed of or include an oxide or a nitride. The first spacer 28N may be formed of or include silicon oxide, silicon nitride, or a metal oxide. The first spacer 28N may be formed of or include $SiO_2$, $Si_3N_4$, or SiN. The first spacer 28N may be or include a multi-layer spacer. The first spacer 28N may be or include an air gap (not shown). Therefore, a pair of line-type air gaps may be formed on the sidewalls of the first spacer 28N. The pair of line-type air gaps may be symmetrical. According to some embodiments of the present invention, the multi-layer spacer may include a first spacer, a second spacer, and a third spacer. The third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

The second spacer 28P may be positioned on both sidewalls of the second gate structure 27P. The second spacer 28P may be formed of a dielectric material. The second spacer 28P may be formed of or include a low-k material. The second spacer 28P may be formed of or include an oxide or a nitride. The second spacer 28P may be formed of or include silicon oxide, silicon nitride, or a metal oxide. The second spacer 28P may be formed of or include $SiO_2$, $Si_3N_4$, or SiN. The second spacer 28P may be or include a mufti-layer spacer. The second spacer 28P may be or include an air gap (not shown). Therefore, a pair of line-type air gaps may be formed on the sidewalls of the second spacer 28P. The pair of line-type air gaps may be symmetrical. According to some embodiments of the present invention, the multi-layer spacer may include a first spacer, a second spacer, and a third spacer, and the third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

Subsequently, an impurity may be doped into the substrate 11. For example, first source/drain regions 29N may be formed on both sides of the first gate structure 27N in the substrate 11. The second source/drain regions 29P may be formed on both sides of the second gate structure 27P in the substrate 11. The first and second source/drain regions 29N and 29P may include an N-type impurity or a P-type impurity. The first and second source/drain regions 29N and 29P may include a low-concentration source/drain region and a high-concentration source/drain region. The high-concentration source/drain region may have a deeper junction depth than the low-concentration source/drain region. The high-concentration source/drain region may have a larger doping concentration than the low-concentration source/drain region.

Figure 2E:
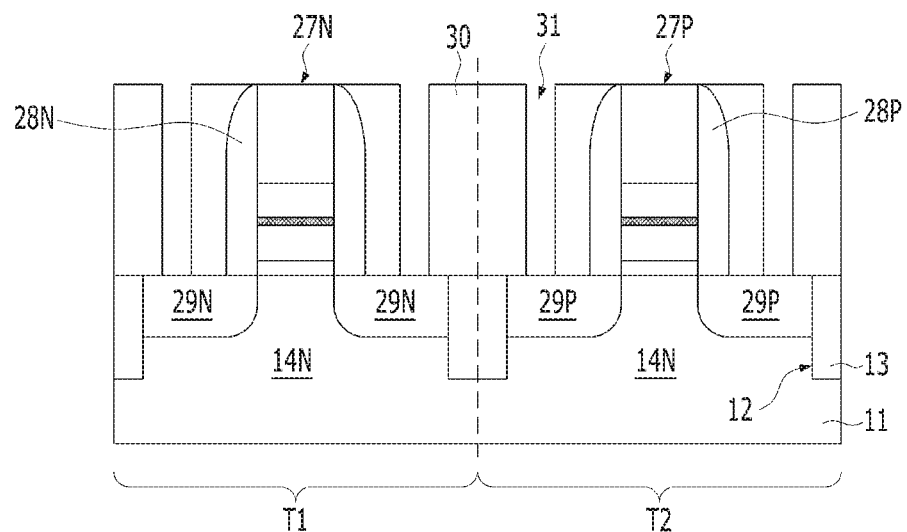

Referring to FIG. 2E, an inter-layer dielectric layer 30 filling an area between the first gate structure 27N and the second gate structure 27P may be formed. The inter-layer dielectric layer 30 may be planarized to expose the upper surfaces of the first and second gate structures 27N and 27P. In the process of planarizing the inter-layer dielectric layer 30, the first and second spacers 28N and 28P may be planarized to expose the upper surfaces of the first and second gate structures 27N and 27P. The inter-layer dielectric layer 30 may extend in parallel to the first and second gate structures 27N and 27P. The inter-layer dielectric layer 30 may be formed of a material having an etch selectivity with respect to the first and second spacers 28N and 28P. The inter-layer dielectric layer 30 may be formed of or include a dielectric material. The inter-layer dielectric layer 30 may be formed of or include silicon oxide or silicon nitride. The inter-layer dielectric layer 30 may, for example, include a Spin-On Dielectric material (SOD).

Subsequently, a contact hole 31 may be formed in the inter-layer dielectric layer 30. A contact mask pattern (not shown) may be employed for forming the contact hole 31. The inter-layer dielectric layer 30 may be etched by using the contact mask pattern as an etch mask. For example, a contact hole 31 exposing the surfaces of the first and second source/drain regions 29N and 29P may be formed.

Figure 2F:
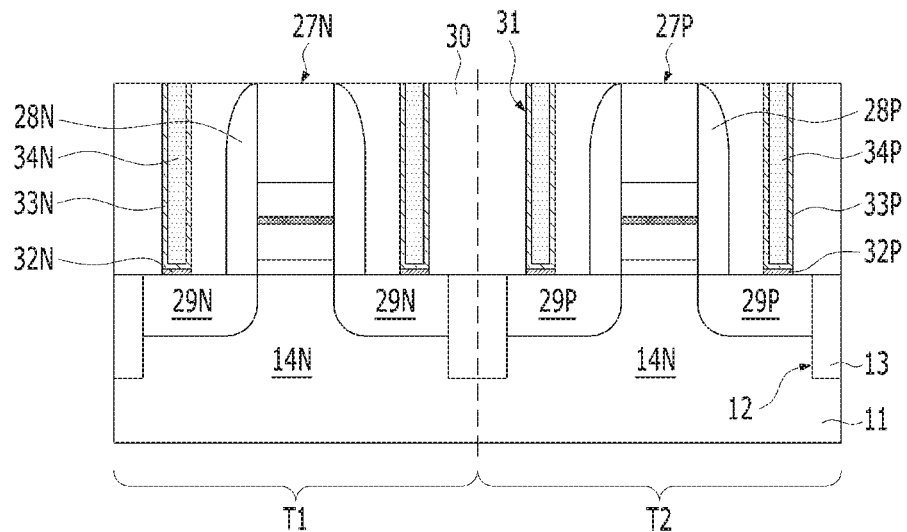

Referring to FIG. 2F, first and second ohmic contact layers 32N and 32P may be formed in the contact hole 31. The first ohmic contact layer 32N may be formed over and be in direct contact with the first source/drain regions 29N. The second ohmic contact layer 32P may be formed over and be in direct contact with the second source/drain regions 29P. The first and second ohmic contact layers 32N and 32P may be formed by depositing and annealing a silicidable metal layer. The first and second ohmic contact layers 32N and 32P may be formed of or include a metal silicide. The first and second ohmic contact layers 32N and 32P may be formed of or include silicide ($CoSi_x$). According to the embodiment of the present invention, the first and second ohmic contact layers 32N and 32P may be formed of or include silicide ($CoSi_x$) of '$CoSi_2$ phase'. Therefore, contact resistance may be improved, and cobalt silicide ($CoSi_x$) having a low resistance may be formed.

Subsequently, a first conductive liner 33N may be formed over and be in direct contact with the first ohmic contact layer 32N. The first conductive liner 33N may be formed conformally inside the contact hole 31. The first conductive liner 33N may cover the upper surface of the first ohmic contact layer 32N and the sidewalls of the inter-layer dielectric layer 30. A second conductive liner 33P may be formed over and be in direct contact with the second ohmic contact layer 32P. The second conductive liner 33P may be formed conformally inside the contact hole 31. The second conductive liner 33P may cover the upper surface of the second ohmic contact layer 32P and the sidewalls of the inter-layer dielectric layer 30. The first and second conductive liners 33N and 33P may be formed of or include a metal or a metal nitride. The first and second conductive liners 33N and 33P may be formed of or include titanium (Ti), titanium nitride (TiN), titanium silicon nitride (TiSiN), tantalum (Ta), tantalum nitride (TaN), tungsten nitride (WN), or a combination thereof. According to the embodiment of the present invention, the first and second conductive liners 33N and 33P may be formed of or include titanium nitride.

A first metal contact plug 34N may be formed over and be in direct contact with the first conductive liner 33N. The first metal contact plug 34N may be formed while filling the contact hole 31 over the first conductive liner 33N. A second metal contact plug 34P may be formed over and be in direct contact with the second conductive liner 33P. The second metal contact plug 34P may be formed while filling the contact hole 31 over the second conductive liner 33P. A process of planarizing the first and second metal contact plugs 34N and 34P may be included. Therefore, the upper surfaces of the first and second metal contact plugs 34N and 34P may be positioned at the same level as the upper surface of the inter-layer dielectric layer 30.

The first and second metal contact plugs 34N and 34P may be formed of or include a metal-containing material. The first and second metal contact plugs 34N and 34P may be formed of or include a metal material or a metal compound. The first and second metal contact plugs 34N and 34P may include a tungsten (W)-containing material. The first and second metal contact plugs 34N and 34P may include tungsten or a tungsten compound.

The first and second metal contact plugs 34N and 34P may be formed, for example, by Chemical Vapor Deposition (CVD), Physical Vapor Deposition (PVD) or Atomic Layer Deposition (ALD). The first and second metal contact plugs 34N and 34P may use plasma to increase the deposition effect. The first and second metal contact plugs 34N and 34P may be formed by a method such as Plasma Enhanced CVD (PECVD) or Plasma Enhanced ALD (PEALD). According to the embodiment of the present invention, the first and second metal contact plugs 34N and 34P may be formed, for example, by Chemical Vapor Deposition (CVD). According to the embodiment of the present invention, the first and second metal contact plugs 34N and 34P may be formed of or include tungsten (W) or CVD-W.

Figure 2G:
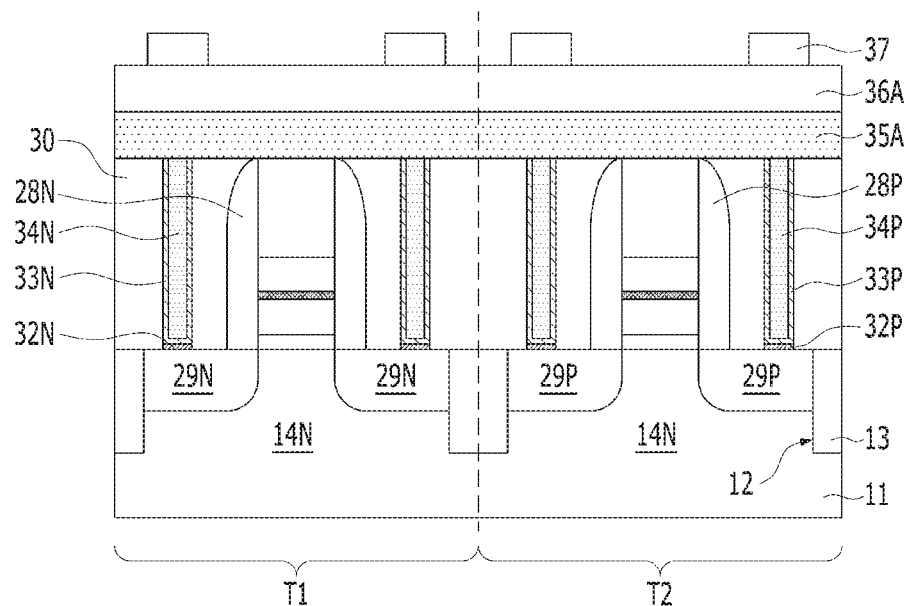

Referring to FIG. 2G, a metal wire layer 35A may be formed over and be in direct contact with the first and second metal contact plugs 34N and 34P and the inter-layer dielectric layer 30.

The metal wire layer 35A may be formed, for example, by Chemical Vapor Deposition (CVD), Physical Vapor Deposition (PVD), or Atomic Layer Deposition (ALD). Plasma may be used to increase the deposition effect of the metal wire layer 35A. The metal wire layer 35A may be formed by a method, such as Plasma Enhanced CVD (PECVD) or Plasma Enhanced ALD (PEALD). According to the embodiment of the present invention, the metal wire layer 35A may be formed by Physical Vapor Deposition (PVD). According to the embodiment of the present invention, the method for forming the first and second metal contact plugs 34N and 34P and the method for forming the metal wire layer 35A may be different. According to another embodiment of the present invention, the first and second metal contact plugs 34N and 34P and the metal wire layer 35A may be formed to be integrated.

The metal wire layer 35A may be formed of or include a metal-containing material. The metal wire layer 35A may be formed of or include a metal material or a metal compound. The metal wire layer 35A may be formed of or include a metal-containing material. The metal wire layer 35A may be formed or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (in), cadmium (Cd), chromium (Cr), and molybdenum (Mo). The metal wire layer 35A may be formed of a single layer film or a multi-layer film of a conductive material. According to the embodiment of the present invention, the metal wire layer 35A may be formed of or include a material containing tungsten (W). The metal wire layer 35A may be formed of or include tungsten (W), PVD-W, or a tungsten compound.

A metal wire hard mask layer 36A and a metal wire mask 37 may be sequentially formed over the metal wire layer 35A. The metal wire hard mask layer 36A may be formed of or include a dielectric material. The metal wire mask 37 may be formed of or include a photosensitive film pattern. The metal wire mask 37 may have a line shape extending in one direction.

Figure 2H:
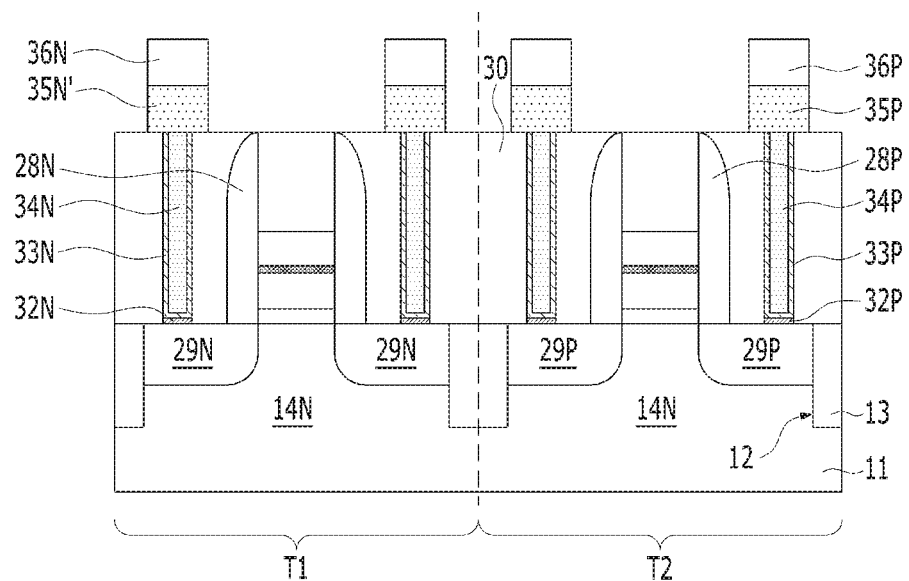

Referring to FIG. 2H, a preliminary first metal wire 35N' and a first metal wire hard mask 36N coupled to the first transistor may be formed over the first metal contact plug 34N and the inter-layer dielectric layer 30. A second metal wire 35P and a second metal wire hard mask 36P coupled to the second transistor may be formed over the second metal contact plug 34P and the inter-layer dielectric layer 30.

The first and second metal wire hard masks 36N and 36P may be formed by using the metal wire mask 37 and etching the metal wire hard mask layer 36A. The preliminary first metal wire 35N' and the second metal wire 35P may be formed by using the patterned first and second metal wire hard masks 36N and 36P and etching the metal wire layer 33A. The line widths of the preliminary first metal wire 35N' and the second metal wire 35P may be the same as or different from the line widths of the first and second metal contact plugs 34N and 34P. The line widths of the preliminary first metal wire 35N' and the second metal wire 35P may be greater than the line widths of the first and second metal contact plugs 34N and 34P. The preliminary first metal wire 35N' may be coupled to the first source/drain regions 29N through the first metal contact plug 34N. The second metal wire 35P may be coupled to the second source/drain regions 29P through the second metal contact plug 34P.

Figure 2I:
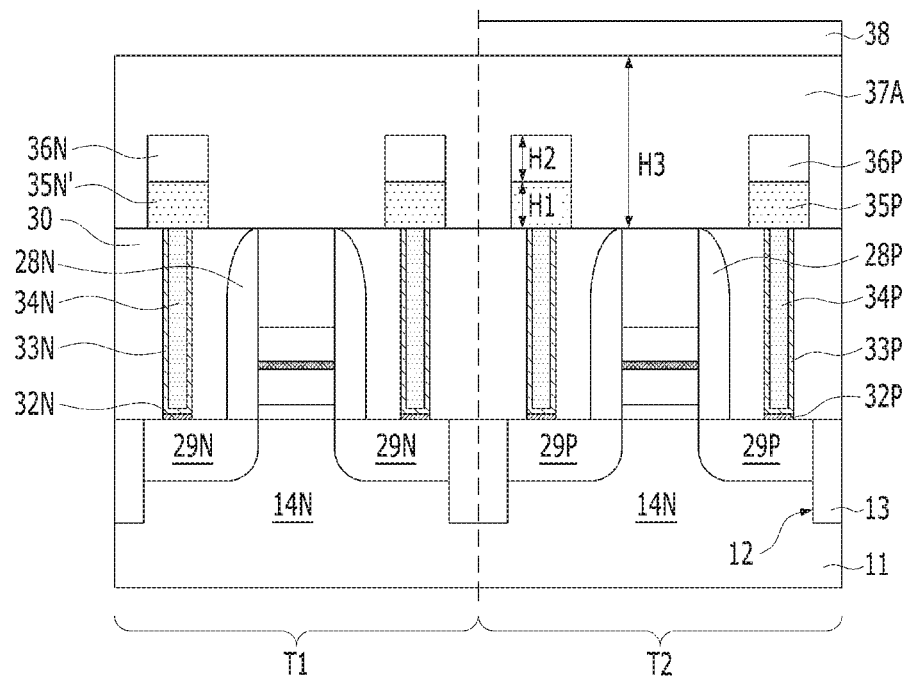

Referring to FIG. 2I, a capping layer 37A may be formed over and be in direct contact with the inter-layer dielectric layer 30. The capping layer 37A may cover the preliminary first metal wire 35N', the second metal wire 35P, and the first and second metal wire hard masks 36N and 36P. The thickness H3 of the capping layer 37A may be greater than the sum of the thickness H1 of the second metal wire 35P and the thickness H2 of the first and second metal wire hard masks 36N and 36P. The capping layer 37A may be formed of or include a dielectric material. The capping layer 37A may be formed of or include silicon nitride. The capping layer 37A may include a poor step-coverage material. For example, the capping layer 37A may be formed by Plasma Enhanced Chemical Vapor Deposition (PECVD).

A covering mask 38 covering the second metal wire 35P and the second region T2 may be formed over the second metal wire hard mask 36P. The covering mask 38 may include a photosensitive film pattern. Since the covering mask 38 is formed only in the second region T2, portions other than the second region T2 may not be protected in the subsequent etching process.

Figure 2J:
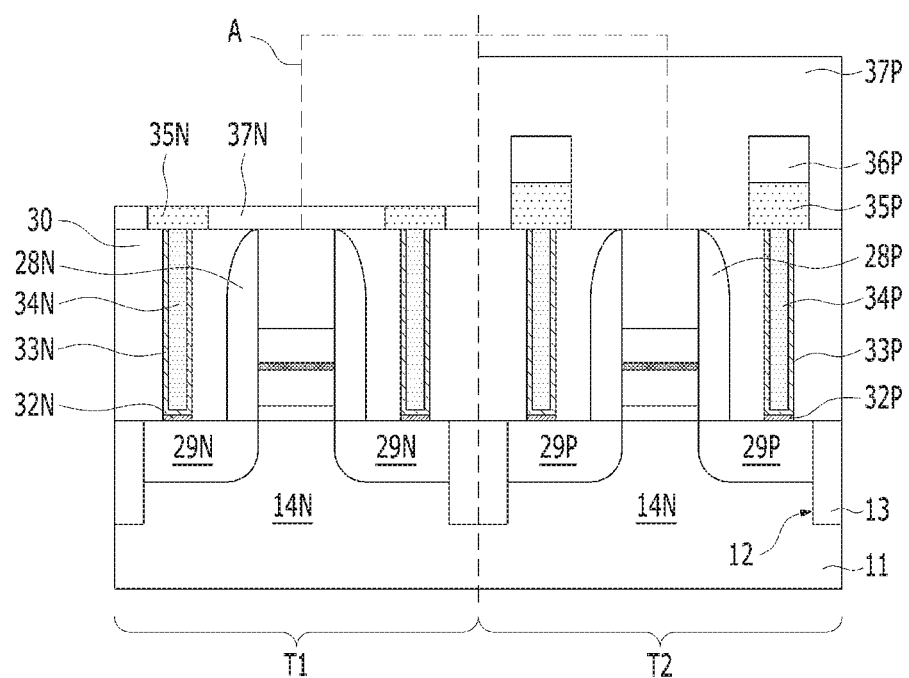

Referring to FIG. 2J, to form a first metal wire 35N having a thickness smaller than that of the second metal wire 35P, the capping layer 37A, the first metal wire hard mask 36N, and the preliminary first metal wire 35N' may be etched by using the covering mask 38. For example, a first capping layer 37N and a first metal wire 35N may be formed in the first region T1, and a second capping layer 37P may be formed in the second region T2. In the first region T1, all of the first metal wire hard mask 36N may be removed, and a portion of the first capping layer 37N may remain, and the first metal wire 35N may be formed. The first capping layer 37N may cover the sidewalls of the first metal wire 35N. The second capping layer 37P may cover the sidewalls and the upper portion of the second metal wire 35P. The second capping layer 37P may be formed of the same material as the first capping layer 37N.

Figure 2K:
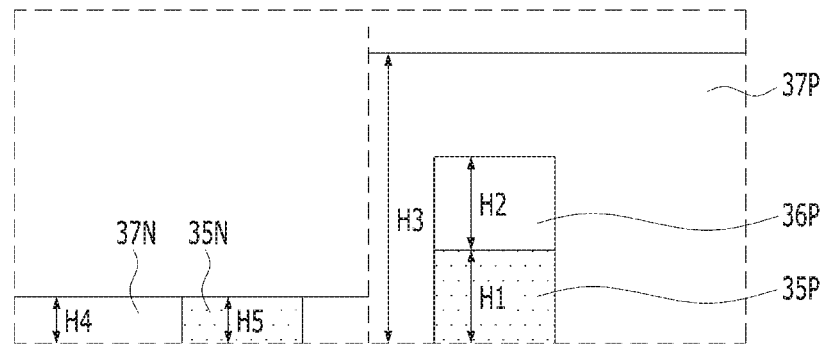

FIG. 2K is an enlarged view of a region A shown in FIG. 2J. Referring to FIG. 2K, the first metal wire 35N may have a smaller thickness than the preliminary first metal wire 35N'. The thickness H5 of the first metal wire 35N and the thickness H4 of the first capping layer 37N may be the same. Therefore, the upper surface of the first metal wire 35N may be exposed. The thickness H4 of the first capping layer 37N may be lower than the thickness H3 of the second capping layer 37P. The thickness H3 of the second capping layer 37P may be greater than the sum of the thickness H1 of the second metal wire 35P and the thickness H2 of the second metal wire hard mask 36P.

The thickness H5 of the first metal wire 35N and the thickness H1 of the second metal wire 35P may be the same or different from each other. The thickness H5 of the first metal wire 35N may be smaller than the thickness H1 of the second metal wire 35P. The bottom surface of the first metal wire 35N and the bottom surface of the second metal wire 35P may be positioned at the same level, and the upper surface of the first metal wire 35N may be lower than the upper surface of the second metal wire 35P. The difference between the thickness H5 of the first metal wire 35N and the thickness H1 of the second metal wire 35P may range from approximately 120 Å to approximately 180 Å. The thickness H5 of the first metal wire 35N may be approximately 150 Å smaller than the thickness H1 of the second metal wire 35P.

Since the thickness H5 of the first metal wire 35N is formed smaller than the thickness H1 of the second metal wire 35P in the semiconductor device in accordance with an embodiment of the present invention, the capacitance between the neighboring first metal wires 35N may be reduced. As a result, $C_{sa}$ may be reduced, and the sensing margin may be improved as the $C_{sa}$ is reduced. Also, since the thickness H5 of the first metal wire 35N is formed smaller than the thickness H1 of the second metal wire 35P in the semiconductor device, the resistance of the semiconductor device in the second region T2 may be maintained low. As a result, the semiconductor device may simultaneously obtain the effect of improving the sensing margin due to the reduction in the capacitance and the effect of reducing the resistance with respect to the regions other than the first transistor.

Figure 3:
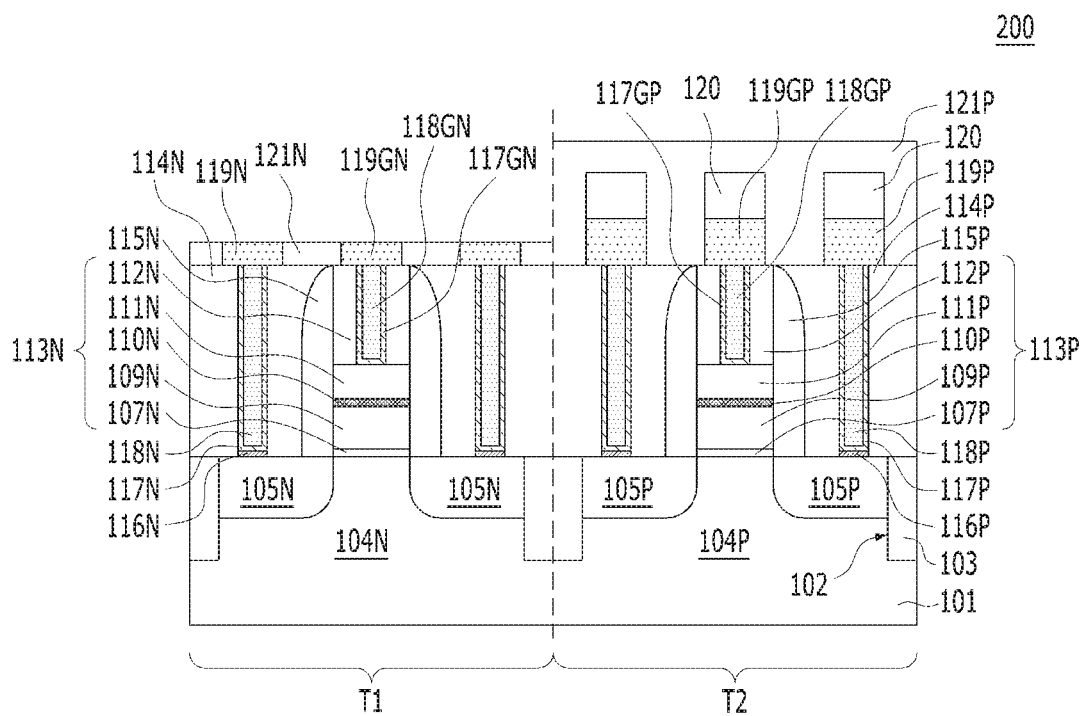
FIG. 3 is a cross-sectional view illustrating a semiconductor device 200 in accordance with another embodiment of the present invention.

FIG. 3 is a cross-sectional view illustrating a semiconductor device 200 in accordance with another embodiment of the present invention.

Referring to FIG. 3, the semiconductor device 200 may be similar to the semiconductor device 100 shown in FIG. 1A. The constituent elements also appearing in the semiconductor device 100 of FIG. 1A may use the same reference numerals. Hereinafter, a detailed description for the same constituent elements may be omitted.

The semiconductor device 200 may include a substrate 101 and first and second regions T1 and T2 that are formed over the substrate 101. The first region T1 may be referred to as a first peripheral circuit region, and the second region T2 may be referred to as a second peripheral circuit region. The first region T1 may include a first transistor, and the second region T2 may include a second transistor.

The first transistor of the first region T1 may include a first active region 104N, a first gate structure 113N formed over and directly contacting the first active region 104N, a first gate spacer 115N formed on both sidewalls of the first gate structure 113N, and first source/drain regions 105N formed in the first active region 104N to be aligned on both sides of the first gate structure 113N. The second transistor of the second region T2 may include a second active region 104P, a second gate structure 113P formed over and directly contacting the second active region 104P, a second gate spacer 115P formed on both sidewalls of the second gate structure 113P, and second source/drain regions 105P formed in the second active region 104P to be aligned on both sides of the second gate structure 113P.

The first gate structure 113N may include a first gate dielectric layer 107N formed over and directly contacting the first active region 104N, a first lower gate electrode 109N over the first gate dielectric layer 107N, a first barrier layer 110N over the first lower gate electrode 109N, a first upper gate electrode 111N over the first barrier layer 110N, and a first gate hard mask 112N over the first upper gate electrode 111N. The second gate structure 113P may include a second gate dielectric layer 107P formed over and directly contacting the second active region 104P, a second lower gate electrode 109P over the second gate dielectric layer 107P, a second barrier layer 110P over the second lower gate electrode 109P, a second upper gate electrode 111P over the second barrier layer 110P, and a second gate hard mask 112P over the second upper gate electrode 111P.

The first source/drain regions 105N of the first region T1 may be coupled to the first metal wire 119N through the first metal contact plug 118N. A first ohmic contact layer 116N and a first conductive liner 117N may be formed between the first metal contact plug 118N and the first source/drain regions 105N. The first metal contact plug 118N may penetrate the first inter-layer dielectric layer 114N to be coupled to the first source/drain regions 105N. The second source/drain regions 105P of the second region T2 may be coupled to the second metal wire 119P through the second metal contact plug 118P. A second ohmic contact layer 116P and a second conductive liner 117P may be formed between the second metal contact plug 118P and the second source/drain regions 105P. The second metal contact plug 118P may penetrate the second inter-layer dielectric layer 114P to be coupled to the second source/drain regions 105P.

The first upper gate electrode 111N of the first region T1 may be coupled to the first gate metal wire 119GN through the first gate contact plug 118GN. A first gate conductive liner 117GN may be formed between the first gate contact plug 118GN and the first upper gate electrode 111N. According to another embodiment of the present invention, the first gate contact plug 118GN may include a barrier-less metal structure in which the first gate conductive liner 117GN is omitted. The first gate conductive liner 117GN may include the same material as the first conductive liner 117N. The first gate conductive liner 117GN may be formed of or include a metal or a metal nitride. The first gate conductive liner 117GN may be formed of or include titanium (Ti), titanium nitride (TiN), titanium silicon nitride (TiSiN), tantalum (Ta), tantalum nitride (TaN), tungsten nitride (WN), or a combination thereof. The first gate conductive liner 117GN may be formed of or include a metal, a metal nitride, a metal silicide, or a combination thereof. The first gate contact plug 118GN may penetrate the first gate hard mask 112N to be coupled to the first upper gate electrode 111N.

The first metal wire 119N may be positioned over the first metal contact plug 118N. The first gate metal wire 119GN may be positioned over the first gate contact plug 118GN. The first gate metal wire 119GN may include the same material as the first metal wire 119N. The first gate metal wire 119GN may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The first gate metal wire 119GN may be formed of a single layer film or a multi-layer film of a conductive material. According to the embodiment of the present invention, the first gate metal wire 119GN may be formed of or include a material containing tungsten (W). The first gate metal wire 119GN may be formed of or include tungsten (W) or a tungsten compound. The first gate metal wire 119GN may be coupled to the first upper electrode 111N through the first gate contact plug 118GN.

The first capping layer 121N may fill the space between the first metal wire 119N and the first gate metal wire 119GN. The first capping layer 121N may cover the sidewalls of the first metal wire 119N. The first capping layer 121N may cover the sidewalls of the first gate metal wire 119GN. The thickness of the first capping layer 121N may be the same as the thickness of the first gate metal wire 119GN. The bottom surface of the first capping layer 121N and the bottom surface of the first gate metal wire 119GN may be positioned at the same level, and the upper surface of the first capping layer 121N and the upper surface of the first gate metal wire 119GN may be positioned at the same level. The first capping layer 121N may serve to protect the first metal wire 119N and the first gate metal wire 119GN from the subsequent processes. The first capping layer 121N may be formed of or include a dielectric material. The first capping layer 121N may be formed of or include silicon nitride.

The second upper gate electrode 111P of the second region T2 may be coupled to the second gate metal wire 119GP through the second gate contact plug 118GP. A second gate conductive liner 117GP may be formed between the second gate contact plug 118GP and the second upper gate electrode 111P. The second gate contact plug 118GP may include a barrier-less metal structure in which the second gate conductive liner 117GP is omitted. The second gate conductive liner 117GP may be formed of the same material as the second conductive liner 117P. The second gate conductive liner 117GP may be formed of or include a metal or a metal nitride. The second gate conductive liner 117GP may be formed of or include titanium (Ti), titanium nitride (TiN), titanium silicon nitride (TiSiN), tantalum (Ta), tantalum nitride (TaN), tungsten nitride (WN), or a combination thereof. The second gate conductive liner 117GP may be formed of or include a metal, a metal nitride, a metal silicide, or a combination thereof. The second gate contact plug 118GP may penetrate the second gate hard mask 112P to be coupled to the first upper gate electrode 111P.

The second metal wire 119P may be positioned over the second metal contact plug 118P. The second gate metal wire 119GP may be positioned over the second gate contact plug 118GP. The second metal wire 119P may be coupled to the second source/drain regions 105P through the second metal contact plug 118P and the second ohmic contact layer 116P. The second gate metal wire 119GP may include the same material as the second metal wire 119P. The second gate metal wire 119GP may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The second gate metal wire 119GP may be formed of a single layer film or a multi-layer film of a conductive material. According to the embodiment of the present invention, the second gate metal wire 119GP may be formed of or include a material containing tungsten (W). The second gate metal wire 119GP may be formed of or include tungsten (W) or a tungsten compound. The second gate metal wire 119GP may be coupled to the second upper electrode 111P through the second gate contact plug 118GP.

The second capping layer 121P may fill the space between the second metal wire 119P and the second gate metal wire 119GP. The second capping layer 121P may cover the sidewalls of the second metal wire 119P. The second capping layer 121P may cover the sidewalls of the second gate metal wire 119GP. The thickness of the second capping layer 121P may be greater than the thickness of the second gate metal wire 119GP. The bottom surface of the second capping layer 121P and the bottom surface of the second gate metal wire 119GP may be positioned at the same level, and the upper surface of the second capping layer 121P may be positioned at a higher level than the upper surface of the second gate metal wire 119GP. The second capping layer 121P may serve to protect the second metal wire 119P and the second gate metal wire 119GP from the subsequent processes. The second capping layer 121P may be formed of or include a dielectric material. The second capping layer 121P may be formed of or include silicon nitride.

The thickness of the first gate metal wire 119GN and the thickness of the second gate metal wire 119GP may be different. According to the embodiment of the present invention, the thickness of the first gate metal wire 119GN may be smaller than the thickness of the second gate metal wire 119GP. The bottom surface of the first gate metal wire 119GN and the bottom surface of the second gate metal wire 119GP may be positioned at the same level, and the upper surface of the first gate metal wire 119GN may be positioned at a lower level than the upper surface of the second gate metal wire 119GP. The difference between the thickness of the first gate metal wire 119GN and the thickness of the second gate metal wire 119GP may range from approximately 130 Å to approximately 170 Å. According to the embodiment of the present invention, the difference between the thickness of the first gate metal wire 119GN and the thickness of the second gate metal wire 119GP may be approximately 150 Å. According to the embodiment of the present invention, the thickness of the first gate metal wire 119GN may be approximately 150 Å lower than the thickness of the second gate metal wire 119GP.

The semiconductor device 200 may include a CMOSFET, and the first transistor may include an NMOSFET, and the second transistor may include a PMOSFET. According to another embodiment of the present invention, the semiconductor device 200 may include different NMOSFETs. The first NMOSFET may be an NMOSFET having a thin first gate dielectric layer, and the second NMOSFET may be an NMOSFET having a second gate dielectric layer which is thicker than the first gate dielectric layer. According to another embodiment of the present invention, the semiconductor device 200 may include different PMOSFETs. The first PMOSFET may be a PMOSFET having a thin first gate dielectric layer, and the second PMOSFET may be a PMOSFET having a second gate dielectric layer which is thicker than the first gate dielectric layer.

The semiconductor device 200 may include a peripheral circuit of a DRAM. The semiconductor device 200 may include a peripheral circuit of the memory cell, and the first transistor may be a transistor coupled to a bit line of the memory cell, and the second transistor may be a transistor coupled to a word line of the memory cell. The first transistor may be a sense amplifier SA, and the second transistor may be, for example, a sub-word line driver SWD.

Since the thickness of the first gate metal wire 119GN is formed smaller than the thickness of the second gate metal wire 119GP in the semiconductor device 200 in accordance with an embodiment of the present invention, the capacitance between the neighboring first gate metal wires 119GN may be reduced. As a result, $C_{sa}$ may be reduced, and the sensing margin may be improved as the $C_{sa}$ is reduced. Also, since the thickness of the first gate metal wire 119GN is formed smaller than the thickness of the second gate metal wire 119GP in the semiconductor device 200, the resistance of the semiconductor device 200 in the second region T2 may be maintained low. As a result, the semiconductor device 200 may simultaneously obtain the effect of improving the sensing margin due to the reduction of the capacitance of the first region T1 and the effect of reducing the resistance for the regions other than the first region T1.

Figure 4:
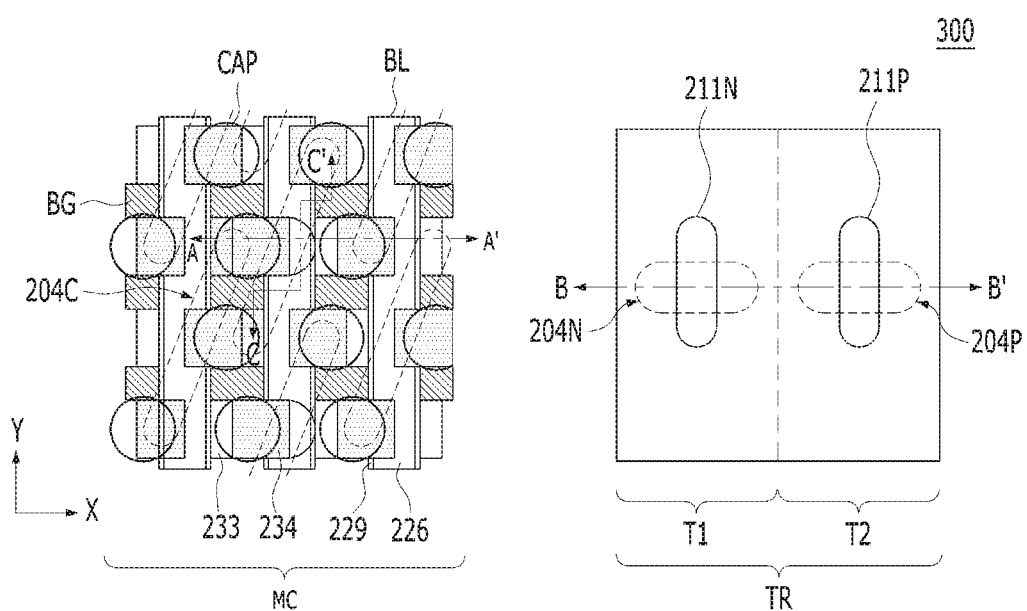
FIG. 4 is a plan view illustrating a semiconductor device 300 in accordance with another embodiment of the present invention.

FIG. 4 is a plan view illustrating the semiconductor device in accordance with an embodiment of the present invention.

The semiconductor device 300 may include a memory cell region MC and a peripheral circuit region TR.

A plurality of memory cells may be formed in the memory cell region MC. Each memory cell may include a memory cell active region 204C, a buried word line BG, a bit line structure BL, and a capacitor CAP. The buried word line BG may extend in a first direction X, and the bit line structure BL may extend in the second direction Y. The first direction X and the second direction Y may intersect with each other. Each bit line structure BL may include a bit line 226, a bit line spacer 229, and a bit line contact plug 222. The memory cell region MC may include a storage node contact plug 235 and a landing pad 234. The landing pad 234 may overlap with the storage node contact plug 235 and the bit line 226.

In the peripheral circuit region TR, a transistor forming a peripheral circuit (hereinafter, simply referred to as 'a peripheral transistor') may be formed. The peripheral circuit region TR may include a first region T1 and a second region T2. The first region T1 may be referred to as a first peripheral circuit region, and the second region T2 may be referred to as a second peripheral circuit region. The first region T1 may refer to a region in which a transistor having at least one thin gate dielectric layer is to be formed. The second region T2 may refer to a region in which a transistor having at least one thick gate dielectric layer is to be formed. The first region T1 may include a first transistor, and the second region T2 may include a second transistor. The first region T1 may be a sense amplifier SA, and the second region T2 may be, for example, a sub-word line driver SWD. The first transistor of the first region T1 may be a transistor coupled to a bit line of the memory cell, and the second transistor of the second region T2 may be a transistor coupled to a word line of the memory cell. The peripheral circuit region TR may include peripheral circuit active regions 204N and 204P and gate electrodes 211N and 211P.

Figure 5A:
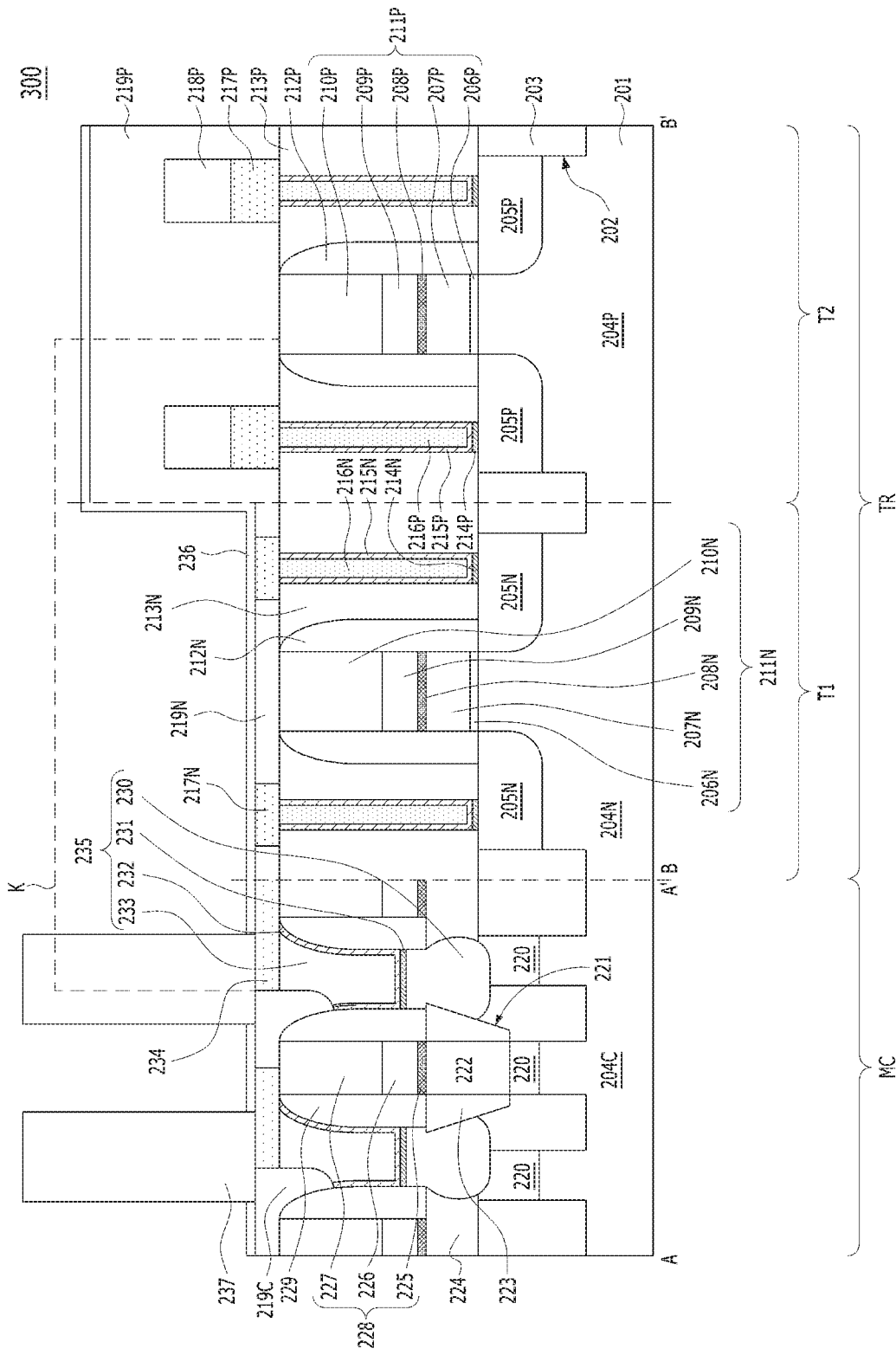
FIGS. 5A and 5B are cross-sectional views illustrating the semiconductor device 300 in accordance with an embodiment of the present invention.

FIG. 5A is a cross-sectional view illustrating the semiconductor device 300 shown in FIG. 4. FIG. 5A is a cross-sectional view taken along a line A-A' and a line B-B' shown in FIG. 4.

Figure 5B:
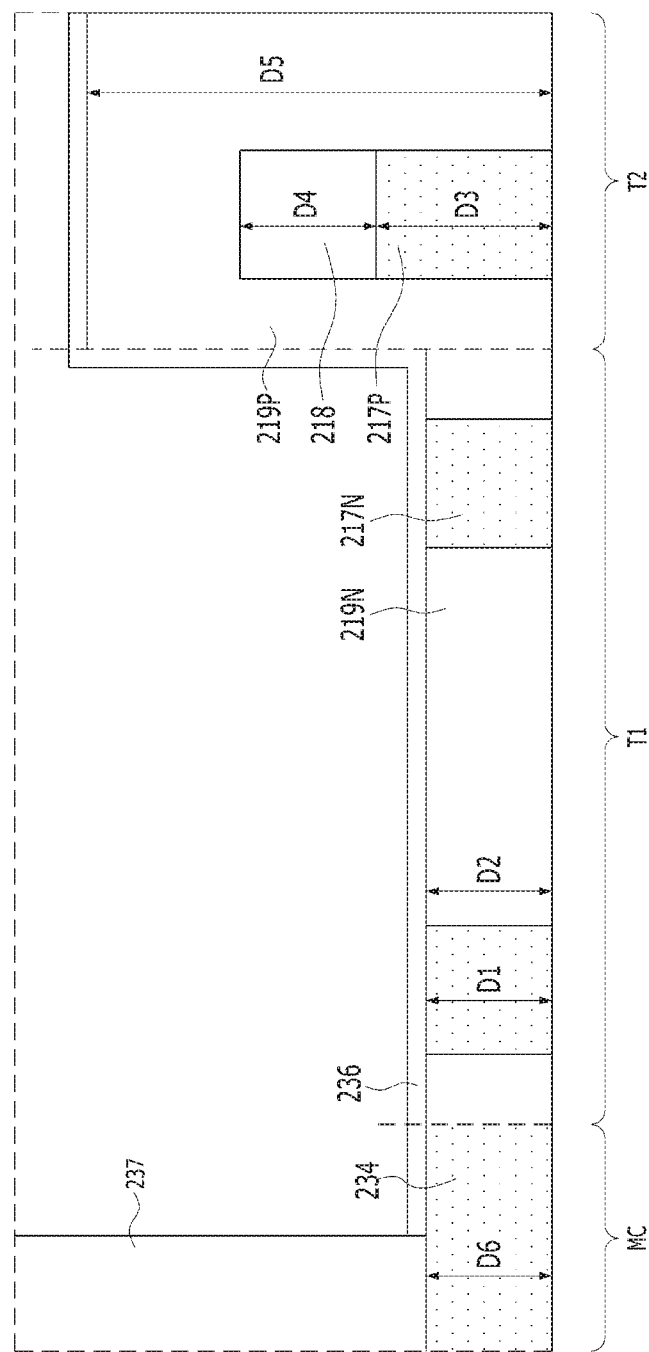

FIG. 5B is an enlarged view of an area K shown in FIG. 5A.

Referring to FIG. 5A, the semiconductor device 300 may include a substrate 201, a memory cell region MC formed in the substrate 201, a landing pad 234 coupled to the memory cell region MC, first and second regions T1 and T2 formed in the substrate 201, and first and second metal wires 217N and 217P respectively coupled to the first and second regions T1 and T2. The first region T1 may be referred to as a first peripheral circuit region, and the second region T2 may be referred to as a second peripheral circuit region. The first region T1 may refer to a region in which a transistor having at least one thin gate dielectric layer is to be formed. The second region T2 may refer to a region in which a transistor having at least one thick gate dielectric layer is to be formed. The first region T1 may include a first transistor, and the second region T2 may include a second transistor. The first region T1 may be a sense amplifier SA, and the second region T2 may be, for example, a sub-word line driver SWD.

An isolation layer 203 may be formed in the substrate 201. The isolation layer 203 may be formed in a trench 202. A plurality of active regions 204C, 204N, and 204P may be defined in the substrate 201 by the isolation layer 203. The memory cell active region 204C may be defined in the memory cell region MC by the isolation layer 203. The memory cell active regions 204C may have a shape isolated by the isolation layer 203. The first active region 204N and the second active region 204P may be defined in the peripheral circuit region TR by the isolation layer 203.

The memory cell active region 204C may be defined in the memory cell region MC by the isolation layer 203. The memory cell active regions 204C may have a shape isolated by the isolation layer 203. The first active region 204N and the second active region 204P may be defined in the peripheral circuit region TR by the isolation layer 203.

The substrate 201 may be any material suitable for semiconductor processing. The substrate 201 may include a semiconductor substrate. The substrate 201 may be formed, for example, of a silicon-containing material. The substrate 201 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 201 may also include other semiconductor materials such as germanium. The substrate 201 may include a group-IIIV semiconductor substrate, for example, a compound semiconductor substrate, such as GaAs. The substrate 201 may include a Silicon-On-Insulator (SOI) substrate. The isolation layer 203 may be formed by a Shallow Trench Isolation (STI) process.

Hereinafter, the structure of the peripheral circuit region TR is described.

The first transistor of the first region T1 may include a first active region 204N, a first gate structure 211N formed over and directly contacting the first active region 204N, a first gate spacer 212N formed on both sidewalls of the first gate structure 211N, and first source/drain regions 205N formed in the first active region 204N to be aligned on both sides of the first gate structure 211N. The first source/drain regions 205N may be doped with an N-type impurity or a P-type impurity. The first source/drain regions 205N may include an N-type impurity, such as arsenic (As) or phosphorus (P). The first source/drain regions 205N may include a low-concentration source/drain region and a high-concentration source/drain region.

The first gate structure 211N may include a first gate dielectric layer 206N formed over and directly contacting the first active region 204N, a first lower gate electrode 207N over the first gate dielectric layer 206N, a first barrier layer 208N over the first lower gate electrode 207N, a first upper gate electrode 209N over the first barrier layer 208N, and a first gate hard mask 210N over the first upper gate electrode 209N. The first gate structure 211N may include a stack of the first gate dielectric layer 206N, the first lower gate electrode 207N, the first barrier layer 208N, and the first upper gate electrode 209N. The first gate structure 211N may be at least one among a planar gate, a recess gate, a buried gate, an omega gate, and a fin gate. According to the embodiment of the present invention, the first gate structure 211N may be a planar gate.

The first gate dielectric layer 206N may be positioned over the substrate 201. The first gate dielectric layer 206N may be formed of or include a high-k material, an oxide, a nitride, an oxynitride, or a combination thereof. For example, the high-k material may be or include hafnium oxide ($HfO_2$), hafnium silicate (HfSiO), hafnium silicate nitride (HfSiON), or a combination thereof. The first gate dielectric layer 206N may further include an interface layer (not shown). The interface layer may be formed of or include silicon oxide, silicon nitride, or a combination thereof. The first gate dielectric layer 206N may be formed by stacking an interface layer and a high-k material.

The first lower gate electrode 207N may be formed over and be in direct contact with the first gate dielectric layer 206N. The first lower gate electrode 207N may be formed of or include a semiconductor material. The first lower gate electrode 207N may be doped with an impurity. For example, it may be doped an impurity by a doping process, such as an implantation process. According to the embodiment of the present invention, the first lower gate electrode 207N may be formed of or include polysilicon. According to another embodiment of the present invention, the first lower gate electrode 207N may be formed of a metal-containing material.

The first barrier layer 208N may be positioned over the first lower gate electrode 207N. The height of the first barrier layer 208N may be lower than the height of the first lower gate electrode 207N. The first barrier layer 208N may be formed of or include titanium (Ti), titanium nitride (TiN), titanium silicon nitride (TiSiN), tantalum (Ta), tantalum nitride (TaN), tungsten nitride (WN), or a combination thereof. According to the embodiment of the present invention, the first barrier layer 208N may be formed of or include a material containing titanium nitride (TiN).

The first upper gate electrode 209N may be positioned over the first barrier layer 208N. The first upper gate electrode 209N may be formed of or include a metal-containing material. The first upper gate electrode 209N may be formed of or include a metal, a metal nitride, a metal silicide, or a combination thereof. According to the embodiment of the present invention, the first upper gate electrode 209N may be formed of or include tungsten (W) or a tungsten compound.

The first gate hard mask 210N may be positioned over the first upper gate electrode 209N. The first gate hard mask 210N may be formed of a dielectric material having an etch selectivity with respect to the first upper gate electrode 209N. The height of the first gate hard mask 210N may be greater than the height of the first upper gate electrode 209N. The first gate hard mask 210N may be formed of or include silicon oxide, silicon nitride, silicon oxynitride, or a combination thereof. According to the embodiment of the present invention, the first gate hard mask 210N may be formed of silicon nitride.

The first gate spacer 212N may be positioned on both sidewalls of the first gate structure 211N. The first gate spacer 212N may be formed of a dielectric material. The first gate spacer 212N may be formed of or include a low-k material. The first gate spacer 212N may be formed of or include an oxide or a nitride. The first gate spacer 212N may be formed of or include silicon oxide, silicon nitride, or a metal oxide. The first gate spacer 212N may be formed of or include $SiO_2$, $Si_3N_4$, or SiN. The first gate spacer 212N may be or include a multi-layer spacer. The first gate spacer 212N may be or include an air gap (not shown). Therefore, a pair of line-type air gaps may be formed on both sidewalls of the first gate spacer 212N. The pair of line-type air gaps may be symmetrical. According to some embodiments of the present invention, the multi-layer spacer may include a first spacer, a second spacer, and a third spacer. The third spacer may be positioned between the first spacer and the second spacer. In the multi-layer spacer may include a NON structure in which an oxide spacer is positioned between nitride spacers. In another embodiment, the multi-layer spacer may include a first spacer, a second spacer, and an air gap between the first spacer and the second spacer.

The first source/drain regions 205N of the first region T1 may be coupled to the first metal wire 217N through the first metal contact plug 216N. A first ohmic contact layer 214N and a first conductive liner 215N may be formed between the first metal contact plug 216N and the first source/drain regions 205N. The first ohmic contact layer 214N may be formed of or include a metal silicide. The first conductive liner 215N may be formed of or include titanium (Ti), titanium nitride (TiN), titanium silicon nitride (TiSiN), tantalum (Ta), tantalum nitride (TaN), tungsten nitride (WN), or a combination thereof. The first metal contact plug 216N may be formed of or include a metal, a metal nitride, a metal silicide, or a combination thereof. For example, the first conductive liner 215N may be formed of or include titanium nitride, and the first metal contact plug 216N may be formed of or include tungsten (W) or a tungsten compound. According to another embodiment of the present invention, it may include a barrier-less metal structure in which the first conductive liner 215N is omitted.

The first metal contact plug 216N may fill a contact hole (not shown) in the first inter-layer dielectric layer 213N. The first metal contact plug 216N may be coupled to first source/drain regions 205N through the first inter-layer dielectric layer 213N. The first inter-layer dielectric layer 213N may be formed of or include a dielectric material. The first inter-layer dielectric layer 213N may be formed of or include silicon oxide, silicon nitride, a low-k material, or a combination thereof. The first metal contact plug 216N may be formed of or include a metal-containing material.

The first metal wire 217N may be positioned over the first metal contact plug 216N. The first metal wire 217N may be coupled to the first source/drain regions 205N through the first metal contact plug 216N and the first ohmic contact layer 214N. The first metal wire 217N may be formed of or include a metal-containing material. The first metal wire 217N may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The first metal wire 217N may be formed of a single layer film or a multi-layer film of a conductive material. According to the embodiment of the present invention, the first metal wire 217N may be formed of or include a material containing tungsten (W). The first metal wire 217N may be formed of or include tungsten (W) or a tungsten compound.

The first capping layer 219N may fill the space between the first metal wires 217N. The first capping layer 219N may cover the sidewalls of the first metal wires 217N. Referring to FIG. 5B, the thickness D2 of the first capping layer 219N may be the same as the thickness D1 of the first metal wire 217N. The bottom surface of the first capping layer 219N and the bottom surface of the first metal wire 217N may be positioned at the same level, and the upper surface of the first capping layer 219N and the upper surface of the first metal wire 217N may be also positioned at the same level. The first capping layer 219N may serve to protect the first metal wire 217N from the subsequent processes. The first capping layer 219N may be formed of or include a dielectric material. The first capping layer 219N may be formed of or include silicon nitride.

The second transistor of the second region T2 may include a second active spacer 204P, a second gate structure 211P formed over and directly contacting the second active region 204P, a second gate spacer 212P formed on the sidewalls of the second gate structure 211P, and second source/drain regions 205P formed in the second active region 204P to be aligned on both sides of the second gate structure 211P. The second source/drain regions 205P may be doped with an N-type impurity or a P-type impurity. The second source/drain regions 205P may include an N-type impurity, such as arsenic (As) or phosphorus (P). The second source/drain regions 205P may include a low-concentration source/drain region and a high-concentration source/drain region.

The second gate structure 211P may include a second gate dielectric layer 206P formed over and directly contacting the second active region 204P, the second lower gate electrode 207P over the second gate dielectric layer 206P, a second barrier layer 208P over the second lower gate electrode 207P, a second upper gate electrode 209P over the second barrier layer 208P, and a second gate hard mask 210P over the second upper gate electrode 209P. The second gate structure 211P may include a stack of the second gate dielectric layer 206P, the second lower gate electrode 207P, the second barrier layer 208P, and the second upper gate electrode 209P.

The second gate structure 211P may be positioned over the substrate 201. The second gate structure 211P may be at least one among a planar gate, a recess gate, a buried gate, an omega gate, and a fin gate. According to the embodiment of the present invention, the second gate structure 211P may be a planar gate.

The second gate dielectric layer 206P may be formed of or include a high-k material, an oxide, a nitride, an oxynitride, or a combination thereof. For example, the high-k material may be or include hafnium oxide ($HfO_2$), hafnium silicate (HfSiO), hafnium silicate nitride (HfSiON), or a combination thereof. The second gate dielectric layer 206P may further include an interface layer (not shown). The interface layer may be formed of or include silicon oxide, silicon nitride, or a combination thereof. The second gate dielectric layer 206P may be formed by stacking an interface layer and a high-k material.

The second lower gate electrode 207P may be formed over and be in direct contact with the second gate dielectric layer 206P. The second lower gate electrode 207P may be formed of or include a semiconductor material. The second lower gate electrode 207P may be doped with an impurity. For example, it may be doped with an impurity by a doping process, such as implantation. According to the embodiment of the present invention, the second lower gate electrode 207P may be formed of or include polysilicon. According to another embodiment of the present invention, the second lower gate electrode 207P may be formed of a metal-containing material.

The second barrier layer 208P may be positioned over the second lower gate electrode 207P. The height of the second barrier layer 208P may be lower than the height of the second lower gate electrode 207P. The second barrier layer 208P may be formed of or include titanium (Ti), titanium nitride (TiN), titanium silicon nitride (TiSiN), tantalum (Ta), tantalum nitride (TaN), tungsten nitride (WN), or a combination thereof. According to the embodiment of the present invention, the second barrier layer 208P may be formed of or include a material containing titanium nitride (TiN).

The second upper gate electrode 209P may be positioned over the second barrier layer 208P. The second upper gate electrode 209P may be formed of or include a metal-containing material. The second upper gate electrode 209P may be formed of or include a metal, a metal nitride, a metal silicide, or a combination thereof. According to the embodiment of the present invention, the second upper gate electrode 209P may be formed of or include tungsten (W) or a tungsten compound.

The second gate hard mask 210P may be positioned over the second upper gate electrode 209P. The second gate hard mask 210P may be formed of a dielectric material having an etch selectivity with respect to the second upper gate electrode 209P. The height of the second gate hard mask 210P may be higher than the height of the second upper gate electrode 209P. The second gate hard mask 210P may be formed of or include silicon oxide, silicon nitride, silicon oxynitride, or a combination thereof. According to the embodiment of the present invention, the second gate hard mask 210P may be formed of silicon nitride.

The second gate spacer 212P may be positioned on both sidewalls of the second gate structure 211P. The second gate spacer 212P may be formed of a dielectric material. The second gate spacer 212P may be formed of or include a low-k material. The second gate spacer 212P may be formed of or include an oxide or a nitride. The second gate spacer 212P may be formed of or include silicon oxide, silicon nitride, or a metal oxide. The second gate spacer 212P may be formed of or include $SiO_2$, $Si_3N_4$, or SiN. The second gate spacer 212P may be or include a multi-layer spacer. The second gate spacer 212P may be or include an air gap (not shown). For example, a pair of line-type air gaps may be formed on both sidewalls of the second gate spacer 212P. The pair of line-type air gaps may be symmetrical. According to some embodiments of the present invention, the multi-layer spacer may include a first spacer, a second spacer, and a third spacer. The third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

The second source/drain regions 205P of the second region T2 may be coupled to the second metal wire 217P through the second metal contact plug 216P. A second ohmic contact layer 214P and a second conductive liner 215P may be formed between the second metal contact plug 216P and the second source/drain regions 205P. The second ohmic contact layer 214P may be formed of or include a metal silicide. The second conductive liner 215P may be formed of or include titanium (Ti), titanium nitride (TiN), titanium silicon nitride (TiSiN), tantalum (Ta), tantalum nitride (TaN), tungsten nitride (WN), or a combination thereof. The second metal contact plug 216P may be formed of or include a metal, a metal nitride, a metal silicide, or a combination thereof. For example, the second conductive liner 215P may be formed of or include titanium nitride, and the second metal contact plug 216P may be formed of or include tungsten (W) or tungsten compound. According to another embodiment of the present invention, it may include a barrier-less metal structure in which the second conductive liner 215P is omitted.

The second metal contact plug 216P may fill a contact hole (not shown) in the second inter-layer dielectric layer 213P. The second metal contact plug 216P may be coupled to second source/drain regions 205P through the second inter-layer dielectric layer 213P. The second inter-layer dielectric layer 213P may be formed of or include a dielectric material. The second inter-layer dielectric layer 213P may be formed of or include silicon oxide, silicon nitride, a low-k material, or a combination thereof. The second metal contact plug 216P may be formed of or include a metal-containing material.

The second metal wire 217P may be positioned over the second metal contact plug 216P. The second metal wire 217P may be coupled to the second source/drain regions 205P through the second metal contact plug 216P and the second ohmic contact layer 214P.

Referring to FIG. 5B, the thickness D1 of the first metal wire 217N and the thickness D3 of the second metal wire 217P may be different. According to the embodiment of the present invention, the thickness D1 of the first metal wire 217N may be smaller than the thickness D3 of the second metal wire 217P. The bottom surface of the first metal wire 217N and the bottom surface of the second metal wire 217P may be positioned at the same level, and the upper surface of the first metal wire 217N may be positioned at a level lower than the upper surface of the second metal wire 217P. The difference between the thickness D1 of the first metal wire 217N and the thickness D3 of the second metal wire 217P may range from approximately 130 Å to approximately 170 Å. According to the embodiment of the present invention, the difference between the thickness D1 of the first metal wire 217N and the thickness D3 of the second metal wire 217P may be approximately 150 Å. According to the embodiment of the present invention, the thickness D1 of the first metal wire 217N may be approximately 150 Å lower than the thickness D3 of the second metal wire 217P.

The second metal wire 217P may be formed of or include a metal-containing material. The second metal wire 217P may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The second metal wire 217P may be formed of a single layer film or a multi-layer film of a conductive material. According to the embodiment of the present invention, the second metal wire 217P may be formed of or include a material containing tungsten (W). The second metal wire 217P may be formed of or include tungsten (W) or a tungsten compound.

The second capping layer 219P may fill the space between the second metal wires 217P. The second capping layer 219P may cover the sidewalls and the upper portion of the second metal wires 217P. The second capping layer 219P may fill the space between the second metal wires 217P. The second capping layer 219P may cap the second metal wires 217P and the metal wire hard mask 218. Referring to FIG. 5B, the thickness D5 of the second capping layer 219P may be greater than the sum of the thickness D3 of the second metal wire 217P and the thickness D4 of the metal wire hard mask 218. The thickness D5 of the second capping layer 219P may be greater than the thickness D2 of the first capping layer 219N. The bottom surface of the second capping layer 219P and the bottom surface of the first capping layer 219N may be positioned at the same level, and the upper surface of the second capping layer 219P may be positioned at a higher level than the upper surface of the first capping layer 219N. The second capping layer 219P may serve to protect the second metal wire 217P from the subsequent processes. The second capping layer 219P may be formed of or include a dielectric material. The second capping layer 219P may be formed of or include silicon nitride. The second capping layer 219P may be formed of the same material as the first capping layer 219N.

Hereinafter, the structure of the memory cell region MC will be described.

The memory cell active region 204C may include a cell source/drain region 220. The cell source/drain region 220 may be doped with an N-type impurity or a P-type impurity. The cell source/drain region 220 may include an N-type impurity, such as arsenic (As) or phosphorus (P).

A bit line contact plug 222 may be formed over the substrate 201. The bit line contact plug 222 may be coupled to the cell source/drain region 220. The bit line contact plug 222 may be positioned inside a bit line contact hole 221. The bit line contact hole 221 may be formed in a cell region inter-layer dielectric layer 224. The cell region inter-layer dielectric layer 224 may be formed over the substrate 201. The cell region inter-layer dielectric layer 224 may be formed of or include a dielectric material. The lower surface of the bit line contact plug 222 may be lower than the upper surface of the substrate 201. The width of the bit line contact plug 222 may be smaller than the diameter of the bit line contact hole 221. The bit line contact plug 222 may be formed of polysilicon or a metal material.

A dielectric plug 223 may be formed on both sidewalls of the bit line contact plug 222. The dielectric plug 223 may be positioned in the bit line contact hole 221. The dielectric plug 223 may be formed independently on both sides of the bit line contact plug 222. The bit line contact plug 222 and the dielectric plug 223 may be positioned in the bit line contact hole 221, and the dielectric plug 223 may be isolated by the bit line contact plug 222. The upper surface of the dielectric plug 223 may be positioned at the same level as the upper surface of the bit line contact plug 222. The dielectric plug 223 may be formed of or include a dielectric material. The dielectric plug 223 may be formed of or include silicon nitride.

A bit line structure 228 may be formed over the bit line contact plug 222. The bit line structure 228 may include a stack of a cell barrier layer 225, a bit line 226, and a bit line hard mask 227.

The cell barrier layer 225 may be formed over and be in direct contact with the bit line contact plug 222. The cell barrier layer 225 may be formed of or include titanium (Ti), titanium nitride (TiN), titanium silicon nitride (TiSiN), tantalum (Ta), tantalum nitride (TaN), tungsten nitride (WN), or a combination thereof. According to the embodiment of the present invention, the cell barrier layer 225 may be formed of or include a material containing titanium nitride (TiN). The height of the cell barrier layer 225 may be the same as the height of the first and second barrier layers 208N and 208P. The cell barrier layer 225 may include the same material as the first and second barrier layers 208N and 208P.

The bit line 226 and the bit line contact plug 222 may have the same line width. The bit line 226 may extend in one direction while covering the cell barrier layer 225. The bit line 226 may be formed of or include a metal-containing material. The bit line 226 may be formed of or include a metal, a metal nitride, a metal silicide, or a combination thereof. According to the embodiment of the present invention, the bit line 226 may be formed of or include tungsten (W) or a tungsten compound. The bit line 226 and the first and second upper gate electrodes 209N and 209P may be formed of the same material.

The bit line hard mask 227 may be formed of or include a dielectric material. The bit line hard mask 227 may be formed of or include silicon nitride. The bit line hard mask 227 and the first and second gate hard masks 210N and 210P may be made of the same material.

A bit liner spacer 229 may be formed on both sidewalls of the bit line structure 228. The bit liner spacer 229 may be formed of a dielectric material. The bit liner spacer 229 may be formed of or include a low-k material. The bit liner spacer 229 may be formed of or include an oxide or a nitride. The bit liner spacer 229 may be formed of or include silicon oxide, silicon nitride, or a metal oxide. The bit liner spacer 229 may be formed of or include $SiO_2$, $Si_3N_4$, or SiN. The bit liner spacer 229 may be or include a multi-layer spacer. The bit liner spacer 229 may be or include an air gap. For example, a pair of line-type air gaps may be formed on both sidewalls of the bit liner spacer 229. The pair of line-type air gaps may be symmetrical. According to some embodiments of the present invention, the multi-layer spacer may include a first spacer, a second spacer, and a third spacer. The third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

A storage node contact plug 235 may be formed over a neighboring cell source/drain region 220. The storage node contact plug 235 may include a lower plug 230, a cell ohmic contact layer 231, a cell conductive liner 232, and an upper plug 233.

The lower plug 230 may be formed inside the cell region inter-layer dielectric layer 224. The lower plug 230 may be adjacent to the bit line 226 and the bit line contact plug 222. The lower plug 230 may include a bulb type. Therefore, the contact area between the lower plug 230 and the cell source/drain region 220 may be increased. A cell ohmic contact layer 231 may be formed over and be in direct contact with the lower plug 230. The cell ohmic contact layer 231 may be formed of or include a metal silicide. The contact resistance may be reduced by the cell ohmic contact layer 231. The cell conductive liner 232 may be formed of or include titanium (Ti), titanium nitride (TiN), titanium silicon nitride (TiSiN), tantalum (Ta), tantalum nitride (TaN), tungsten nitride (WN), or a combination thereof.

A landing pad 234 may be formed over and be in direct contact with the storage node contact plug 235. The storage node contact plug 235 and the landing pad 234 may be referred to as a semi-metal plug (SMP). The landing pad 234 may be electrically connected to the storage node contact plug 235. A portion of the landing pad 234 may overlap with the bit line structure 228. Therefore, an overlap margin may be secured. A capacitor (not shown) including a storage node over the landing pad 234 may be included.

The lower plug 230 may be a silicon-containing material, and the upper plug 233 and the landing pad 234 may be a metal-containing material. The lower plug 230 may be formed of or include polysilicon, and the upper plug 233 and the landing pad 234 may be formed of or include tungsten (W). The method of forming the upper plug 233 and the method of forming the landing pad 234 may be the same or different from each other. According to the embodiment of the present invention, the upper plug 233 may be formed through a Chemical Vapor Deposition (CVD) process, and the landing pad 234 may be formed through a Physical Vapor Deposition (PVD) process. According to another embodiment of the present invention, the upper plug 233 and the landing pad 234 may be simultaneously formed.

Referring to FIG. 5B, the thickness D6 of the landing pad 234 may be the same as or different from the thicknesses D1 and D3 of the first and second metal wires 217N and 217P.

According to the embodiment of the present invention, the thickness D6 of the landing pad 234 may be the same as the thickness D1 of the first metal wire 217N. The thickness D6 of the landing pad 234 may be different from the thickness D3 of the second metal wire 217P. The thickness D6 of the landing pad 234 may be smaller than the thickness D3 of the second metal wire 217P. The bottom surface of the landing pad 234 and the bottom surface of the first metal wire 217N may be positioned at the same level, and the upper surface of the landing pad 234 may be positioned at the same level as the upper surface of the first metal wire 217N. The bottom surface of the landing pad 234 and the bottom surface of the second metal wire 217P may be positioned at the same level, and the upper surface of the landing pad 234 may be positioned at a lower level than the upper surface of the second metal wire 217P. The difference between the thickness D6 of the landing pad 234 and the thickness D3 of the second metal wire 217P may range from approximately 130 Å to approximately 170 Å. According to the embodiment of the present invention, the difference between the thickness D6 of the landing pad 234 and the thickness D3 of the second metal wire 217P may be approximately 150 Å. According to the embodiment of the present invention, the thickness D6 of the landing pad 234 may be approximately 150 Å lower than the thickness D3 of the second metal wire 217P.

The landing pad 234 may be formed of or include a metal-containing material. The landing pad 234 may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The landing pad 234 may be formed of a single layer film or a multi-layer film of a conductive material. According to the embodiment of the present invention, the landing pad 234 may be formed of or include a material containing tungsten (W). The landing pad 234 may be formed of or include tungsten (W) or a tungsten compound. The landing pad 234 may include the same material as the first and second metal wires 217N and 217P.

The cell capping layer 219C may fill the space between the upper plug 233 and the landing pad 234. The cell capping layer 219C may cover the sidewalls of the landing pad 234. The cell capping layer 219C may cover the upper portion of the bit liner spacer 229. The cell capping layer 219C may be planarized to expose the upper surface of the landing pad 234. The cell capping layer 219C may extend parallel to the landing pad 234. Therefore, the upper surface of the cell capping layer 219C may be positioned at the same level as the upper surface of the landing pad 234. The upper surface of the cell capping layer 219C may be positioned at the same level as the upper surface of the first capping layer 219N. The cell capping layer 219C may protect the bit line structure 228 and the storage node contact plug 235 from the subsequent processes. The cell capping layer 219C may be formed of or include a dielectric material. The cell capping layer 219C may be formed of or include silicon nitride.

An etch stop layer 236 may be formed over the landing pad 234, the cell capping layer 219C, the first and second metal wires 217N and 217P, and the first and second capping layers 219N and 219P. A memory element 237 electrically connected to the landing pad 234 may be formed over and be in direct contact with the landing pad 234. The memory element 237 may be realized in various forms. The memory element 237 may be a capacitor. For example, the memory element 237 may include a storage node in contact with the landing pad 234. The storage node may have a form of a cylinder or pillar. A capacitor dielectric layer may be formed on the surface of the storage node. The capacitor dielectric layer may include at least one selected among zirconium oxide, aluminum oxide, and hafnium oxide. For example, the capacitor dielectric layer may be a ZAZ structure in which a first zirconium oxide, aluminum oxide, and a second zirconium oxide are stacked. A plate node may be formed over and be in direct contact with the capacitor dielectric layer. The storage node and the plate node may be formed of or include a metal-containing material. The memory element 237 may include a variable resistor. The variable resistor may include a phase change material. According to another embodiment of the present invention, the variable resistor may include a transition metal oxide. According to yet another embodiment of the present invention, the variable resistor may be a magnetic tunnel junction (MTJ).

The semiconductor device 300 may include a CMOSFET, and a first transistor may include an NMOSFET, and a second transistor may include a PMOSFET. According to another embodiment of the present invention, the semiconductor device 300 may include different NMOSFETs, and the first transistor may include a first NMOSFET, and the second transistor may include a second NMOSFET. The first NMOSFET may be an NMOSFET having a thin first gate dielectric layer, and the second NMOSFET may be an NMOSFET having a second gate dielectric layer which is thicker than the first gate dielectric layer. According to another embodiment of the present invention, the semiconductor device 300 may include different PMOSFETs, and a first transistor may include a first PMOSFET, and a second transistor may include a second PMOSFET. The first PMOSFET may be a PMOSFET having a thin first gate dielectric layer, and the second PMOSFET may be a PMOSFET having a thick second gate dielectric layer.

The semiconductor device 300 may include a peripheral circuit of a memory cell, and the first transistor may be a transistor coupled to a bit line of the memory cell, and the second transistor may be a transistor coupled to a word line of the memory cell. The semiconductor device 300 may include a peripheral circuit of a DRAM, the first transistor in the first region T1 may be a sense amplifier SA, and the second transistor in the second region T2 may be, for example, a sub-word line driver SWD.

In the semiconductor device 300 in accordance with an embodiment of the present invention, since the thickness D1 of the first metal wire 217N is formed smaller than the thickness D3 of the second metal wire 217P, the capacitance between the neighboring first metal wires 217N may be reduced. For example, $C_{sa}$ may be reduced, and the sensing margin may be improved as the $C_{sa}$ is reduced. Also, since the thickness D1 of the first metal wire 217N is formed smaller than the thickness D3 of the second metal wire 217P in the semiconductor device 300, the resistance of the semiconductor device 300 in the second region T2 may be maintained low. As a result, the semiconductor device 300 may be able to obtain the effect of improving the sensing margin due to the reduction in the capacitance and the effect of reducing the resistance reduction for the regions other than the first transistor simultaneously.

Figure 6A:
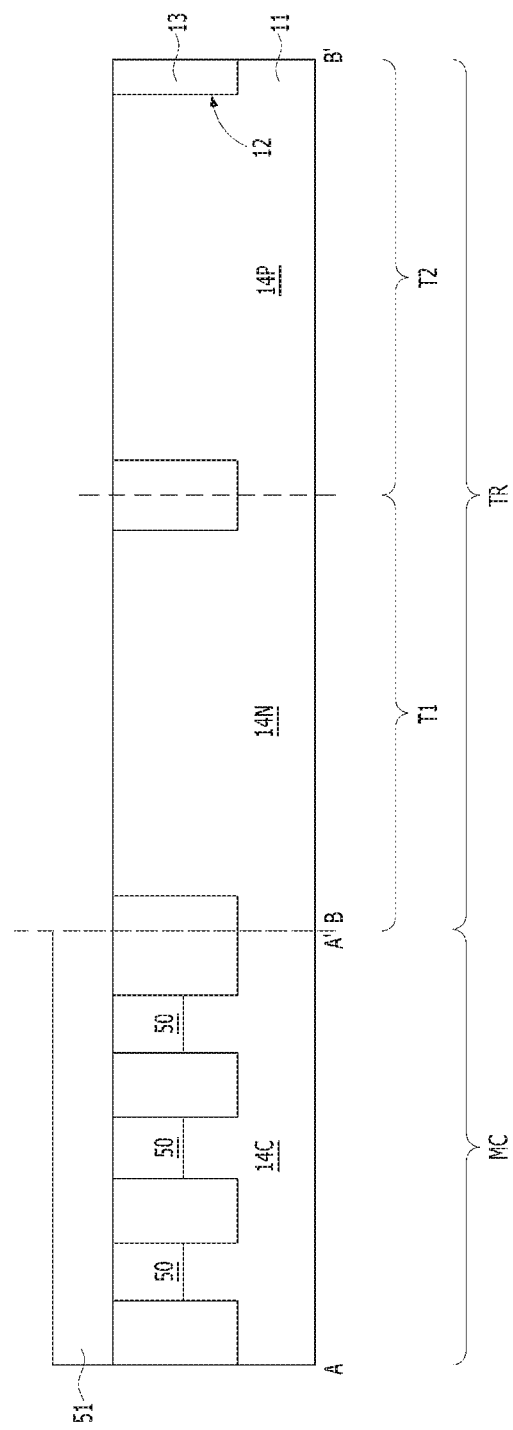
FIGS. 6A to 6N are cross-sectional views illustrating a method for fabricating a semiconductor device in accordance with an embodiment of the present invention.
Figure 6B:
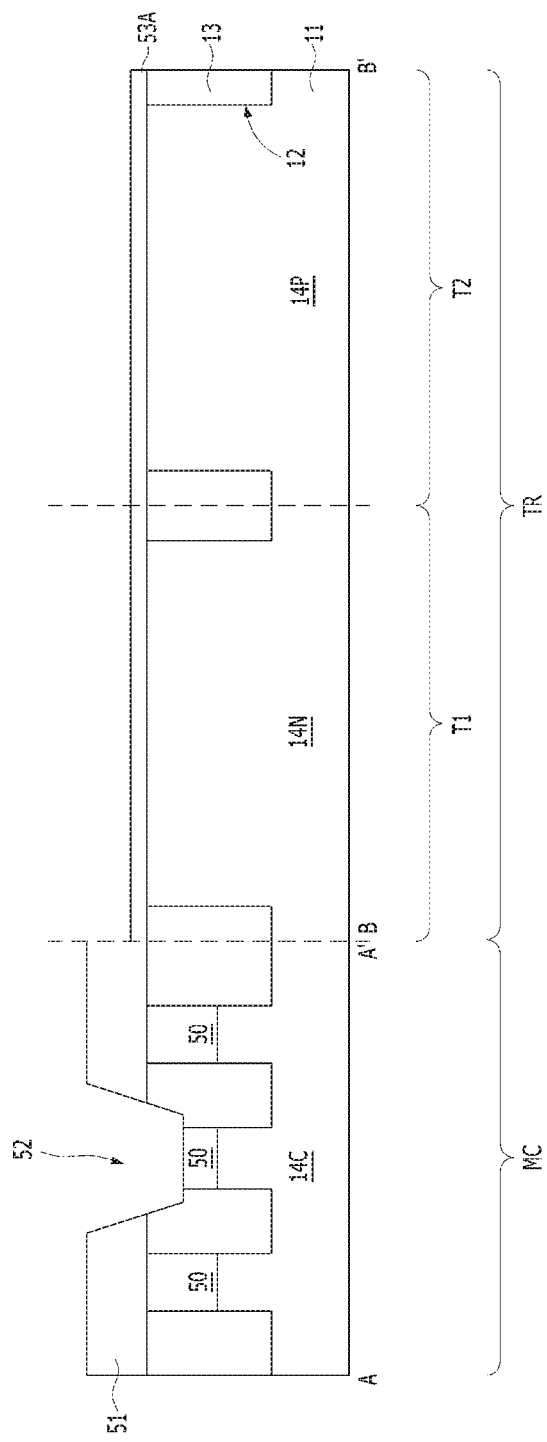
Figure 6C:
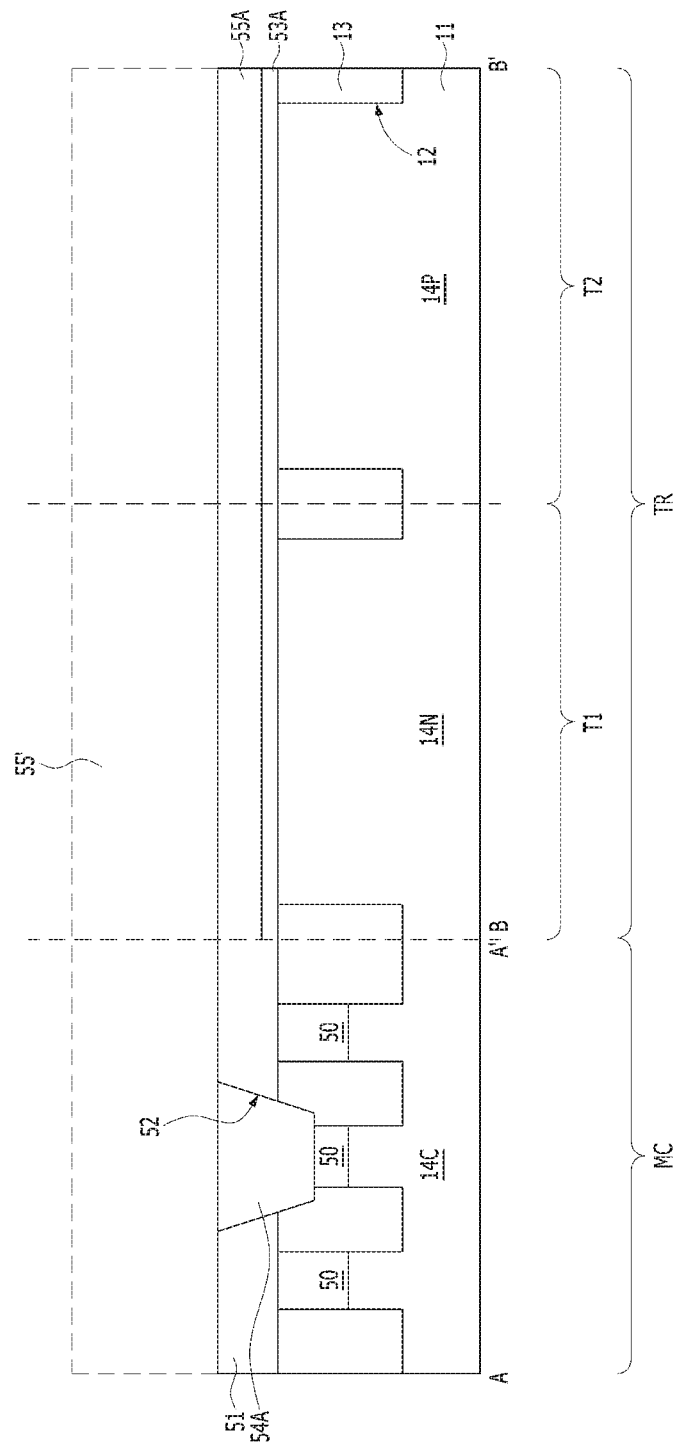
Figure 6D:
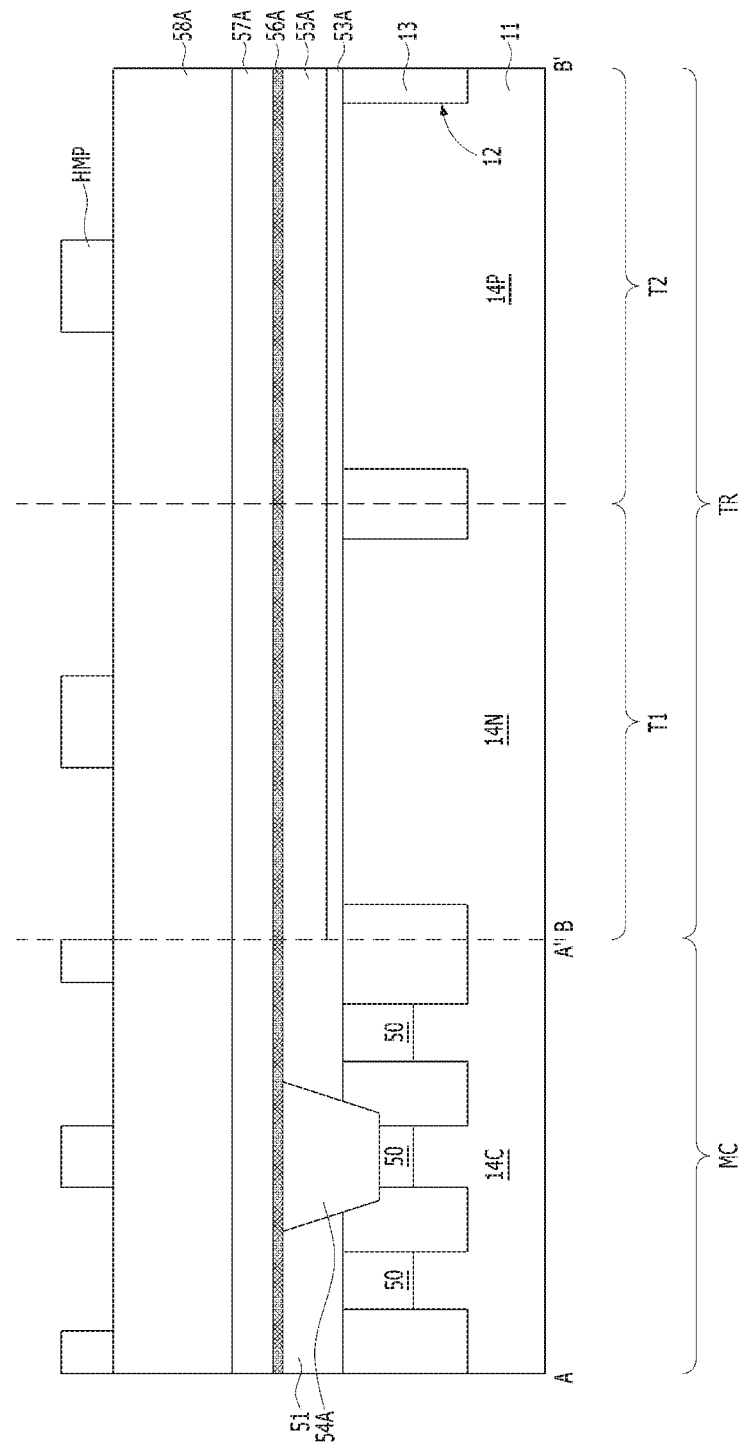
Figure 6E:
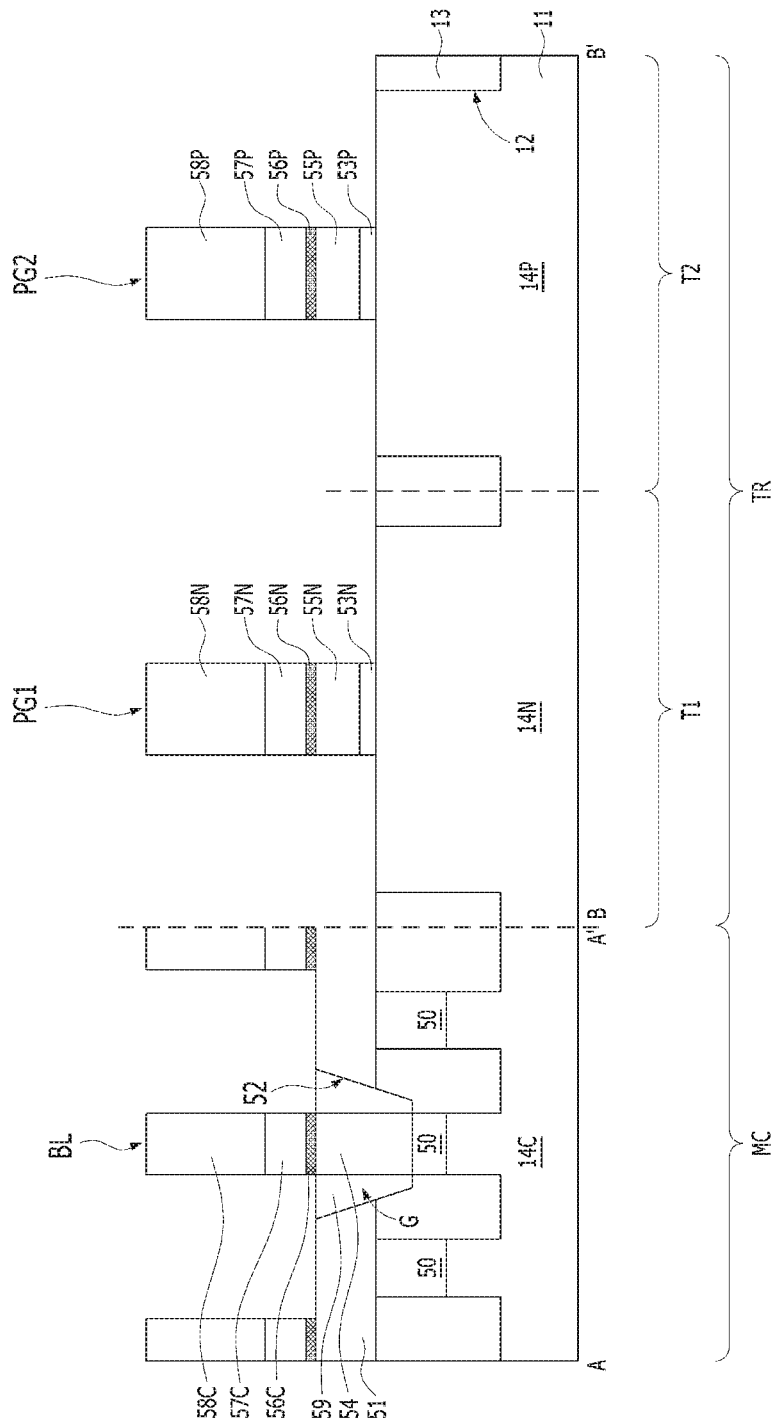
Figure 6F:
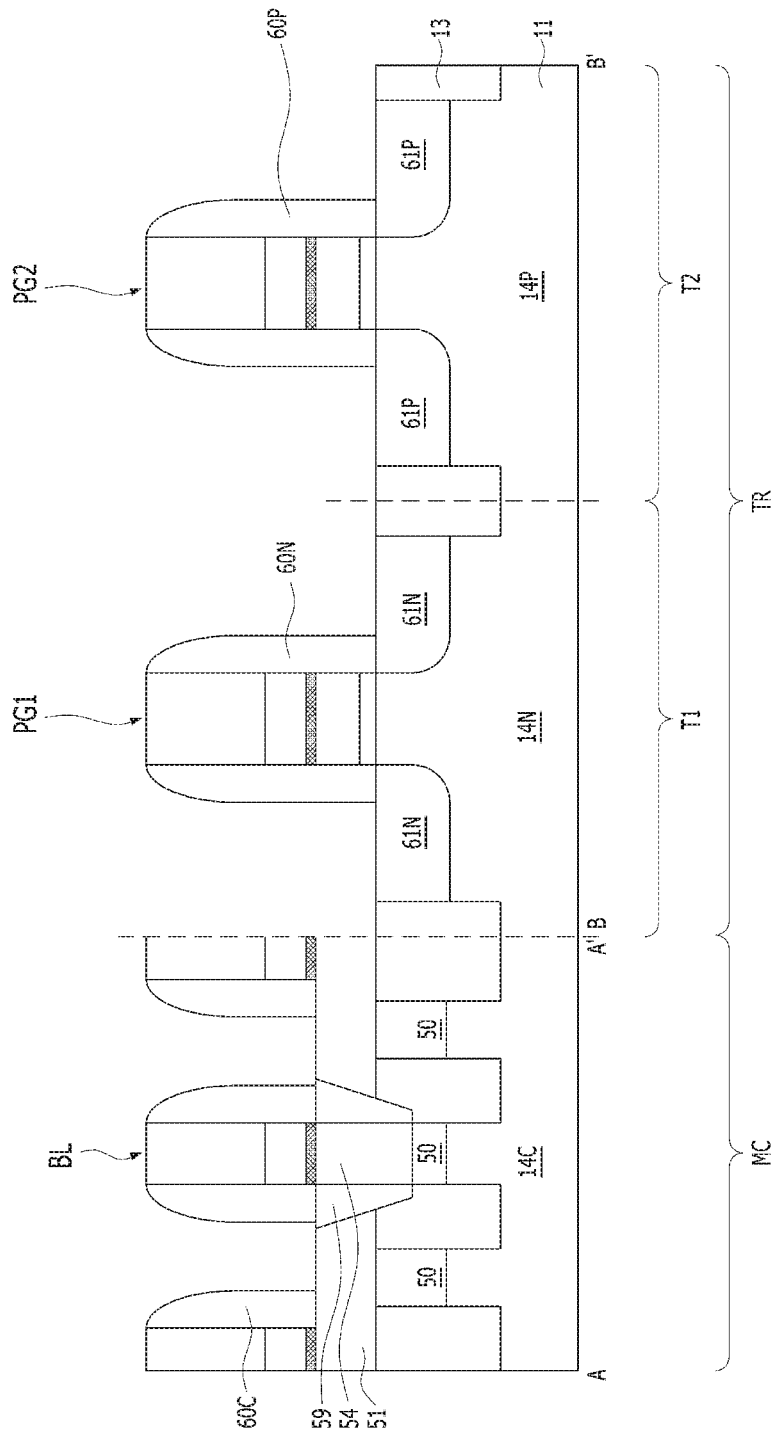
Figure 6G:
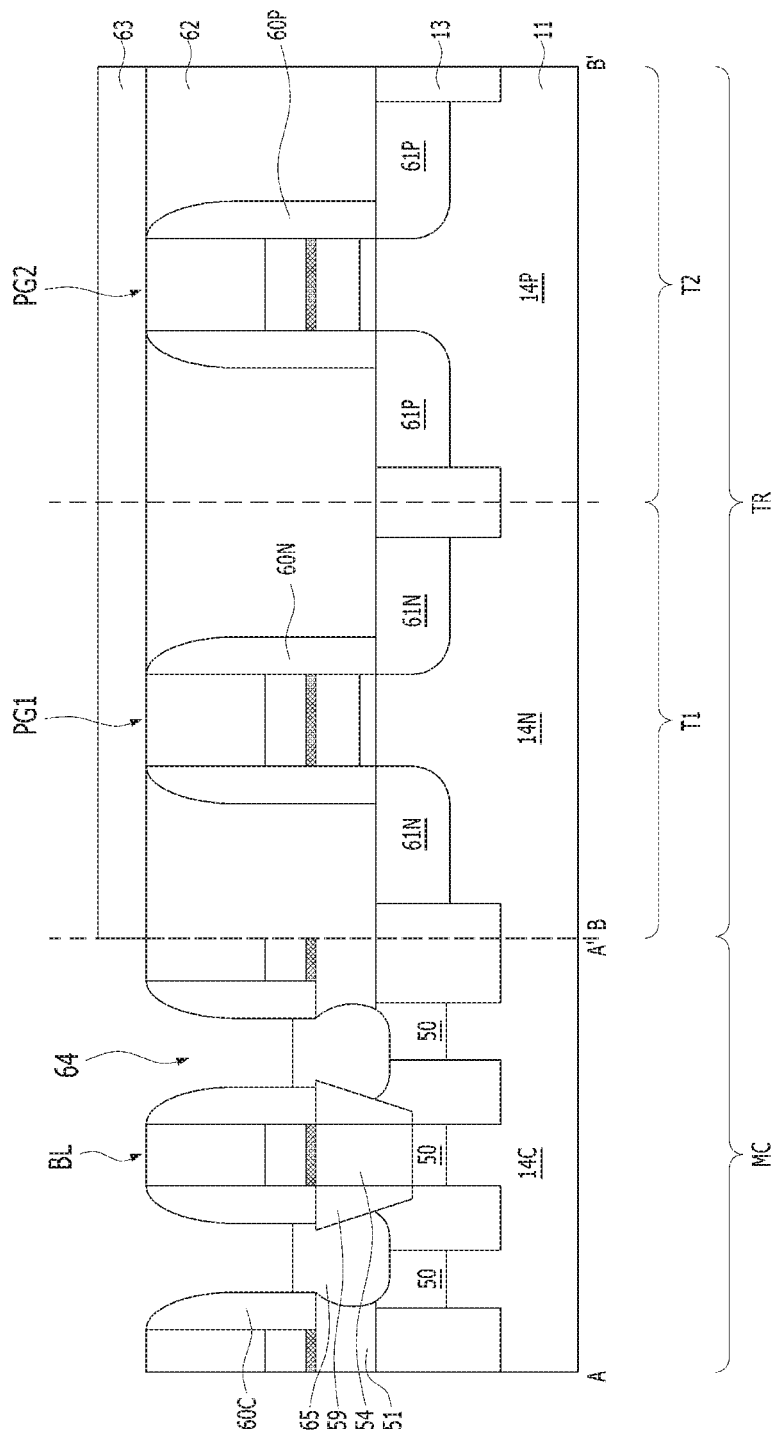
Figure 6H:
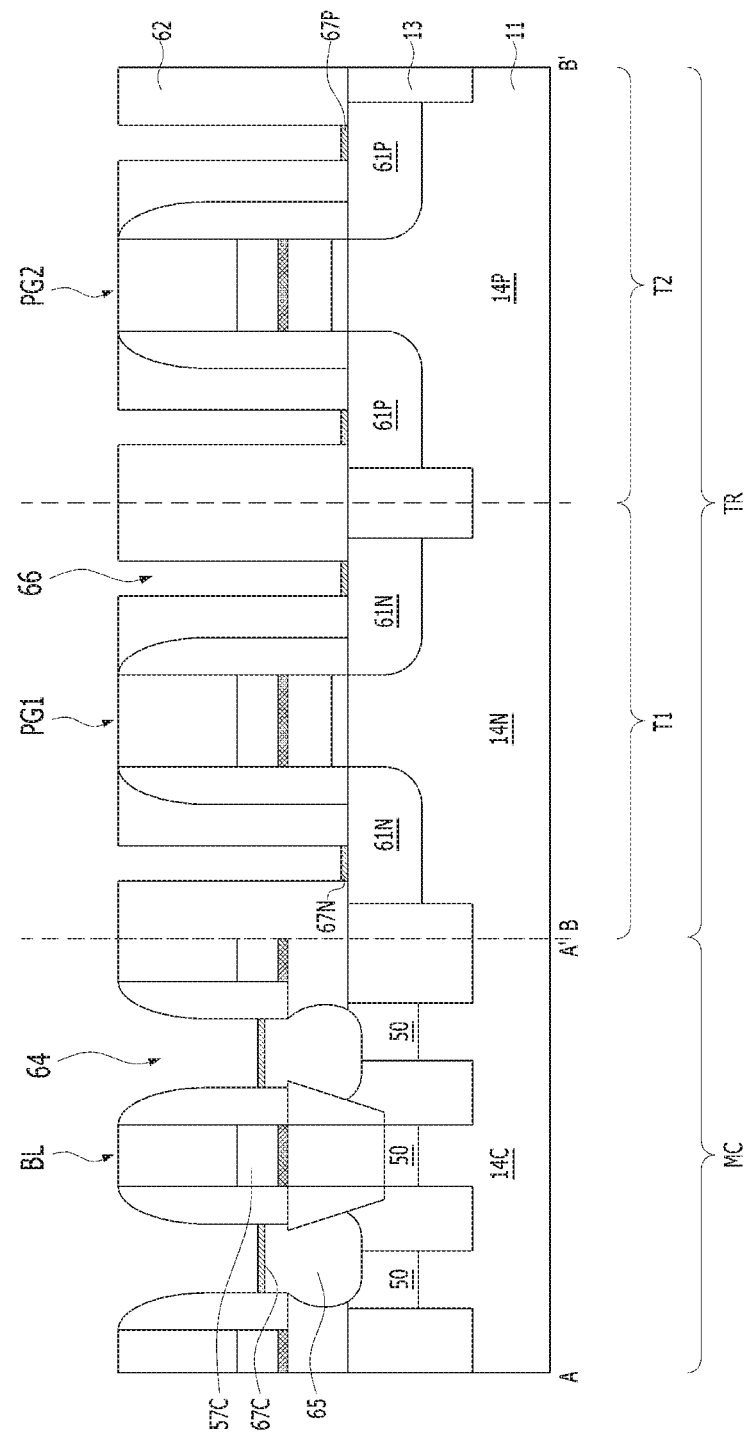
Figure 6I:
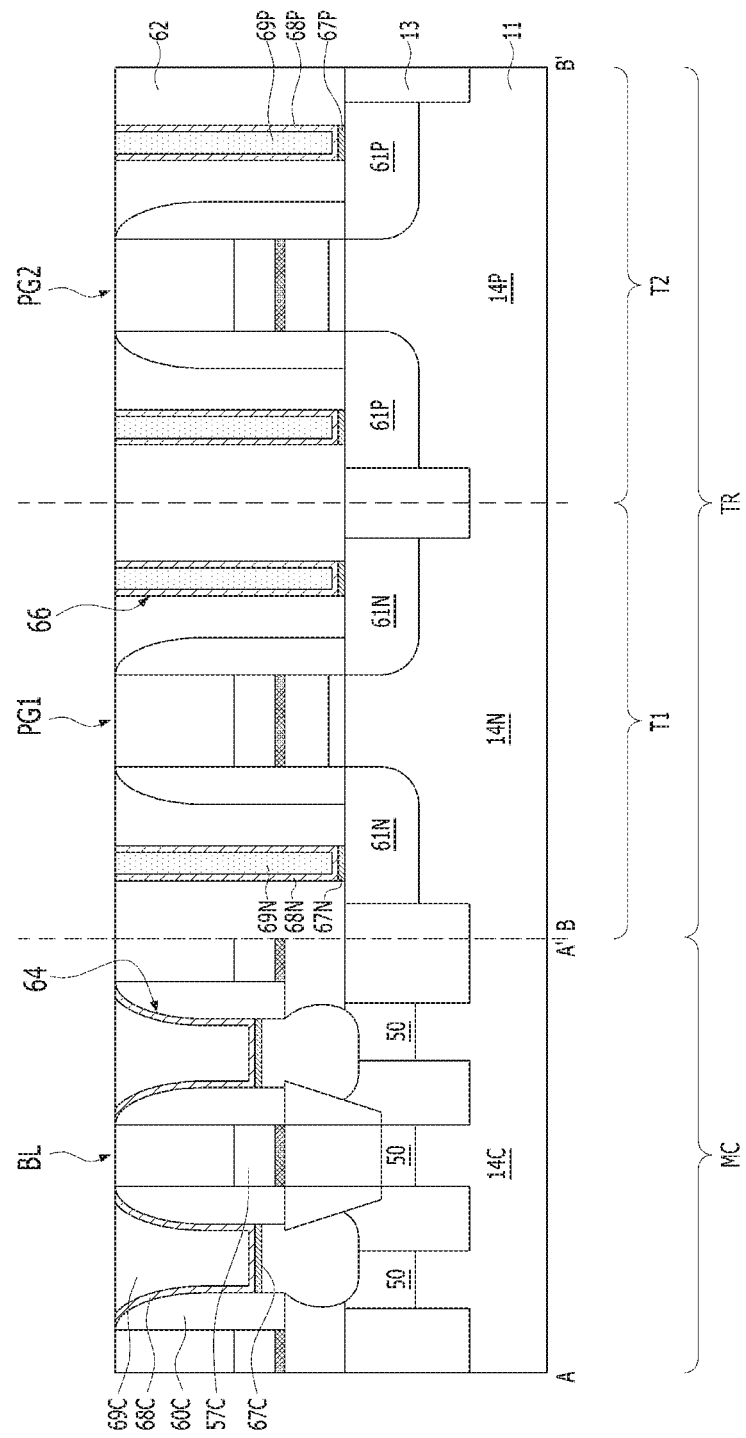
Figure 6J:
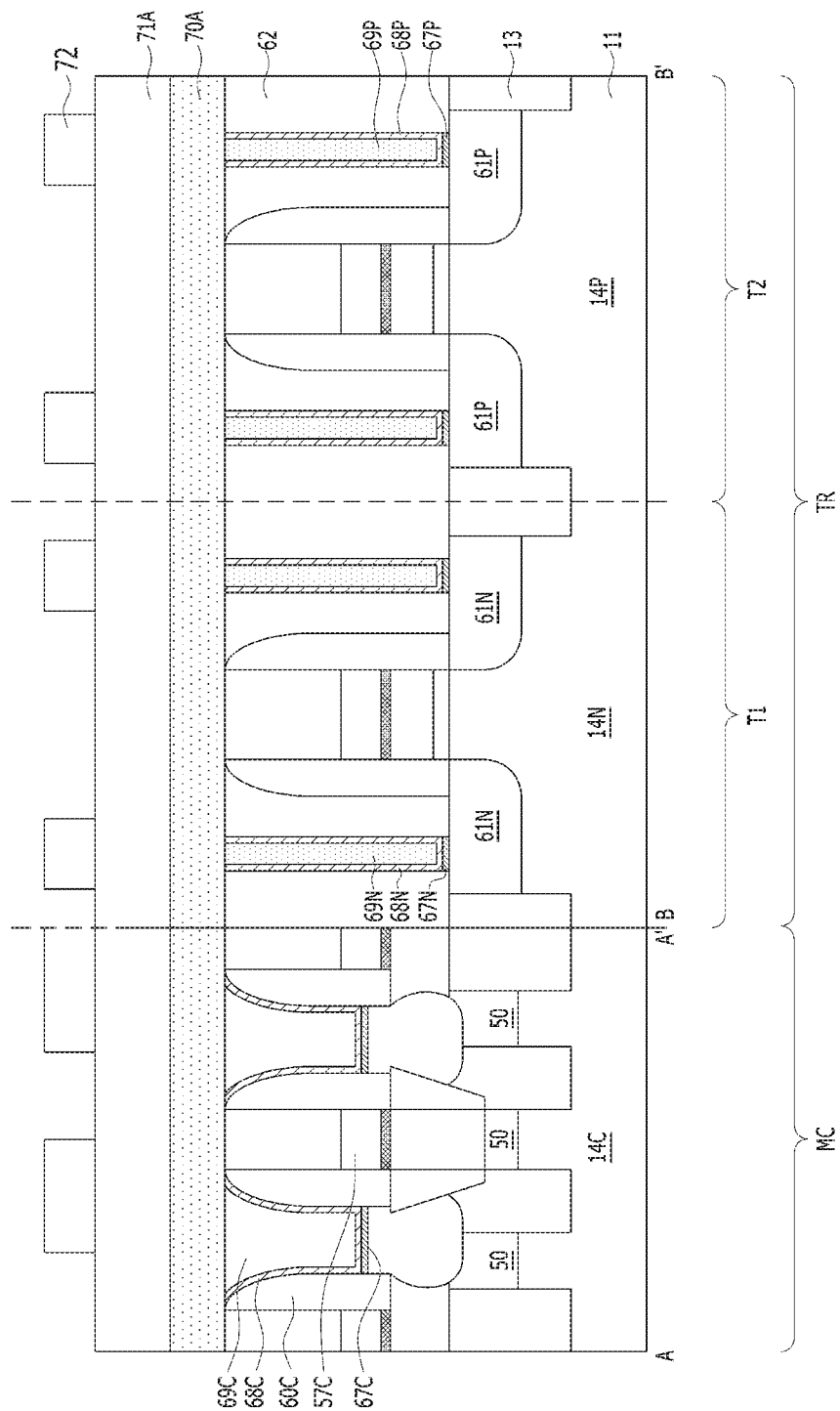
Figure 6K:
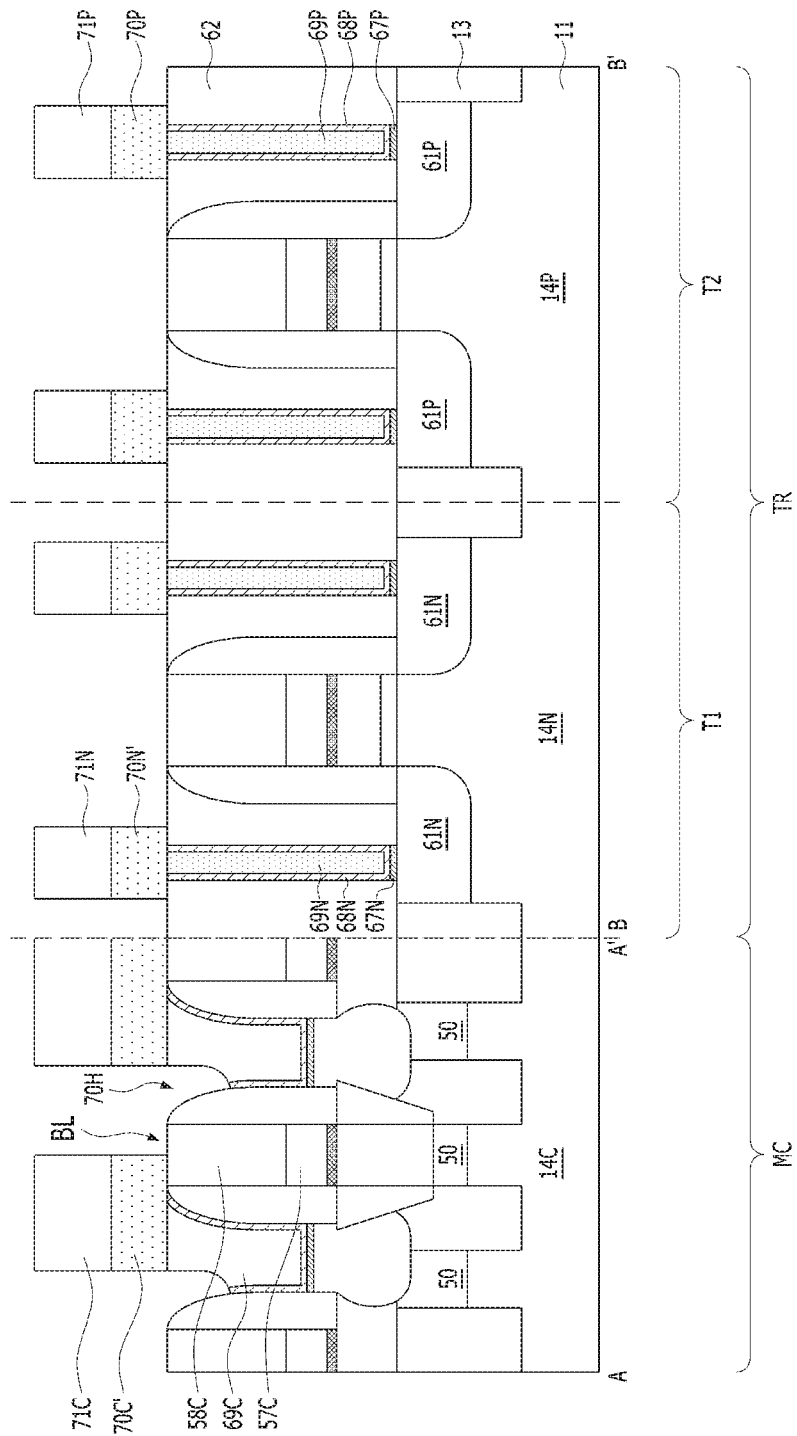
Figure 6L:
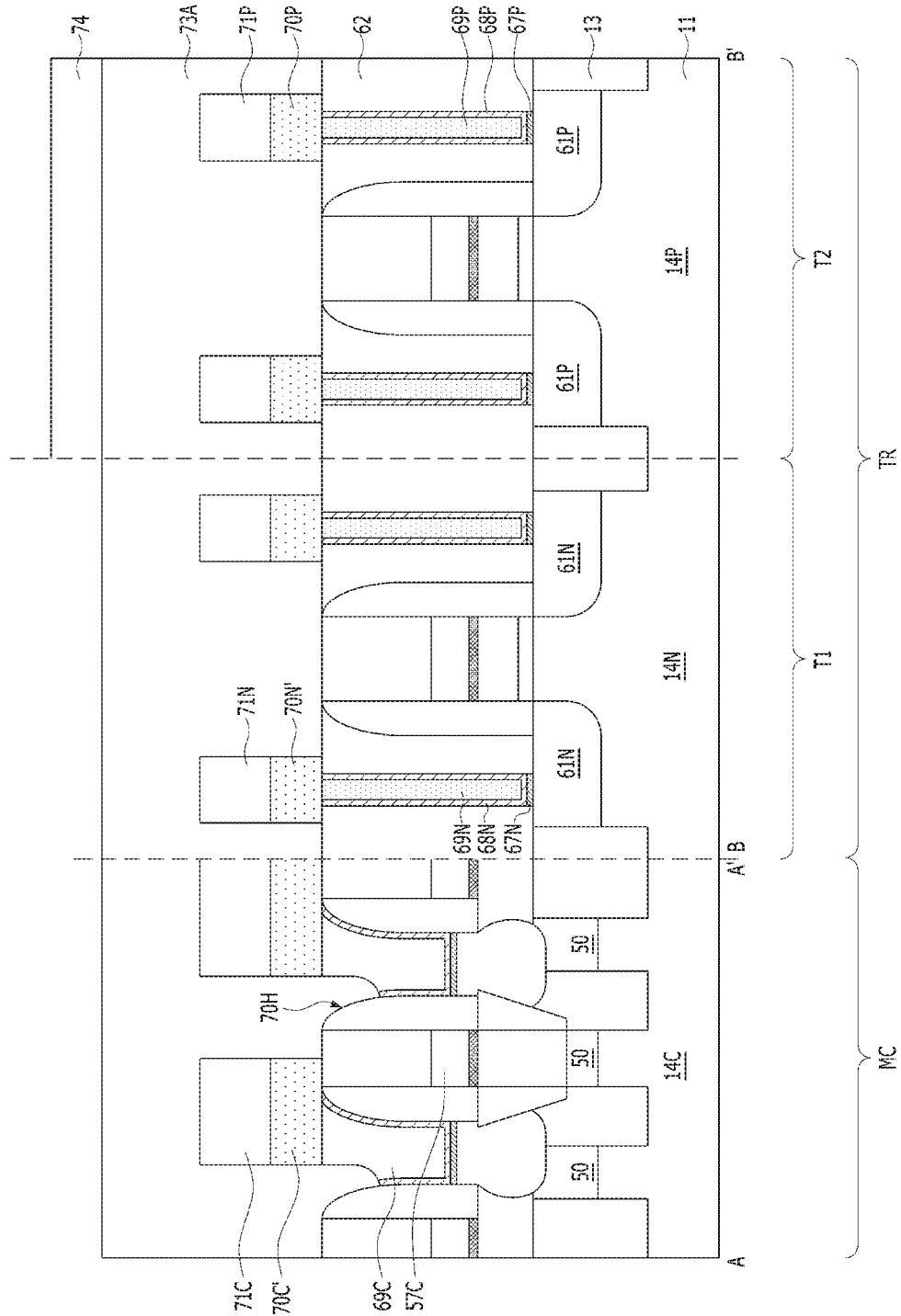
Figure 6M:
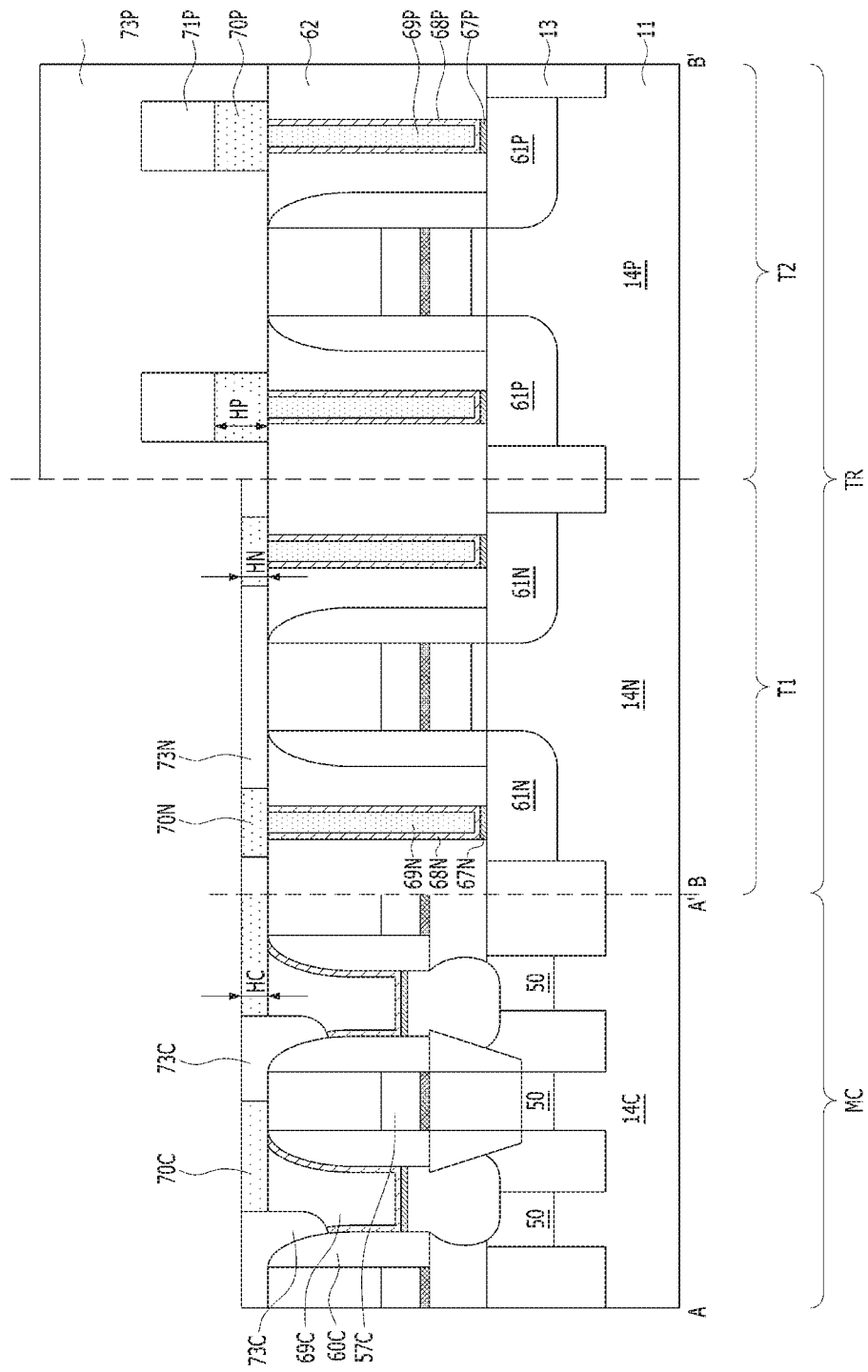
Figure 6N:
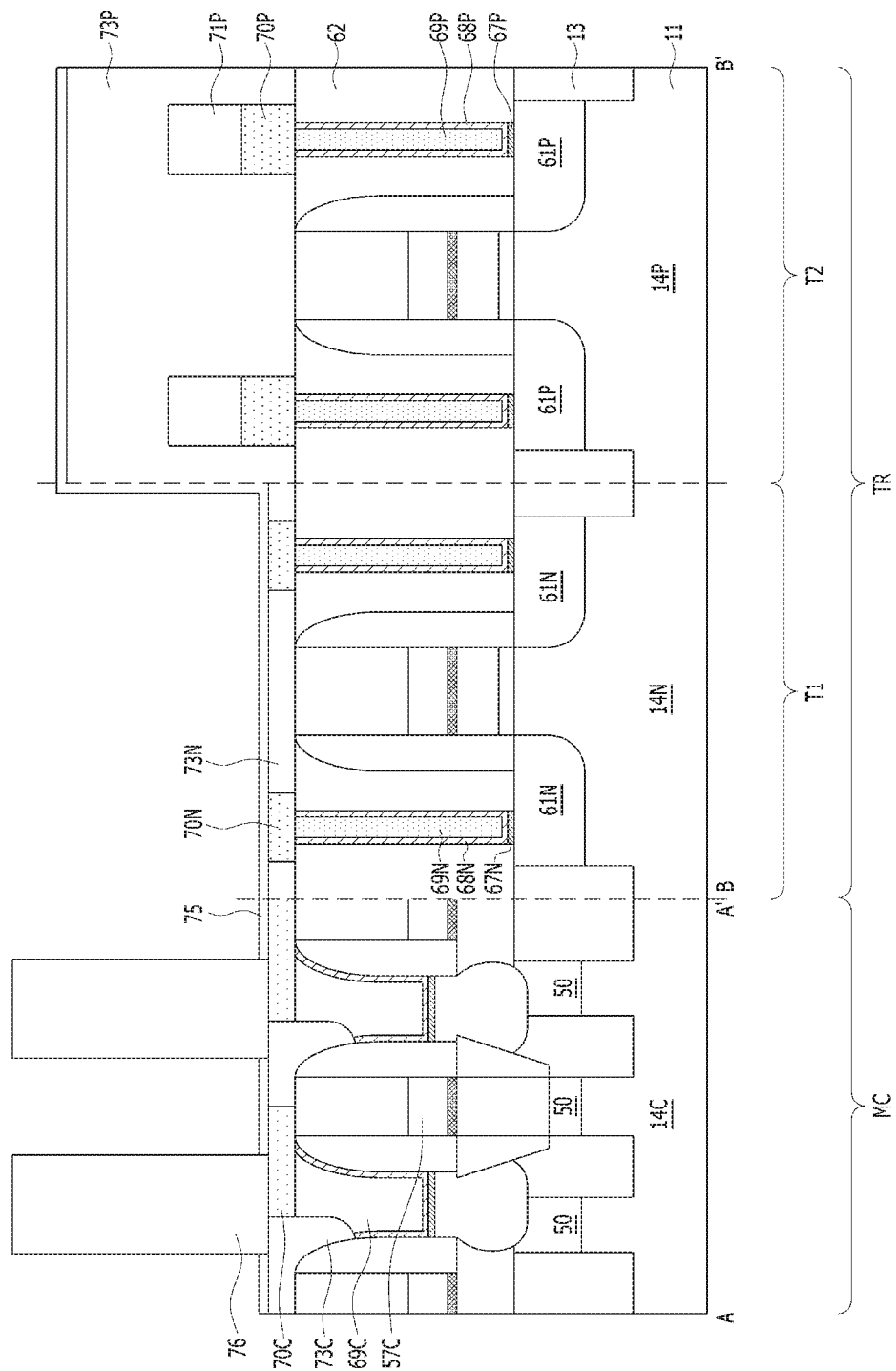

FIGS. 6A to 6N are cross-sectional views illustrating a method for fabricating a semiconductor device in accordance with an embodiment of the present invention.

Figure 7A:
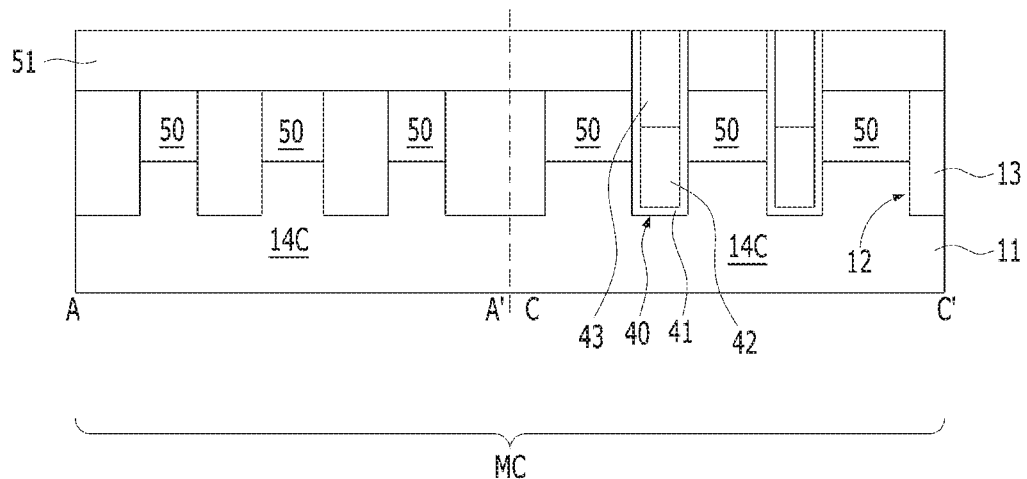
FIGS. 7A and 7B are cross-sectional views illustrating another method for fabricating a semiconductor device in accordance with an embodiment of the present invention.
Figure 7B:
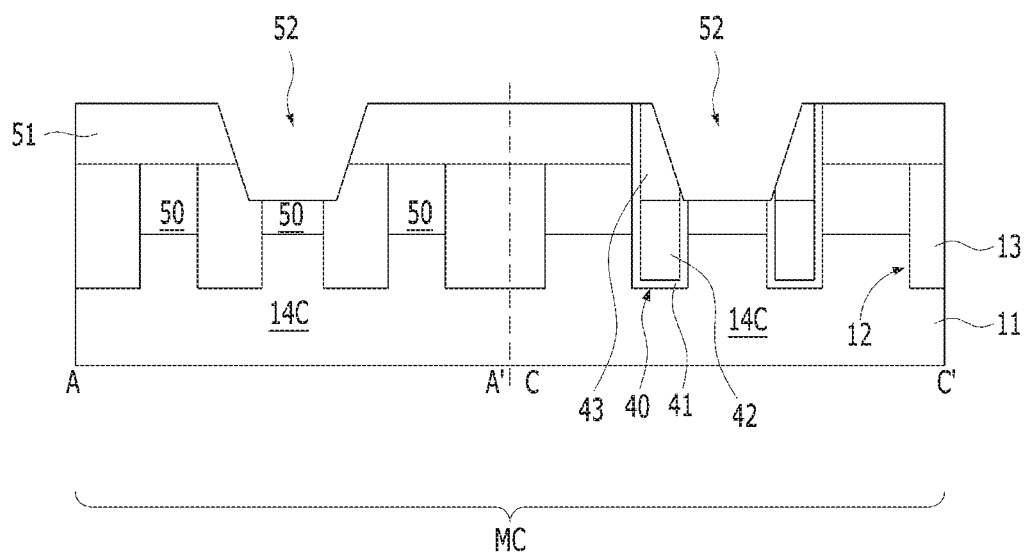

FIGS. 7A and 7B are cross-sectional views taken along a line C-C' shown in FIG. 4. They show another method for fabricating a semiconductor device in accordance with an embodiment of the present invention.

Referring to FIG. 6A, a substrate 11 is prepared. The substrate 11 may include a memory cell region MC and a peripheral circuit region TR. A plurality of memory cells may be formed in the memory cell region MC. A peripheral transistor may be formed in the peripheral circuit region TR. The peripheral circuit region TR may include a first region T1 and a second region T2. The first region T1 may be referred to as a first peripheral circuit region, and the second region T2 may be referred to as a second peripheral circuit region. The first region T1 may refer to a region where a transistor having at least one thin gate dielectric layer is to be formed. The second region T2 may refer to a region where a transistor having at least one thick gate dielectric layer is to be formed. The first region T1 may include a first transistor, and the second region T2 may include a second transistor. The first region T1 may be, for example, a sense amplifier SA, and the second region T2 may be, for example, a sub-word line driver SWD.

The substrate 11 may be any material suitable for semiconductor processing. The substrate 11 may include a semiconductor substrate. The substrate 11 may be formed, for example, of a silicon-containing material. The substrate 11 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 11 may also include other semiconductor materials such as germanium. The substrate 11 may include a group-IIIV semiconductor substrate, for example, a compound semiconductor substrate such as GaAs. The substrate 11 may include a Silicon-On-Insulator (SOI) substrate.

An isolation layer 13 may be formed in the substrate 11. The isolation layer 13 may be formed by a Shallow Trench Isolation (STI) process. The isolation layer 13 may be formed in a trench 12. A plurality of memory cell active regions 14C may be defined in the memory cell region MC by the isolation layer 13. The memory cell active regions 14C may include a shape isolated by the isolation layer 13. A first active region 14N may be defined in the first region T1 by the isolation layer 13. A second active region 14P may be defined in the second region T2 by the isolation layer 13. The isolation layer 13 may be formed of or include silicon nitride silicon oxide, or a combination thereof.

A cell source/drain region 50 may be formed in a memory cell active region 14C. A doping process may be performed to form the cell source/drain region 50. The doping process may include a process, such as implantation or plasma doping (PLAD). The cell source/drain regions 50 may be doped with an impurity of the same conductivity type. The cell source/drain region 50 may correspond to a source region and a drain region. The cell source/drain region 50 may have the same depth. The cell source/drain region 50 may be an area to which a bit line contact plug or a storage node contact plug 235 is to be coupled.

In the memory cell region MC, a cell region inter-layer dielectric layer 51 may be formed over and be in direct contact with the substrate 11. The cell region inter-layer dielectric layer 51 may be formed of or include silicon oxide, silicon nitride, a low-k material, or a combination thereof.

FIG. 7A is a cross-sectional view taken along a line C-C' shown in FIG. 3.

Referring to FIG. 7A, a buried word line structure may be formed in the substrate 11. The buried word line structure may include a gate trench 40, a gate dielectric layer 41 covering the bottom surface and sidewalls of the gate trench 40, a buried word line 42 partially filling a gate trench 40 over the gate dielectric layer 41, a gate capping layer 43 formed over the buried word line 42.

A method for forming the buried word line structure is as follows.

First, the gate trench 40 may be formed in the substrate 11. The gate trench 40 may have a line shape traversing the memory cell active region 14C and the isolation layer 13. The gate trench 40 may be formed by forming a mask pattern (not shown) over the substrate 11 and performing an etching process by using the mask pattern as an etch mask. To form the gate trench 40, an inter-layer dielectric layer 51 may be used as an etch barrier. The cell region inter-layer dielectric layer 51 may have a shape that is patterned by the mask pattern. The cell region inter-layer dielectric layer 51 may be formed of or include silicon oxide. The cell region inter-layer dielectric layer 51 may include TEAS. The bottom surface of the gate trench 40 may be positioned at a higher level than the bottom surface of the isolation layer 13. The depth of the gate trench 40 may have a sufficient depth to increase the average cross-sectional area of the subsequent buried word line. For example, the resistance of the buried word line may be reduced. Although not illustrated, a portion of the isolation layer 13 may be recessed to protrude the upper portion of the memory cell active region 14C below the gate trench 40. For example, the isolation layer 13 below the gate trench 40 may be selectively accessed. As a result, a fin region (not shown) may be formed below the gate trench 40. The fin region may be part of a channel region.

Next, the gate dielectric layer 41 may be formed on the bottom surface and sidewalls of the gate trench 40. Before the gate dielectric layer 41 is formed, etching damage on the surface of the gate trench 40 may be cured. For example, after a sacrificial oxide is formed by a thermal oxidation treatment, the sacrificial oxide may be removed. The gate dielectric layer 41 may be formed by a thermal oxidation process. For example, the gate dielectric layer 41 may be formed by oxidizing the bottom surface and sidewalls of the gate trench 40. According to another embodiment of the present invention, the gate dielectric layer 41 may be formed by a deposition method, such as Chemical Vapor Deposition (CVD) or Atomic Layer Deposition (ALD).

The gate dielectric layer 41 may be formed of or include a high-k material, an oxide, a nitride, an oxynitride, or a combination thereof. The high-k material may include a hafnium-containing material. The hafnium-containing material may be or include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, and a combination thereof. As for the high-k material, other known high-k materials may also be selectively used. According to another embodiment of the present invention, the gate dielectric layer 41 may be formed by depositing a liner polysilicon layer, followed by radical oxidation of the liner polysilicon layer. According to yet another embodiment of the present invention, the gate dielectric layer 41 may be formed by forming a liner silicon nitride layer and then radically oxidizing the liner silicon nitride layer.

Next, the buried word line 42 may be formed over and be in direct contact with the gate dielectric layer 41. The buried word line 42 may be formed by forming a conductive layer (not shown) to fill the gate trench 40 and then performing a recessing process. The recessing process may be performed by performing an etch-back process, or by sequentially performing a Chemical Mechanical Polishing (CMP) process and an etch-back process. The buried word line 42 may have a recessed shape partially filling the gate trench 40. The upper surface of the buried word line 42 may be positioned at a lower level than the upper surface of the memory cell active region 14C.

The buried word line 42 may be formed of or include a metal, a metal nitride, or a combination thereof. For example, the buried word line 42 may be formed of titanium nitride (TiN), tungsten (W), or titanium nitride/tungsten (TiN/W). The titanium nitride/tungsten (TiN/W) may be a structure that partially fills the gate trench 40 using tungsten after conformally forming titanium nitride. Titanium nitride may be used alone as the buried word line 42, and it may be referred to as a buried word line 42 having a 'TiN Only' structure.

Next, the gate capping layer 43 may be formed over and be in direct contact with the buried word line 42. The remaining portion of the gate trench 40 over the buried word line 42 may be filled with the gate capping layer 43. The upper surface of the gate capping layer 43 may be positioned at the same level as the upper surface of the cell region inter-layer dielectric layer 51. To this end, a CMP process may be performed when the gate capping layer 43 is formed. The gate capping layer 43 may be formed of or include a dielectric material. The gate capping layer 43 may be formed of or include silicon nitride. According to another embodiment of the present invention, the gate capping layer 43 may be formed of or include silicon oxide. According to yet another embodiment of the present invention, the gate capping layer 43 may have a NON (Nitride-Oxide-Nitride) structure.

After the gate capping layer 43 is formed, a cell source/drain region 50 may be formed in the memory cell active region 14C. A doping process may be performed to form the cell source/drain region 50. The doping process may include processes, such as implantation or plasma doping (PLAD). The cell source/drain region 50 may be doped with an impurity of the same conductivity type. The cell source/drain region 50 may correspond to a source region and a drain region. The cell source/drain regions 50 may have the same depth. The cell source/drain area 50 may be an area to which a bit line contact plug or a storage node contact plug 235 is to be coupled.

A cell transistor may be formed in the memory cell region MC by the buried word line 42 and the cell source/drain region 50.

Referring to FIGS. 6B and 7B, a bit line opening 52 may be formed in the cell region inter-layer dielectric layer 51. The bit line opening 52 may be formed by using a bit line opening mask (not shown) as an etch mask and etching the cell region inter-layer dielectric layer 51. The bit line opening mask may include a photoresist pattern. The bit line opening mask may cover the peripheral circuit region TR. Therefore, the peripheral circuit region TR may be protected during the etching process of the bit line opening 52. From the perspective of a top view, the bit line opening 52 may be circular or oval. A portion of the substrate 11 may be exposed by the bit line opening 52. The diameter of the bit line opening 52 may be wider than the diameter of the cell source/drain region 50. Therefore, a portion of the isolation layer 13 around the cell source/drain region 50 may be exposed by the bit line opening 52. The lower surface of the bit line opening 52 may be positioned at a lower level than the upper surface of the substrate 11.

A gate dielectric layer 53A may be formed over and be in direct contact with the substrate 11 of the peripheral circuit region TR. The height of the gate dielectric layer 53A may be lower than the height of the inter-layer dielectric layer 51. While the gate dielectric layer 53A is formed, the gate dielectric layer 53A may be formed only in the peripheral circuit region TR because the memory cell region MC is covered with a mask pattern (not shown). The gate dielectric layer 53A may be formed of or include a high-k material, an oxide, a nitride, an oxynitride, or a combination thereof. For example, the high-k material may be or include hafnium oxide (HfO$_2$), hafnium silicate (HfSiO), hafnium silicate nitride (HfSiON), or a combination thereof. The gate dielectric layer 53A may further include an interface layer (not shown). The interface layer may be formed of or include silicon oxide, silicon nitride, or a combination thereof. The gate dielectric layer 53A may be formed by stacking the interface layer and a high-k material.

FIG. 7G is a cross-sectional view taken along a line C-C' in FIG. 4.

Referring to FIG. 7B, the cell source/drain region 50, the isolation layer 13, and a part of the gate capping layer 43 may be etched in the etching process for forming the bit line opening 52. The gate capping layer 43, the cell source/drain region 50 and the isolation layer 13 below the bit line opening 52 may be recessed to a predetermined depth. For example, the bottom of the bit line opening 52 may extend into the substrate 11. As the bit line opening 52 extends, the surface of a portion of the cell source/drain region 50 may be recessed, and the surface of the portion of the cell source/drain region 50 may be lower than the upper surface of the active region 14C. The bit line opening 52 may be referred to as a 'bit line contact hole'. The bit line opening 52 may correspond to the bit line contact hole 221 of FIG. 5A.

Referring to FIG. 6C, in the memory cell region MC, a preliminary plug 54A may be formed in the bit line opening 52. The preliminary plug 54A may fill the bit line opening 52. The upper surface of the preliminary plug 54A may be positioned at the same level as the upper surface of the inter-layer dielectric layer 51. In the peripheral circuit region TR, a lower gate electrode layer 55A may be formed over and be in direct contact with the gate dielectric layer 53A.

The preliminary plug 54A and the lower gate electrode layer 55A may be formed at the same time. A conductive layer 55' covering the cell region inter-layer dielectric layer 51, the bit line opening 52, and the gate dielectric layer 53A may be employed for forming the preliminary plug 54A and the lower gate electrode layer 55A. Subsequently, a process of planarizing the conductive layer 55' to expose the upper surface of the preliminary plug 54A may be performed. Therefore, the upper surface of the preliminary plug 54A may be exposed. The upper surface of the preliminary plug 54A may be positioned at the same level as the upper surface of the inter-layer dielectric layer 51. The upper surface of the preliminary plug 54A may be positioned at the same level as the upper surface of the lower gate electrode layer 55A. According to another embodiment of the present invention, the preliminary plug 54A and the lower gate electrode layer 55A may be formed by Selective Epitaxial Growth (SEG). For example, the preliminary plug 54A may include SEG Silicon Phosphorus (SiP). In this way, the preliminary plug 54A may be formed without voids by the selective epitaxial growth.

The preliminary plug 54A and the lower gate electrode layer 55A may include the same material. The preliminary plug 54A and the lower gate electrode layer 55A may be formed of or include a semiconductor material. The preliminary plug 54A and the lower gate electrode layer 55A may include a silicon-containing material. The preliminary plug 54A and the lower gate electrode layer 55A may be formed or include polysilicon. Polysilicon may be doped with an impurity.

Referring to FIG. 6D, a barrier metal layer 56A may be formed over and be in direct contact with the cell region inter-layer dielectric layer 51, the preliminary plug 54A, and the lower gate electrode layer 55A. The height of the barrier metal layer 56A may be lower than the height of the lower gate electrode layer 55A. The height of the barrier metal layer 56A may be lower than the height of the gate dielectric layer 53A. The barrier metal layer 56A may be formed of or include titanium nitride (TiN), tantalum nitride (TaN), tungsten nitride (WN), or a combination thereof. According to the embodiment of the present invention, the barrier metal layer 56A may be formed of or include a material containing titanium nitride (TiN).

A metal layer 57A may be formed over and be in direct contact with the barrier metal layer 56A. The metal layer 57A may be formed of a material having a lower specific resistance than the preliminary plug 54A and the lower gate electrode layer 55A. The metal layer 57A may be formed of or include a metal material having a lower specific resistance than the preliminary plug 54A and the lower gate electrode layer 55A. For example, the metal layer 57A may be formed of or include a metal, a metal nitride, a metal silicide, or a combination thereof. According to the embodiment of the present invention, the metal layer 57A may be formed of or include tungsten (W) or a tungsten compound.

A hard mask layer 58A may be formed on the metal layer 57A. The hard mask layer 58A may be formed of a dielectric material. The hard mask layer 58A may be formed of a material having an etch selectivity with respect to the metal layer 57A. The hard mask layer 58A may be formed of or include silicon oxide, silicon nitride, silicon oxynitride, or a combination thereof. According to the embodiment of the present invention, the hard mask layer 58A may be formed of silicon nitride.

A hard mask pattern HMP may be formed over and be in direct contact with the hard mask layer 58A. The hard mask pattern HMP may include a photoresist pattern. The hard mask pattern HMP may include a line shape extending in one direction. The line width of the hard mask pattern HMP of the memory cell region MC may be smaller than the diameter of the bit line opening 52. The line width of the hard mask pattern HMP of the memory cell region MC may be smaller than the line width of the hard mask pattern HMP of the peripheral circuit region TR.

Referring to FIG. 6E, a bit line structure BL, a first gate structure PG1, and a second gate structure PG2 may be formed. The bit line structure BL may be formed in the memory cell region MC, and the first gate structure PG1 and the second gate structure PG2 may be formed in the peripheral circuit region TR. The bit line structure BL, the first gate structure PG1, and the second gate structure PG2 may be simultaneously formed. The bit line structure BL may include a bit line contact plug 54, a cell barrier layer 56C, a bit line 57C, and a bit line hard mask 58C. The first gate structure PG1 may include a first gate dielectric layer 53N, a first lower gate electrode 55N, a first barrier layer 56N, a first upper gate electrode 57N, and a first gate hard mask 58N. The second gate structure PG2 may include a second gate dielectric layer 53P, a second lower gate electrode 55P, a second barrier layer 56P, a second upper gate electrode 57P, and a second gate hard mask 58P.

The method of forming the bit line structure BL will be described.

The hard mask layer 58A may be etched by using the hard mask pattern HMP as an etch mask. As a result, a bit line hard mask 58C may be formed. The metal layer 57A, the barrier metal layer 56A, and the preliminary plug 54A may be etched by using the bit line hard mask 58C as an etch mask. As a result, the bit line 57C, the cell barrier layer 56C, and the bit line contact plug 54 may be formed. The line widths of the bit line contact plug 54, the cell barrier layer 56C, the bit line 57C, and the bit line hard mask 58C may be the same.

The bit line contact plug 54 may be formed over and be in direct contact with the cell source/drain region 50. The bit line contact plug 54 may couple the cell source/drain region 50 and the bit line 53 with each other. The line width of the bit line contact plug 54 may be smaller than the diameter of the bit line opening 52. Therefore, a gap G may be formed in both sidewalls of the bit line contact plug 54. The gap G may be formed independently on both sidewalls of the bit line contact plug 54. For example, one bit line contact plug 54 and a pair of gaps G may be positioned in the bit line opening 52, and the pair of gaps G may be isolated by the bit line contact plug 54.

The bit line 57C may extend in one direction while covering the bit line contact plug 54. The bit line 57C may extend in a line shape.

A method for forming the first gate structure PG1 will be described.

The hard mask layer 58A may be etched by using the hard mask pattern HMP as an etch mask. As a result, the first gate hard mask 58N may be formed. The metal layer 57A, the barrier metal layer 56A, and the preliminary plug 54A may be etched by using the first gate hard mask 58N as an etch mask. As a result, a first gate dielectric layer 53N, a first lower gate electrode 55N, a first barrier layer 56N, and a first upper gate electrode 57N may be formed. The line widths of the first gate dielectric layer 53N, the first lower gate electrode 55N, the first barrier layer 56N, and the first upper gate electrode 57N may be the same.

A method for forming the second gate structure PG2 will be described.

The hard mask layer 58A may be etched by using the hard mask pattern HMP as an etch mask. As a result, the second gate hard mask 58P may be formed. The metal layer 57A, the barrier metal layer 56A, and the preliminary plug 54A may be etched by using the second gate hard mask 58P as an etch mask. As a result, a second gate dielectric layer 53P, a second lower gate electrode 55P, a second barrier layer 56P, and a second upper gate electrode 57P may be formed. The line widths of the second gate dielectric layer 53P, the second lower gate electrode 55P, the second barrier layer 56P, and the second upper gate electrode 57P may be the same.

The bit line structure BL, the first gate structure PG1, and the second gate structure PG2 may be simultaneously formed. The bit line structure BL, the first gate structure PG1, and the second gate structure PG2 may be simultaneously formed by one etching process. Therefore, the etching process may be simplified. After the bit line structure BL, the first gate structure PG1, and the second gate structure PG2 are formed, the hard mask pattern HMP may be removed.

Subsequently, a dielectric plug 59 may be formed on both sidewalls of the bit line contact plug 54. The dielectric plug 59 may be positioned in the bit line opening 52. The dielectric plug 59 may have a pillar shape filling the gap G. The dielectric plug 59 may prevent the gap G from being filled with any material in the subsequent process. The dielectric plug 59 may be formed on both sides of the bit line contact plug 54 independently. The bit line contact plug 54 and the dielectric plug 59 may be positioned in the bit line opening 52, and the dielectric plug 59 may be isolated by the bit line contact plug 54. The dielectric plug 59 may be line-shaped. The upper surface of the dielectric plug 59 may be positioned at the same level as the upper surface of the bit line contact plug 54.

The dielectric plug 59 may be formed of or include a dielectric material. The dielectric plug 59 may be formed of or include an oxide or a nitride. The dielectric plug 59 may be formed of or include silicon oxide, silicon nitride, or a metal oxide. The dielectric plug 59 may be formed of or include $SiO_2$, $Si_3N_4$ or SiN.

Referring to FIG. 6F, a bit liner spacer 60C may be formed on both sidewalls of the bit line structure BL. The bit liner spacer 60C may be formed of a dielectric material. The bit liner spacer 60C may be formed or include a low-k material. The bit liner spacer 60C may be formed of or include an oxide or a nitride. The bit liner spacer 60C may be formed of or include silicon oxide, silicon nitride, or a metal oxide. The bit liner spacer 60C may be formed of or include $SiO_2$, $Si_3N_4$, or SiN. The bit liner spacer 60C may be or include a multi-layer spacer. The bit liner spacer 60C may be or include an air gap (not shown). Therefore, a pair of line-type air gaps may be formed on both sidewalls of the bit liner spacer 60C. The pair of line-type air gaps may be symmetrical. According to some embodiments of the present invention, the multi-layer spacer may include a first spacer, a second spacer, and a third spacer. The third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

A first gate spacer 60N may be formed on both sidewalls of the first gate structure PG1. The first gate spacer 60N may be formed of a dielectric material. The first gate spacer 60N may be formed of or include a low-k material. The first gate spacer 60N may be formed of or include an oxide or a nitride. The first gate spacer 60N may be formed of or include silicon oxide, silicon nitride, or a metal oxide. The first gate spacer 60N may be formed of or include $SiO_2$, $Si_3N_4$, or SiN. The first gate spacer 60N may be or include a multi-layer spacer. The first gate spacer 60N may be or include an air gap. As a result, a pair of line-type air gaps may be formed on both sidewalls of the first gate spacer 60N. The pair of line-type air gaps may be symmetrical. According to some embodiments of the present invention, the multi-layer spacer may include a first spacer, a second spacer, and a third spacer. The third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

A second gate spacer 60P may be formed on both sidewalls of the second gate structure PG2. The second gate spacer 60P may be formed of a dielectric material. The second gate spacer 60P may be formed of or include a low-k material. The second gate spacer 60P may be formed of or include an oxide or a nitride. The second gate spacer 60P may be formed of or include silicon oxide, silicon nitride, or a metal oxide. The second gate spacer 60P may be formed of or include $SiO_2$, $Si_3N_4$, or SiN. The second gate spacer 60P may be or include a multi-layer spacer. The second gate spacer 60P may be or include an air gap (not shown). For example, a pair of line-type air gaps may be formed on both sidewalls of the second gate spacer 60P. The pair of line-type air gaps may be symmetrical. According to some embodiments of the present invention, the multi-layer spacer may include a first spacer, a second spacer, and a third spacer. The third spacer may be positioned between the first spacer and the second spacer. The multi-layer spacer may include a NON structure in which an oxide spacer is positioned between nitride spacers. According to another embodiment of the present invention, the multi-layer spacer may include a first spacer, a second spacer, and an air gap positioned between the first spacer and the second spacer.

The bit line spacer 60C and the first and second gate spacers 60N and 60P may be simultaneously formed. The bit liner spacer 60C and the first and second gate spacers 60N and 60P may protect the bit line structure BL, the first gate structure PG1, and the second gate structure PG2 from the subsequent processes.

Subsequently, the inside of the first active region 14N on both sides of the first gate structure PG1 may be doped with an impurity to form the first source/drain regions 61N. The inside of the second active region 14P on both sides of the second gate structure PG2 may be doped with an impurity to form the second source/drain regions 61P. The first and second source/drain regions 61N and 61P may be doped with an N-type impurity or a P-type impurity. The first and second source/drain regions 61N and 61P may include an N-type impurity, such as arsenic (As) or phosphorus (P). The first and second source/drain regions 61N and 61P may include a low-concentration source/drain region and a high-concentration source/drain region. The first and second source/drain regions 61N and 61P may be formed in two steps. The first and second source/drain regions 61N and 61P may include a region having a deep junction depth and a region having a shallow junction depth.

Referring to FIG. 6G, an inter-layer dielectric layer 62 filling the gaps between the bit line structure BL, the first gate structure PG1, and the second gate structure PG2 may be formed. The inter-layer dielectric layer 62 may be planarized to expose the upper portions of the bit line structure BL, the first gate structure PG1, and the second gate structure PG2. During the planarization process of the inter-layer dielectric layer 62, the bit liner spacer 60C may be planarized to expose the upper surface of the bit line structure BL. During the planarization process of the inter-layer dielectric layer 62, the first and second gate spacers 60N and 60P may be planarized to expose the upper surfaces of the first and second gate structures PG1 and PG2. The inter-layer dielectric layer 62 may extend parallel to the bit line structure BL. The inter-layer dielectric layer 62 may extend parallel to the first and second gate structures PG1 and PG2.

The inter-layer dielectric layer 62 may be formed of a material having an etch selectivity with respect to the hit line spacer 60C and the first and second gate spacers 60N and 60P. The inter-layer dielectric layer 62 may be formed of or include a dielectric material. The inter-layer dielectric layer 62 may be formed of or include an oxide or a nitride. The inter-layer dielectric layer 62 may be formed of or include silicon oxide, silicon nitride, or a metal oxide. The inter-layer dielectric layer 62 may be formed of or include $SiO_2$, $Si_3N_4$ or SiN. The inter-layer dielectric layer 62 may for example, include a Spin-On Dielectric material (SOD).

Subsequently, a peripheral mask pattern 63 may be formed over and be in direct contact with the inter-layer dielectric layer 62 of the peripheral circuit region TR. The peripheral mask pattern 63 may open only the memory cell region MC, while covering the peripheral circuit region TR. Therefore, only the peripheral circuit region TR may be protected in the subsequent process.

Subsequently, a storage node contact opening 64 may be formed in the inter-layer dielectric layer 62 of the memory cell region MC. The storage node contact opening 64 may be formed by etching the inter-layer dielectric layer 62 of the memory cell region MC by using a storage node contact opening mask (not shown) as an etch mask. The storage node contact opening mask may include a photoresist pattern. The storage node contact opening mask may cover the peripheral circuit region TR. For example, the peripheral circuit region TR may be protected during the etching process of the storage node contact opening 64.

The storage node contact opening 64 may be formed between the bit line structures BL. The bottom surface of the storage node contact opening 64 may extend into the substrate 11. While the storage node contact opening 64 is formed, the isolation layer 13, the cell region inter-layer dielectric layer 51, and the cell source/drain region 50 may be recessed to a predetermined depth. A portion of the substrate 11 may be exposed by the storage node contact opening 64. The lower surface of the storage node contact opening 64 may be positioned at a lower level than the upper surface of the substrate 11. The bottom surface of the storage node contact opening 64 may be positioned at a higher level than the bottom surface of the bit line contact plug 54.

Dip-out and trimming processes may be performed to form the storage node contact opening 64. The storage node contact opening 64 may be formed without losing the bit liner spacer 60C by the dip-out process. The side and bottom areas of the storage node contact opening 64 may be expanded by a trimming process. The cell region inter-layer dielectric layer 51 and a portion of the substrate 11 may be removed by the trimming process. The cell region inter-layer dielectric layer 51 may be etched by a dry etching process. According to the embodiment of the present invention, the cell region inter-layer dielectric layer 51 may be etched by an isotropic etching process. For example, the cell source/drain region 50 may be exposed through the storage node contact opening 64. The lower portion of the storage node contact opening 64 may extend in a lateral direction to have a bulb shape.

Subsequently, a storage node contact plug may be formed in the storage node contact opening 64. The storage node contact plug may include a lower plug 65, and a cell ohmic contact layer, a cell conductive liner, and an upper plug that are formed in the subsequent process. First, the lower plug 65 may be formed. The bit liner spacer 60C may be positioned between the bit line 57C and the lower plug 65. The dielectric plug 59 may be positioned between the bit line contact plug 54 and the lower plug 65. The bottom surface of the lower plug 65 may be coupled to the cell source/drain region 50. The upper surface of the lower plug 65 may be positioned at a lower level than the upper surface of the bit line 57C.

The lower plug 65 may be formed by depositing polysilicon to fill the storage node contact opening 64 and sequentially performing a planarization process and an etch-back process. While the lower plug 65 is formed, the peripheral circuit region TR may be protected by the peripheral mask pattern 63.

The lower plug 65 may include a silicon-containing material. The lower plug 65 may be doped with an impurity. For example, an impurity may be doped by a doping process such as implantation. According to the embodiment of the present invention, the lower plug 65 may be formed of or include polysilicon.

The peripheral mask pattern 63 may be removed after the lower plug 65 is formed.

Referring to FIG. 6H, in the peripheral circuit region TR, a metal wire opening 66 may be formed in the inter-layer dielectric layer 62. A metal wire contact mask (not shown) may be employed for forming the metal wire opening 66. The metal wire contact mask may cover the memory cell region MC. Thus, the memory cell region MC may be protected in the subsequent etching process. The inter-layer dielectric layer 62 of the peripheral circuit region TR may be etched by using the metal wire contact mask as an etch mask. As a result, the metal wire opening 66 may be formed, and surfaces of the first and second source/drain regions 61N and 61P may be exposed.

Subsequently, a cell ohmic contact layer 67C may be formed over and be in direct contact with the lower plug 65. A first ohmic contact layer 67N may be formed on the exposed surface of the first source/drain regions 61N. A second ohmic contact layer 67P may be formed on the exposed surface of the second source/drain regions 61P. Deposition and annealing of a silicidable metal layer may be performed to form the cell ohmic contact layer 67C, the first ohmic contact layer 67N, and the second ohmic contact layer 67P. The cell ohmic contact layer 67C, the first ohmic contact layer 67N, and the second ohmic contact layer 67P may be simultaneously formed.

The cell ohmic contact layer 67C, the first ohmic contact layer 67N, and the second ohmic contact layer 67P may be formed of or include a metal silicide. The cell ohmic contact layer 67C, the first ohmic contact layer 67N, and the second ohmic contact layer 67P may be formed of or include silicide ($CoSi_x$). According to the embodiment of the present invention, the cell ohmic contact layer 67C, the first ohmic contact layer 67N, and the second ohmic contact layer 67P may be formed of or include silicide of '$CoSi_2$ phase'. Therefore, it is possible to form cobalt silicide of a low resistance while improving the contact resistance at the same time.

Referring to FIG. 6I, a cell conductive liner 68C may be formed on the upper surface of the cell ohmic contact layer 67C and a side surface of a portion of the bit liner spacer 60C. A first conductive liner 68N may be formed on the upper surface of the first ohmic contact layer 67N and the exposed surface of the metal wire opening 66. A second conductive liner 68P may be formed on the upper surface of the second ohmic contact layer 67P and the exposed surface of the metal wire opening 66. The cell conductive liner 68C and the first and second conductive liners 68N and 68P may be formed of or include a metal or a metal nitride. The cell conductive liner 68C and the first and second conductive liners 68N and 68P may be formed of or include titanium (Ti), titanium nitride (TIN), titanium silicon nitride (TiSiN), tantalum (Ta), tantalum nitride (TaN), and tungsten nitride (WN) or a combination thereof. According to the embodiment of the present invention, the cell conductive liner 68C and the first and second conductive liners 68N and 68P may be formed of or include titanium nitride.

Subsequently, an upper plug 69C may be formed over and be in direct contact with the cell conductive liner 68C. The upper plug 69C may fill the rest of the storage node contact opening 64. A first metal contact plug 69N may be formed over and be in direct contact with the first conductive liner

68N. A second metal contact plug 69P may be formed over and be in direct contact with the second conductive liner 68P. The first and second metal contact plugs 69N and 69P may fill the rest of the metal wire opening 66.

The methods for forming the upper plug 69C and the first and second metal contact plugs 69N and 69P may be the same or different. According to the embodiment of the present invention, the method for forming the upper plug 69C and the first and second metal contact plugs 69N and 69P may be the same. According to the embodiment of the present invention, the upper plug 69C and the first and second metal contact plugs 69N and 69P may be simultaneously formed. The upper plug 69C and the first and second metal contact plugs 69N and 69P may be formed, for example, by Chemical Vapor Deposition (CVD), Physical Vapor Deposition (PVD) or Atomic Layer Deposition (ALD). Plasma may be used to increase the effect of depositing the upper plug 69C and the first and second metal contact plugs 69N and 69P. The upper plug 69C and the first and second metal contact plugs 69N and 69P may be formed by a method such as Plasma Enhanced CVD (PECVD) or Plasma Enhanced ALD (PEALD). According to the embodiment of the present invention, the upper plug 69C and the first and second metal contact plugs 69N and 69P may be formed, for example, by Chemical Vapor Deposition (CVD).

Subsequently, a process of planarizing the upper plug 69C and the first and second metal contact plugs 69N and 69P may be performed. The upper plug 69C may be planarized to expose the upper surface of the bit line structure BL. The first and second metal contact plugs 69N and 69P may be planarized to expose the upper surfaces of the first and second gate structures PG1 and PG2. Therefore, the upper surface of the upper plug 69C and the upper surfaces of the first and second metal contact plugs 69N and 69P may be positioned at the same level.

The upper plug 69C and the first and second metal contact plugs 69N and 69P may include the same material. The upper plug 69C and the first and second metal contact plugs 69N and 69P may be formed of or include a metal-containing material. The upper plug 69C and the first and second metal contact plugs 69N and 69P may include a tungsten (W)-containing material. The upper plug 69C and the first and second metal contact plugs 69N and 69P may include tungsten or a tungsten compound.

Referring to FIG. 6J, a metal wire layer 70A may be formed over and be in direct contact with the upper plug 69C and the first and second metal contact plugs 69N and 69P. The metal wire layer 70A may be formed, for example, by Chemical Vapor Deposition (CVD), Physical Vapor Deposition (PVD) or Atomic Layer Deposition (ALD). Plasma may be used to increase the effect of depositing the metal wire layer 70A. The metal wire layer 70A may be formed by a method such as Plasma Enhanced CVD (PECVD) or Plasma Enhanced ALD (PEALD). According to the embodiment of the present invention, the metal wire layer 70A may be formed by Physical Vapor Deposition (PVD). According to another embodiment of the present invention, the metal wire layer 70A may be formed by the same method as the upper plug 69C. The metal wire layer 70A may be formed simultaneously along with the upper plug 69C.

The metal wire layer 70A may be formed of or include a metal-containing material. The metal wire layer 70A may be formed of a single layer film or a multi-layer film. The metal wire layer 70A may include a conductive material. The metal wire layer 70A may be formed of or include a metal-containing material. The metal wire layer 70A may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). According to the embodiment of the present invention, the metal wire layer 70A may include a tungsten (W)-containing material. The metal wire layer 70A may be formed of or include tungsten (W), PVD-W, or a tungsten compound.

A metal wire hard mask layer 71A and a metal wire mask 72 may be sequentially formed over the metal wire layer 70A. The metal wire hard mask layer 71A may be formed of or include a dielectric material. The metal wire mask 72 may include a photosensitive film pattern. The metal wire mask 72 may have a line shape extending in one direction.

Referring to FIG. 6K, the metal wire hard mask layer 71A may be etched by using the metal wire mask 72 as an etch mask. As a result of etching the metal wire hard mask layer 71A, a pad hard mask 71C and first and second metal hard masks 71N and 71P may be formed.

In the memory cell region MC, the metal wire layer 70A may be etched by using the pad hard mask 71C as an etch mask. As a result, a preliminary landing pad 70C' may be formed. The preliminary landing pad 70C' may partially overlap with the bit line structure BL. The preliminary landing pad 70C' may be electrically coupled with the upper plug 69C. As a result of etching the metal wire layer 70A, the upper portions of the upper plug 69C and the bit liner spacer 60C may be exposed. A landing pad hole 70H may be formed in the upper plug 69C. The shape of the landing pad hole 70H may not be constant. The bottom surface of the landing pad hole 70H may be positioned at a higher level than the bottom surface of the bit line hard mask 58C.

In the first region T1, the metal wire layer 70A may be etched by using the first metal hard mask 71N as an etch mask. As a result, a preliminary first metal wire 70N' may be formed. The preliminary first metal wire 70N' may be coupled to the first source/drain regions 61N through the first metal contact plug 69N. According to another embodiment of the present invention, the preliminary first metal wire 70N' and the first metal contact plug 69N may be formed to be integrated.

In the second region T2, the metal wire layer 70A may be etched by using the second metal hard mask 71P as an etch mask. As a result, a second metal wire 70P may be formed. The second metal wire 70P may be coupled to the second source/drain regions 61P through the second metal contact plug 69P. According to another embodiment of the present invention, the second metal wire 70P and the second metal contact plug 69P may be formed to be integrated.

The preliminary landing pad 70C', the preliminary first metal wire 70N', and the second metal wire 70P may be simultaneously formed. The thicknesses of the preliminary first metal wire 70N' and the second metal wire 70P may be the same as the thickness of the preliminary landing pad 70C'.

Referring to FIG. 6L, a capping layer 73A may be formed over and be in direct contact with the substrate 110. The capping layer 73A may cover the pad hard mask 71C, the preliminary landing pad 70C', the first and second metal hard masks 71N and 71P, the preliminary first metal wire 70N', and the second metal wire 70P. The capping layer 73A may fill the landing pad hole 70H. The thickness of the capping layer 73A may be greater than the sum of the thickness of the preliminary landing pad 70C' and the thickness of the pad hard mask 71C.

The capping layer 73A may include a poor step-coverage material. For example, the capping layer 73A may be formed by Plasma Enhanced Chemical Vapor Deposition (PECVD). The capping layer 73A may be formed of or include a dielectric material. The capping layer 73A may be formed of or include an oxide or a nitride. The capping layer 73A may be formed of or include silicon oxide or silicon nitride. The capping layer 73A may be formed of or include silicon nitride.

A peripheral circuit mask 74 covering the second metal wire 70P and the second region T2 may be formed over and be in direct contact with the capping layer 73A. The peripheral circuit mask 74 may include a photosensitive film pattern. As the peripheral circuit mask 74 is formed only in the second region T2, the second region T2 may be protected in the subsequent etching process.

Referring to FIG. 6M, the capping layer 73A, the pad hard mask 71C, and the first metal hard mask 71N may be etched by using the peripheral circuit mask 74 as an etch mask. The capping layer 73A and the preliminary landing pad 70C' may be etched by using the pad hard mask 71C as an etch mask. As a result, a cell capping layer 73C and a landing pad 70C may be formed in the memory cell region MC. The capping layer 73A and the preliminary first metal wire 70N' may be etched by using the first metal hard mask 71N as an etch mask. As a result, a first capping layer 73N and a first metal wire 70N may be formed in the first region T1. The landing pad 70C and the first metal wire 70N may be formed at the same time. The thickness HC of the landing pad 70C and the thickness HN of the first metal wire 70N may be the same. The thickness HC of the landing pad 70C and the thickness HN of the first metal wire 70N may be the same as or different from the thickness HP of the second metal wire 70P.

The thickness HC of the landing pad 70C may be smaller than the thickness HP of the second metal wire 70P. The bottom surface of the landing pad 70C may be positioned at the same level as the bottom surface of the second metal wire 70P, and the upper surface of the landing pad 70C may be positioned at a lower level than the upper surface of the second metal wire 70P. The difference between the thickness HC of the landing pad 70C and the thickness HP of the second metal wire 70P may range from approximately 120 Å to approximately 180 Å. The difference between the thickness HC of the landing pad 70C and the thickness HP of the second metal wire 70P may be approximately 150 Å.

The thickness HN of the first metal wire 70N may be smaller than the thickness HP of the second metal wire 70P. The bottom surface of the first metal wire 70N may be positioned at the same level as the bottom surface of the second metal wire 70P, and the upper surface of the first metal wire 70N may be positioned at a lower level than the upper surface of the second metal wire 70P. The difference between the thickness HN of the first metal wire 70N and the thickness HP of the second metal wire 70P may range from approximately 120 Å to approximately 180 Å. The difference between the thickness HN of the first metal wire 70N and the thickness HP of the second metal wire 70P may be approximately 150 Å.

The cell capping layer 73C may fill the space between the upper plug 69C and the landing pad 70C. The cell capping layer 73C may cover the upper portion of the bit liner spacer 60C. The cell capping layer 73C may be planarized to expose the upper surface of the landing pad 70C. The cell capping layer 73C may extend parallel to the landing pad 70C. The thickness of the cell capping layer 73C may be the same as the thickness HC of the landing pad 70C. The bottom surface of the cell capping layer 73C and the bottom surface of the landing pad 70C may be positioned at the same level, and the upper surface of the cell capping layer 73C and the upper surface of the landing pad 70C may be positioned at the same level. The cell capping layer 73C may serve to protect the landing pad 70C from the subsequent processes.

The first capping layer 73N may fill the space between the first metal wires 70N. The first capping layer 73N may cover the sidewalls of the first metal wire 70N. The thickness of the first capping layer 73N may be the same as the thickness HN of the first metal wire 70N. The bottom surface of the first capping layer 73N and the bottom surface of the first metal wire 70N may be positioned at the same level, and the upper surface of the first capping layer 73N and the upper surface of the first metal wire 70N may also be positioned at the same level. The thickness of the first capping layer 73N and the thickness of the cell capping layer 73C may be the same. The first capping layer 73N may serve to protect the first metal wire 70N from the subsequent processes.

The second capping layer 73P may fill the space between the second metal wires 70P. The second capping layer 73P may cover the sidewalls and the upper portion of the second metal wire 70P. The second capping layer 73P may cap the second metal wire 70P and the second metal hard mask 71P. The thickness of the second capping layer 73P may be greater than the sum of the thickness HP of the second metal wire 70P and the thickness of the metal wire hard mask 120. The thickness of the second capping layer 73P and the thickness of the first capping layer may be different. The thickness of the second capping layer 73P may be greater than the thickness of the first capping layer 73N. The bottom surface of the second capping layer 73P and the bottom surface of the first capping layer 73N may be positioned at the same level, and the upper surface of the second capping layer 73P may be positioned at a higher level than the upper surface of the first capping layer 121N. The thickness of the second capping layer 73P may be greater than the thickness of the landing pad 70C. The bottom surface of the second capping layer 73P and the bottom surface of the landing pad 70C may be positioned at the same level, and the upper surface of the second capping layer 73P may be positioned at a higher level than the upper surface of the landing pad 70C. The second capping layer 73P may be formed of the same material as the first capping layer 73N.

Referring to FIG. 6N, the etch stop layer 75 may be formed over and be in direct contact with the landing pad 70C, the cell capping layer 73C, the first and second metal wires 70N and 70P, and the first and second capping layers 73N and 73P. A memory element 76 electrically connected to the landing pad 70C may be formed over and be in direct contact with the landing pad 70C. The memory element 76 may be realized as diverse forms. The memory element 76 may be a capacitor. For example, the memory element 76 may include a storage node in contact with the landing pad 70C. The storage node may have a form of a cylinder or pillar. A capacitor dielectric layer may be formed on the surface of the storage node. The capacitor dielectric layer may include at least one selected from among zirconium oxide, aluminum oxide, and hafnium oxide. For example, the capacitor dielectric layer may be a ZAZ structure in which a first zirconium oxide, aluminum oxide, and a second zirconium oxide are stacked. A plate node may be formed over and be in direct contact with the capacitor dielectric layer. The storage node and the plate node may be formed of or include a metal-containing material. The memory element 76 may include a variable resistor. The variable resistor may include a phase change material. According to another embodiment of the present invention, the variable resistor may include a transition metal oxide. According to yet another embodiment of the present invention, the variable resistor may be a magnetic tunnel junction (MTJ).

The semiconductor device 300 may include a CMOSFET, and the first transistor may include an NMOSFET, and the second transistor may include a PMOSFET. According to another embodiment of the present invention, the semiconductor device 300 may include different NMOSFETs, and the first transistor may include a first NMOSFET, and the second transistor may include a second NMOSFET. The first NMOSFET may be an NMOSFET having a thin first gate dielectric layer, and the second NMOSFET may be an NMOSFET having a second gate dielectric layer which is thicker than the first gate dielectric layer. According to another embodiment of the present invention, the semiconductor device 300 may include different PMOSFETs, and the first transistor may include a first PMOSFET, and the second transistor may include a second PMOSFET. The first PMOSFET may be a PMOSFET having a thin first gate dielectric layer, and the second PMOSFET may be a PMOSFET having a second gate dielectric layer which is thicker than the first gate dielectric layer.

The semiconductor device 300 may include a peripheral circuit of the memory cell, and the first transistor may be a transistor coupled to a bit line of a memory cell, and the second transistor may be a transistor coupled to a word line of the memory cell. The semiconductor device 300 may include a peripheral circuit of a DRAM, and the first transistor in the first region T1 may be a sense amplifier SA, and the second transistor in the second region T2 may be, for example, a sub-word line driver SWD.

According to the above-described embodiment of the present invention, it is possible to reduce the capacitance between the first metal wires 70N by forming the thickness HN of the first metal wire 70N smaller than the thickness HP of the second metal wire 70P. For example, $C_{sa}$ may be reduced, and the sensing margin may be improved as the $C_{sa}$ is reduced. Also, the resistance of the semiconductor device in the second region T2 may be maintained low by forming the thickness HN of the first metal wire 70N smaller than the thickness HP of the second metal wire 70P. As a result, the semiconductor device may simultaneously obtain the effect of improving the sensing margin due to the reduction in the capacitance of the first region T1 and the effect of reducing the resistance for the regions other than the first region T1.

Figure 8:
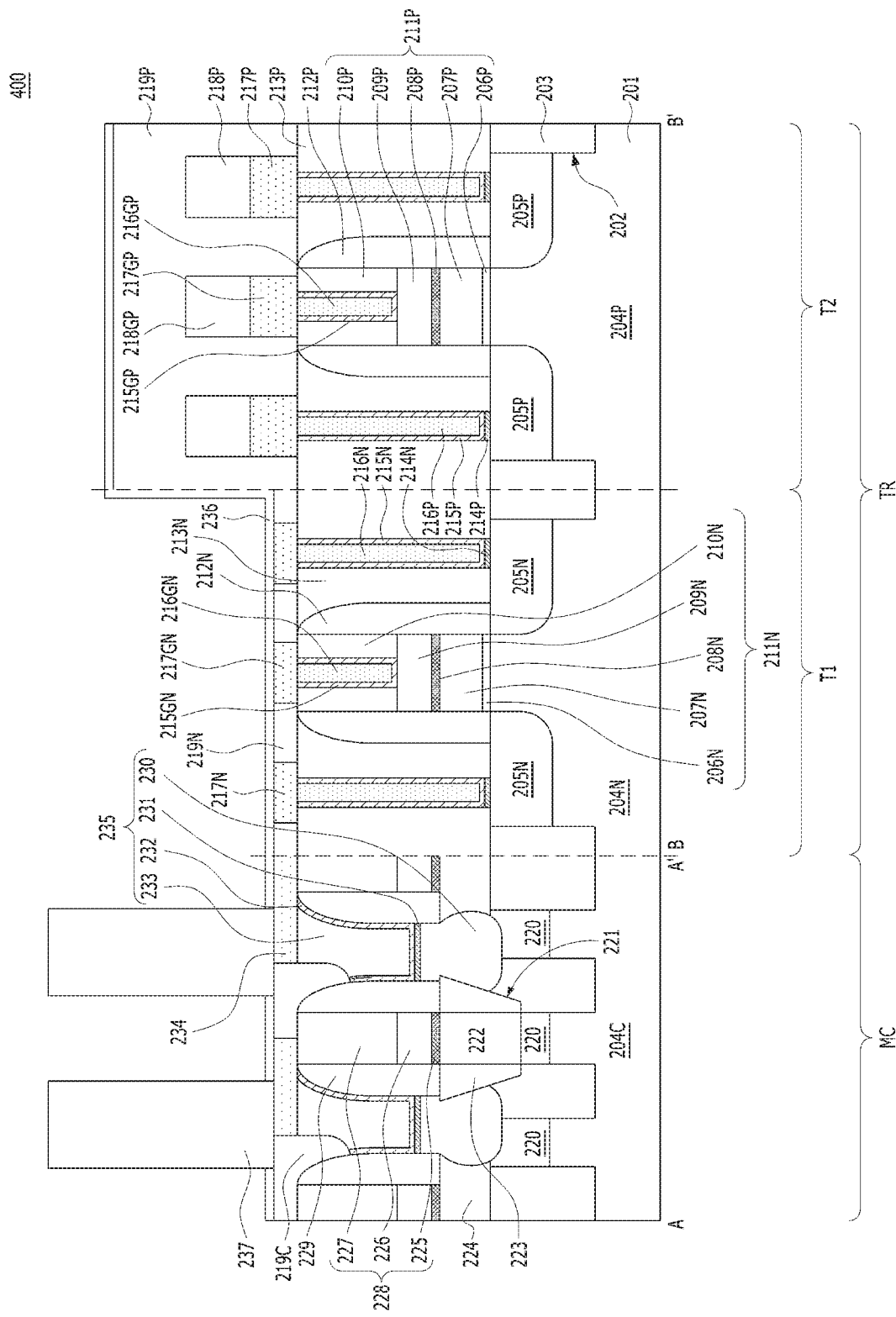
FIG. 8 is a cross-sectional view illustrating a semiconductor device in accordance with an embodiment of the present invention.

FIG. 8 is a cross-sectional view illustrating a semiconductor device 400 in accordance with an embodiment of the present invention.

Referring to FIG. 8, the semiconductor device 400 may be similar to the semiconductor device 300 shown in FIG. 5A. The constituent elements also appearing in the semiconductor device 300 of FIG. 5A may use the same reference numerals. Hereinafter, a detailed description of the same constituent elements may be omitted.

The semiconductor device 400 may include a substrate 201, a memory cell region MC, a first region T1, and a second region T2 that are formed over the substrate 201. The first region T1 may be referred to as a first peripheral circuit region, and the second region T2 may be referred to as a second peripheral circuit region.

A first transistor of the first region T1 may include a first active region 204N, a first gate structure 211N formed over and directly contacting the first active region 204N, a first gate spacer 212N formed on both sidewalls of the first gate structure 211N, and first source/drain regions 205N formed in the first active region 204N to be aligned on both sides of the first gate structure 211N. A second transistor of the second region T2 may include a second active region 204P, a second gate structure 211P formed over and directly contacting the second active region 204P, a second gate spacer 212P formed on both sidewalls of the second gate structure 211P, and second source/drain regions 205P formed in the second active region 204P to be aligned on both sides of the second gate structure 211P. The first source/drain regions 205N of the first region T1 may be coupled to the first metal wire 217N through the first metal contact plug 216N. A first ohmic contact layer 214N and a first conductive liner 215N may be formed between the first metal contact plug 216N and the first source/drain regions 205N.

The first gate structure 211N may include a first gate dielectric layer 206N formed over and directly contacting the first active region 204N, a first lower gate electrode 207N over the first gate dielectric layer 206N, a first barrier layer 208N over the first lower gate electrode 207N, a first upper gate electrode 209N over the first barrier layer 208N, and a first gate hard mask 210N over the first upper gate electrode 209N. The second gate structure 211P may include a second gate dielectric layer 206P formed over and directly contacting the second active region 204P, a second lower gate electrode 207P over the second gate dielectric layer 206P, a second barrier layer 208P over the second lower gate electrode 207P, a second upper gate electrode 209P over the second barrier layer 208P, and a second gate hard mask 210P over the second upper gate electrode 209P. The second source/drain regions 205P of the second region T2 may be coupled to the second metal wire 217P through the second metal contact plug 216P. A second ohmic contact layer 214P and a second conductive liner 215P may be formed between the second metal contact plug 216P and the third source/drain regions 205P.

A bit line contact plug 222 may be formed over and be in direct contact with the substrate 201 of the memory cell region MC. The bit line contact plug 222 may be coupled to a cell source/drain region 220. A dielectric plug 223 may be formed on both sidewalls of the bit line contact plug 222. A bit line structure 228 may be formed over the bit line contact plug 222. The bit line structure 228 may include a stack of a cell barrier layer 225, a bit line 226, and a bit line hard mask 227. Bit line spacer 229 may be formed on both sidewalls of the bit line structure 228. Storage node contact plug 235 may be formed over and be in direct contact with the neighboring cell source/drain region 220. The storage node contact plug 235 may include lower plug 230, cell ohmic contact layer 231, cell conductive liner 232, and upper plug 233. A landing pad 234 may be formed over and be in direct contact with the storage node contact plug 235. The landing pad 234 may be electrically coupled to the storage node contact plug 235. A portion of the landing pad 234 may overlap with the bit line structure 228. The cell capping layer 219C may fill the space between the upper plug 233 and the landing pad 234. The cell capping layer 219C may protect the bit line structure 228 and the storage node contact plug 235 from the subsequent processes. The cell capping layer 219C may be formed of or include a dielectric material. A memory element 237 electrically connected to the landing pad 234 may be formed over and be in direct contact with the landing pad 234. The memory element 237 may be realized as diverse forms. The memory element 237 may be a capacitor.

The first upper gate electrode 209N of the first region T1 may be coupled to the first gate metal wire 217GN through the first gate contact plug 216GN. A first gate conductive liner 215GN may be formed between the first gate contact plug 216GN and the first upper gate electrode 209N. The first gate contact plug 216GN may include a barrier-less metal structure in which the first gate conductive liner 215GN is omitted. The first gate conductive liner 215GN may include the same material as the first conductive liner 215N. The first gate conductive liner 215GN may be formed of or include a metal or a metal nitride. The first gate conductive liner 215GN may be formed of or include titanium (Ti), titanium nitride (TiN), titanium silicon nitride (TiSiN), tantalum (Ta), tantalum nitride (TaN), tungsten nitride (WN), or a combination thereof. The first gate conductive liner 215GN may be formed of or include a metal, a metal nitride, a metal silicide, or a combination thereof. The first gate contact plug 216GN may penetrate the first gate hard mask 210N to be coupled to the first upper gate electrode 209N.

The first metal wire 217N may be positioned over the first metal contact plug 216N. The first gate metal wire 217GN may be positioned over the first gate contact plug 216GN. The first gate metal wire 217GN may be coupled to the first upper electrode 209N through the first gate contact plug 216GN. The first gate metal wire 217GN may include the same material as the first metal wire 217N. The first gate metal wire 217GN may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The first gate metal wire 217GN may be formed of a single layer film or a multi-layer film of a conductive material. The first gate metal wire 217GN may be formed of or include tungsten (W) or a tungsten compound.

The first capping layer 219N may fill the space between the first metal wire 217N and the first gate metal wire 217GN. The first capping layer 219N may cover the sidewalls of the first metal wire 217N. The first capping layer 219N may cover the sidewalls of the first gate metal wire 217GN. The thickness of the first capping layer 219N may be the same as the thickness of the first gate metal wire 217GN. The bottom surface of the first capping layer 219N and the bottom surface of the first gate metal wire 217GN may be positioned at the same level, and the upper surface of the first capping layer 219N and the upper surface of the first gate metal wire 217GN may also be positioned at the same level. The first capping layer 219N may serve to protect the first metal wire 217N from the subsequent processes. The first capping layer 219N may be formed of or include a dielectric material. The first capping layer 219N may be formed of or include silicon nitride.

The second upper gate electrode 209P of the second region T2 may be coupled to the second gate metal wire 217GP through the second gate contact plug 216GP. A second gate conductive liner 215GP may be formed between the second gate contact plug 216GP and the second upper gate electrode 209P. The second gate contact plug 216GP may include a barrier-less metal structure in which the second gate conductive liner 215GP is omitted. The second gate conductive liner 215GP may include the same material as the second conductive liner 215P. The second gate conductive liner 215GP may be formed of or include a metal or a metal nitride. The second gate conductive liner 215GP may be formed of or include titanium (Ti), titanium nitride (TiN), titanium silicon nitride (TiSiN), tantalum (Ta), tantalum nitride (TaN), tungsten nitride (WN), or a combination thereof. The second gate conductive liner 215GP may be formed of or include a metal, a metal nitride, a metal silicide, or a combination thereof. The second gate contact plug 216GP may penetrate the second gate hard mask 210P to be coupled to the second upper gate electrode 209P.

The second metal wire 217P may be positioned over the second metal contact plug 216P. The second gate metal wire 217GP may be positioned over the second gate contact plug 216GP. The second gate metal wire 217GP may be coupled to the second upper electrode 209P through the second gate contact plug 216GP. The second gate metal wire 217GP may include the same material as the second metal wire 217P. The second gate metal wire 217GP may be formed of or include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). The second gate metal wire 217GP may be formed of a single layer film or a multi-layer film of a conductive material. The second gate metal wire 217GP may be formed of or include tungsten (W) or a tungsten compound.

The second capping layer 219P may fill the space between the second metal wire 217P and the second gate metal wire 217GP. The second capping layer 219P may cover the sidewalls of the second gate metal wire 217GP. The thickness of the second capping layer 219P may be greater than the thickness of the second gate metal wire 217GP. The thickness of the second capping layer 219P and the thickness of the first capping layer 219N may be different. The bottom surface of the second capping layer 219P and the bottom surface of the first capping layer 219N may be positioned at the same level, and the upper surface of the second capping layer 219P may be positioned at a higher level than the upper surface of the first capping layer 219N. The second capping layer 219P may serve to protect the second metal wire 217P and the second gate metal wire 217GP from the subsequent processes. The second capping layer 219P may be formed of or include a dielectric material. The second capping layer 219P may be formed of or include silicon nitride. The second capping layer 219P may be formed of the same material as the first capping layer 219N.

The thickness of the first gate metal wire 217GN and the thickness of the second gate metal wire 217GP may be different. According to the embodiment of the present invention, the thickness of the first gate metal wire 217GN may be smaller than the thickness of the second gate metal wire 217GP. The bottom surface of the first gate metal wire 217GN and the bottom surface of the second gate metal wire 217GP may be positioned at the same level, and the upper surface of the second gate metal wire 217GN may be positioned at a lower level than the upper surface of the second gate metal wire 217GP. The difference between the thickness of the first gate metal wire 217GN and the thickness of the second gate metal wire 217GP may range from approximately 130 Å to approximately 170 Å. According to the embodiment of the present invention, the difference between the thickness of the first gate metal wire 217G and the thickness of the second gate metal wire 217GP may be approximately 150 Å.

The thickness of the landing pad 234 may be the same as or different from the thickness of the first and second gate metal wires 217GN and 217GP. According to the embodiment of the present invention, the thickness of the landing pad 234 may be the same as the thickness of the first gate metal wire 217GN. The thickness of the landing pad 234 may be smaller than the thickness of the second gate metal wire 217GP. The bottom portion of the landing pad 234 and the bottom portion of the first gate metal wire 217GN may be positioned at the same level, and the upper surface of the landing pad 234 may be positioned at the same level as the upper surface of the first gate metal wire 217GN. The bottom portion of the landing pad 234 and the bottom portion of the second gate metal wire 217GP may be positioned at the same level, and the upper surface of the landing pad 234 may be positioned at a lower level than the upper surface of the second gate metal wire 217GP. The difference between the thickness of the landing pad 234 and the thickness of the second gate metal wire 217GP may range from approximately 130 Å to approximately 170 Å. According to the embodiment of the present invention, the difference between the thickness of the landing pad 234 and the thickness of the second gate metal wire 217GP may be approximately 150 Å.

The semiconductor device 400 may include a CMOSFET, and the first transistor may include an NMOSFET, and the second transistor may include a PMOSFET. According to another embodiment of the present invention, the semiconductor device 400 may include different NMOSFETs, and the first transistor may include a first NMOSFET, and the second transistor may include a second NMOSFET. The first NMOSFET may be an NMOSFET having a thin first gate dielectric layer, and the second NMOSFET may be an NMOSFET having a second gate dielectric layer which is thicker than the first gate dielectric layer. According to another embodiment of the present invention, the semiconductor device 400 may include different PMOSFETs, and the first transistor may include a first PMOSFET, and the second transistor may include a second PMOSFET. The first PMOSFET may be a PMOSFET having a thin first gate dielectric layer, and the second PMOSFET may be a PMOSFET having a second gate dielectric layer which is thicker than the first gate dielectric layer.

The semiconductor device 400 may include a peripheral circuit of a memory cell, and the first transistor may be a transistor which is coupled to a bit line of a memory cell, and the second transistor may be a transistor which is coupled to a word line of the memory cell. The semiconductor device 400 may include a peripheral circuit of a DRAM, and the first transistor in the first region T1 may be a sense amplifier SA, and the second transistor in the second region T2 may be, for example, a sub-word line driver SWD.

In the semiconductor device 400 in accordance with an embodiment of the present invention, since the thickness of the first gate metal wire 217GN is formed smaller than the thickness of the second gate metal wire 217GP, the capacitance between the neighboring first gate metal wires 217GN may be reduced. For example, $C_{sa}$ may be reduced, and the sensing margin may be improved as the $C_{sa}$ is reduced. Also, in the semiconductor device 400, since the thickness of the first gate metal wire 217GN is formed smaller than the thickness of the second gate metal wire 217GP, the resistance of the semiconductor device 400 in the second region T2 may be maintained low. As a result, the semiconductor device 400 may simultaneously obtain the effect of improving the sensing margin due to the reduction in the capacitance and the effect of reducing the resistance for the regions other than the first transistor.

According to an embodiment of the present invention, parasitic capacitance may be reduced by forming metal wires to have different upper surfaces.

According to an embodiment of the present invention, the parasitic capacitance of a memory cell region and a peripheral circuit region may be reduced by forming an upper surface of a landing pad of the memory cell region and upper surfaces of some metal wires in the peripheral circuit region at lower levels than upper surfaces of the other metal wires in the peripheral circuit region.

According to an embodiment of the present invention, the fabrication process may be simplified by simultaneously forming the landing pad in the memory cell region and the metal wires in the peripheral circuit region.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a substrate including a memory cell region and a peripheral circuit region, the peripheral circuit region including a first peripheral circuit region including a first transistor and a second peripheral circuit region including a second transistor;
   a storage node contact plug positioned in an upper portion of the substrate in the memory cell region;
   a landing pad over the storage node contact plug;
   a first metal wire coupled to the first transistor; and
   a second metal wire coupled to the second transistor,
   wherein a thickness of the landing pad and a thickness of the first metal wire are smaller than a thickness of the second metal wire, and
   wherein a bottom portion of the landing pad, a bottom portion of the first metal wire, and a bottom portion of the second metal wire are positioned at the same level, and
   an upper surface of the landing pad and an upper surface of the first metal wire are positioned at a lower level than an upper surface of the second metal wire.

2. The semiconductor device of claim 1, wherein the landing pad and the first metal wire have the same thickness.

3. The semiconductor device of claim 1, wherein the landing pad, the first metal wire, and the second metal wire include the same metal material.

4. The semiconductor device of claim 1, wherein the landing pad, the first metal wire, and the second metal wire include tungsten (W).

5. The semiconductor device of claim 1, further comprising:
   a first metal contact plug between the first transistor and the first metal wire; and
   a second metal contact plug between the second transistor and the second metal wire.

6. The semiconductor device of claim 1, wherein the first transistor includes:
   a first gate structure over the substrate; and
   a first metal contact plug between the first transistor and the first metal wire,
   wherein first source/drain regions formed in the substrate are aligned on both sides of the first gate structure, and
   wherein the first metal wire is coupled to either the first gate structure or the first source/drain regions.

7. The semiconductor device of claim 1, wherein the second transistor includes:
   a second gate structure over the substrate; and
   a second metal contact plug between the second transistor and the second metal wire,
   wherein second source/drain regions formed in the substrate are aligned on both sides of the second gate structure, and
   wherein the second metal wire is coupled to either the second gate structure or the second source/drain regions.

8. The semiconductor device of claim 1, further comprising:

a cell capping layer, a first capping layer, and a second capping layer, wherein the cell capping layer covers sidewalls of the landing pad, and an upper surface of the cell capping layer and an upper surface of the landing pad are positioned at the same level, wherein the first capping layer covers sidewalls of the first metal wire, and an upper surface of the first capping layer and an upper surface of the first metal wire are positioned at the same level, and wherein the second capping layer covers sidewalls and an upper portion of the second metal wire.

9. The semiconductor device of claim 1, wherein the storage node contact plug includes a stack of polysilicon, a metal silicide, and a metal material.

10. The semiconductor device of claim 1, wherein the memory cell region includes:
a buried word line; and
a bit line structure, wherein a portion of the landing pad overlaps with an upper region of the bit line structure.

11. The semiconductor device of claim 1, wherein the first peripheral circuit region includes a sense amplifier (SA), and the second peripheral circuit region includes a sub-word line driver (SWD).

12. The semiconductor device of claim 1, wherein the memory cell region includes a bit line and a word line, wherein the first peripheral circuit region is coupled to the bit line, and the second peripheral circuit region is coupled to the word line.

13. The semiconductor device of claim 1, wherein the first peripheral circuit region includes a transistor having a first gate dielectric layer, and wherein the second peripheral circuit region includes a transistor having a second gate dielectric layer which is thicker than the first gate dielectric layer.

* * * * *